(12) United States Patent
Tsai et al.

(10) Patent No.: US 10,727,045 B2
(45) Date of Patent: Jul. 28, 2020

(54) METHOD FOR MANUFACTURING A SEMICONDUCTOR DEVICE

(71) Applicant: Taiwan Semiconductor Manufacturing Company, Ltd., Hsinchu (TW)

(72) Inventors: Wan-Lin Tsai, Hsinchu (TW); Jung-Hau Shiu, New Taipei (TW); Ching-Yu Chang, Taipei (TW); Jen Hung Wang, Hsinchu (TW); Shing-Chyang Pan, Jhudong Township (TW); Tze-Liang Lee, Hsinchu (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 15/967,480

(22) Filed: Apr. 30, 2018

(65) Prior Publication Data

US 2019/0103272 A1 Apr. 4, 2019

Related U.S. Application Data

(60) Provisional application No. 62/566,044, filed on Sep. 29, 2017.

(51) Int. Cl.
*H01L 21/768* (2006.01)
*C23C 16/02* (2006.01)
(Continued)

(52) U.S. Cl.
CPC .... *H01L 21/02126* (2013.01); *C23C 14/0676* (2013.01); *C23C 14/08* (2013.01);
(Continued)

(58) Field of Classification Search
CPC .......... H01L 21/02126; H01L 21/0214; H01L 21/76802; H01L 21/76816;
(Continued)

(56) References Cited

U.S. PATENT DOCUMENTS 6,500,772 B2 12/2002 Chakravarti et al.
6,573,027 B1 * 6/2003 Imai .................... H01L 21/0274
257/E21.027

(Continued)

FOREIGN PATENT DOCUMENTS

TW I356101 B 1/2012
WO WO-2018063323 A1 * 4/2018 ....... H01L 21/76897

OTHER PUBLICATIONS

Quirk et al., "Semiconductor Manufacturing Technology," Chapter 9, 2 pages, Upper Saddle River, New Jersey, Columbus, Ohio.

*Primary Examiner* — Sophia T Nguyen
(74) *Attorney, Agent, or Firm* — Slater Matsil, LLP

(57) ABSTRACT

A method of manufacturing a semiconductor device includes depositing a dielectric layer over a substrate, performing a first patterning to form an opening in the dielectric layer, and depositing an oxide film over and contacting the dielectric layer and within the opening in the dielectric layer. The oxide film is formed from multiple precursors that are free of $O_2$, and depositing the oxide film includes forming a plasma of a first precursor of the multiple precursors.

20 Claims, 51 Drawing Sheets

(51) Int. Cl.

| | |
|---|---|
| *H01L 21/311* | (2006.01) |
| *H01L 23/528* | (2006.01) |
| *H01L 21/02* | (2006.01) |
| *H01L 21/033* | (2006.01) |
| *H01L 21/8238* | (2006.01) |
| *C23C 16/04* | (2006.01) |
| *C23C 16/30* | (2006.01) |
| *C23C 16/455* | (2006.01) |
| *C23C 16/40* | (2006.01) |
| *C23C 14/08* | (2006.01) |
| *C23C 14/06* | (2006.01) |
| *H01L 21/308* | (2006.01) |
| *H01L 29/66* | (2006.01) |
| *H01J 37/32* | (2006.01) |
| *C23C 14/22* | (2006.01) |

(52) U.S. Cl.
CPC ........ *C23C 16/0245* (2013.01); *C23C 16/042* (2013.01); *C23C 16/045* (2013.01); *C23C 16/308* (2013.01); *C23C 16/401* (2013.01); *C23C 16/45529* (2013.01); *C23C 16/45536* (2013.01); *C23C 16/45553* (2013.01); *H01L 21/0214* (2013.01); *H01L 21/0228* (2013.01); *H01L 21/02274* (2013.01); *H01L 21/0332* (2013.01); *H01L 21/0337* (2013.01); *H01L 21/3081* (2013.01); *H01L 21/3086* (2013.01); *H01L 21/31144* (2013.01); *H01L 21/76802* (2013.01); *H01L 21/76816* (2013.01); *H01L 21/823821* (2013.01); *H01L 29/66795* (2013.01); *C23C 14/228* (2013.01); *H01J 37/32082* (2013.01); *H01J 37/32174* (2013.01); *H01L 21/76808* (2013.01); *H01L 23/528* (2013.01)

(58) Field of Classification Search
CPC ........... H01L 21/31144; H01L 21/0332; H01L 21/0337; H01L 23/528; C23C 16/45536; C23C 16/45553; C23C 16/45529; C23C 16/308; C23C 16/401; C23C 16/0245; G03F 9/7084; G03F 9/7076; G03F 9/708; G03F 7/0035
See application file for complete search history.

(56) References Cited

U.S. PATENT DOCUMENTS

| | | | | |
|---|---|---|---|---|
| 7,811,940 B2* | 10/2010 | Sandhu | ............... | H01L 21/0332 |
| | | | | 427/385.5 |
| 7,851,135 B2* | 12/2010 | Jung | ................... | G03F 7/0035 |
| | | | | 430/312 |
| 8,197,915 B2 | 6/2012 | Oka et al. | | |
| 8,247,291 B2* | 8/2012 | Min | ................... | H01L 21/0337 |
| | | | | 257/E21.538 |
| 8,563,229 B2* | 10/2013 | Tran | ................... | H01L 21/0274 |
| | | | | 430/323 |
| 9,117,822 B1* | 8/2015 | Singh | ................ | H01L 23/53238 |
| 9,284,642 B2* | 3/2016 | Nakano | ................ | C23C 16/405 |
| 9,378,976 B2* | 6/2016 | Shaviv | ................ | H01L 23/5226 |
| 9,418,868 B1* | 8/2016 | Yen | ................... | H01L 21/0337 |
| 9,484,258 B1* | 11/2016 | Kim | ................... | H01L 21/76813 |
| 9,523,148 B1* | 12/2016 | Pore | ................... | H01L 21/02186 |
| 9,558,957 B2* | 1/2017 | Andrieu | ................ | H01L 21/0337 |
| 9,666,434 B2* | 5/2017 | Kim | ................... | H01L 21/0338 |
| 9,881,794 B1* | 1/2018 | Su | ................... | H01L 21/0332 |
| 9,887,127 B1* | 2/2018 | Licausi | ................ | H01L 21/76816 |
| 10,002,786 B1* | 6/2018 | Licausi | ................ | H01L 23/53242 |
| 10,163,652 B2* | 12/2018 | Chang | ................ | H01L 21/31144 |
| 10,269,558 B2* | 4/2019 | Blanquart | ......... | H01L 21/02164 |
| 10,497,565 B2* | 12/2019 | Lai | ................... | H01L 21/0337 |
| 2006/0046201 A1* | 3/2006 | Sandhu | ................ | H01L 21/0337 |
| | | | | 430/314 |
| 2006/0246699 A1* | 11/2006 | Weidman | ............ | C23C 18/1608 |
| | | | | 438/597 |
| 2008/0160764 A1* | 7/2008 | Matsumoto | ........ | H01L 21/31053 |
| | | | | 438/697 |
| 2009/0291232 A1 | 11/2009 | Washio et al. | | |
| 2011/0008956 A1* | 1/2011 | Lee | ................... | H01L 21/0337 |
| | | | | 438/618 |
| 2011/0171582 A1* | 7/2011 | Farooq | ................ | H01L 21/3085 |
| | | | | 430/314 |
| 2011/0183079 A1 | 7/2011 | Jackson et al. | | |
| 2011/0244666 A1* | 10/2011 | Kim | ................... | H01L 27/11551 |
| | | | | 438/478 |
| 2012/0104619 A1* | 5/2012 | Ponoth | ................ | H01L 21/3105 |
| | | | | 257/773 |
| 2012/0322224 A1* | 12/2012 | Jeong | ................ | H01L 21/31144 |
| | | | | 438/382 |
| 2013/0032949 A1* | 2/2013 | Lin | ................... | H01L 23/5222 |
| | | | | 257/774 |
| 2014/0061870 A1* | 3/2014 | Chen | ................... | H01L 29/401 |
| | | | | 257/635 |
| 2014/0273442 A1* | 9/2014 | Liu | ................... | H01L 21/76816 |
| | | | | 438/666 |
| 2015/0024597 A1* | 1/2015 | Gao | ................... | H01L 21/3086 |
| | | | | 438/694 |
| 2015/0090982 A1* | 4/2015 | Lin | ................... | H01L 51/525 |
| | | | | 257/40 |
| 2015/0171010 A1* | 6/2015 | Bristol | ................ | H01L 23/522 |
| | | | | 257/774 |
| 2016/0047961 A1* | 2/2016 | Park | ................... | G02B 5/3058 |
| | | | | 359/485.05 |
| 2016/0099148 A1* | 4/2016 | Kihara | ................ | H01L 21/0338 |
| | | | | 438/695 |
| 2016/0126184 A1* | 5/2016 | Myers | ................ | H01L 21/76883 |
| | | | | 257/774 |
| 2016/0181100 A1* | 6/2016 | deVilliers | ........... | H01L 21/0337 |
| | | | | 438/702 |
| 2016/0181110 A1* | 6/2016 | Yen | ................... | H01L 21/76877 |
| 2016/0190009 A1* | 6/2016 | Wallace | ............ | H01L 21/76897 |
| | | | | 257/774 |
| 2016/0358776 A1* | 12/2016 | Guillorn | ................ | G03F 7/0035 |
| 2017/0090290 A1* | 3/2017 | deVilliers | ............. | G03F 7/0035 |
| 2017/0140986 A1* | 5/2017 | Machkaoutsan | .......... | |
| | | | | H01L 23/53228 |
| 2017/0194146 A1* | 7/2017 | Hsieh | ................ | H01L 21/0337 |
| 2017/0301552 A1* | 10/2017 | deVilliers | ........... | H01L 21/0337 |
| 2017/0338115 A1* | 11/2017 | Yen | ................... | H01L 21/0337 |
| 2017/0352585 A1* | 12/2017 | Burns | ................ | H01L 21/76816 |
| 2018/0148838 A1* | 5/2018 | Sakane | ................ | C23C 16/401 |
| 2018/0148842 A1* | 5/2018 | Matsumoto | ............ | C23C 16/50 |
| 2018/0151416 A1* | 5/2018 | Wu | ................... | H01L 21/31144 |
| 2018/0204763 A1* | 7/2018 | Wallace | ............ | H01L 21/0337 |
| 2018/0233404 A1* | 8/2018 | Shu | ................... | H01L 21/0337 |
| 2018/0261457 A1* | 9/2018 | Law | ................... | H01L 21/0276 |
| 2018/0301342 A1* | 10/2018 | Fukazawa | ............... | C23C 16/32 |
| 2018/0342421 A1* | 11/2018 | Bombardier | ...... | H01L 21/76897 |
| 2018/0371612 A1* | 12/2018 | Yoo | ................... | C23C 16/45553 |
| 2019/0019748 A1* | 1/2019 | Wallace | ............ | H01L 21/76834 |
| 2019/0035605 A1* | 1/2019 | Suzuki | ................ | H01J 37/32091 |
| 2019/0074172 A1* | 3/2019 | Susa | ................... | H01L 21/0228 |
| 2019/0103272 A1* | 4/2019 | Tsai | ................... | H01L 21/02126 |
| 2019/0148221 A1* | 5/2019 | Peng | ................... | H01L 21/76816 |
| | | | | 257/758 |
| 2019/0157096 A1* | 5/2019 | Zhou | ................... | H01L 21/30655 |
| 2019/0206733 A1* | 7/2019 | Lin | ................... | H01L 21/76885 |
| 2019/0259656 A1* | 8/2019 | Nyhus | ................ | H01L 21/0337 |

* cited by examiner

METHOD FOR MANUFACTURING A SEMICONDUCTOR DEVICE

PRIORITY

This application claims the benefit to U.S. Patent Application No. 62/566,044, filed on Sep. 29, 2017, and entitled "Method of Manufacturing a Semiconductor Device" which application is incorporated herein by reference.

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography and etching processes to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise within each of the processes that are used, and these additional problems should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
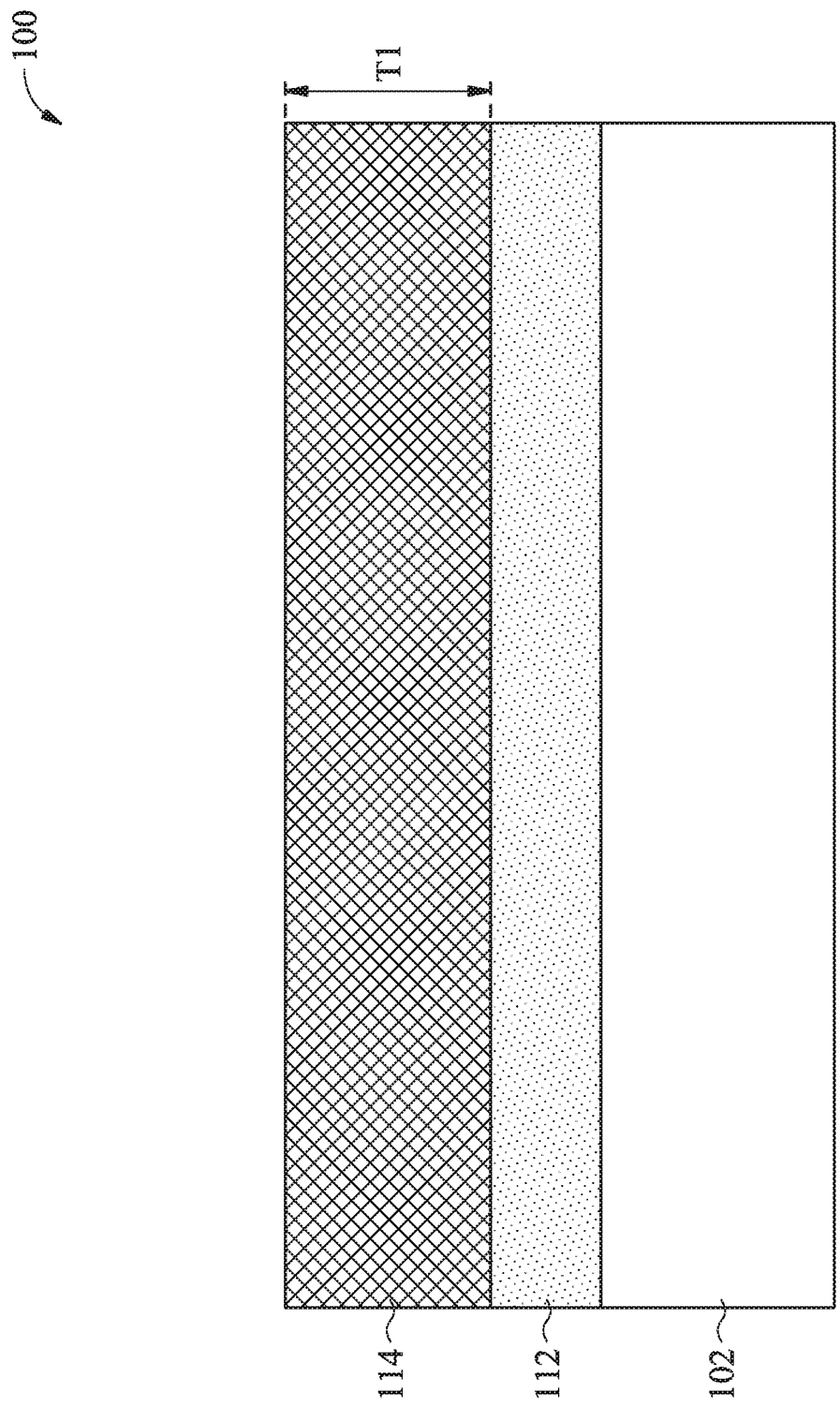
FIGS. 1A-1H illustrate cross-sectional views of various intermediary stages of manufacturing conductive lines in a semiconductor device using a low-temperature dielectric film in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Various embodiments are described in respect to the formation of a low-temperature dielectric (LTD) film used during processing semiconductor devices. The LTD film described herein and the process, method, or materials described herein can be used in many applications, including fin-type field effect transistors (FinFETs). For example, the fins may be patterned to produce a relatively close spacing between features, for which this disclosure is well-suited. In addition, spacers used in forming fins of FinFETs, also referred to as mandrels, can be formed using techniques or materials described herein. As another example, the LTD film may be used as part of a multi-layer photoresist, in a multi-patterning process, or as a film to decrease feature size during patterning. However, the embodiments are not intended to be limited to such uses. As used herein, the term "LTD" refers to a dielectric deposited using a relatively low process temperature (e.g., 200° C. or less). In some cases, depositing a dielectric material at lower process temperatures can reduce the possibility of damage to layers beneath the dielectric material during the deposition.

The low-temperature dielectric (LTD) film described herein may be used in different processes that form different types of semiconductor devices. In accordance with a first exemplary embodiment, FIGS. 1A-1H illustrate cross-sectional views of intermediate stages of forming conductive lines 120 in an inter-layer dielectric (ILD) layer 112 on a semiconductor substrate 102.

In the embodiment of FIGS. 1A-1H, an LTD film 116 is used as an etching mask for patterning of an ILD layer 112 during formation of conductive lines 120. The embodiment shown in FIGS. 1A-1H may, for example, be part of forming conductive lines in a Back End of Line (BEOL) process. In FIG. 1A, the ILD layer 112 and an underlayer 114 are formed in semiconductor device 100. In some embodiments, ILD layer 112 may be formed over a semiconductor substrate 102. The semiconductor substrate 102 may be formed of a semiconductor material such as silicon, doped or undoped, or an active layer of a semiconductor-on-insulator (SOI) substrate. The semiconductor substrate 102 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. Devices (not illustrated), such as transistors, diodes, capacitors, resistors, etc., may be formed in and/or on an active surface of semiconductor substrate 102. The devices may include a variety of active devices such as transistors and the like and passive devices such as capacitors, resistors, inductors and the like. The active devices and passive devices may be formed using any suitable methods either within or else on the substrate 102. In some cases, the semiconductor substrate 102 may be omitted.

The ILD layer 112 may include a dielectric material formed using, for example, spin-on coating, CVD, flowable CVD, plasma-enhanced CVD (PECVD), or other deposition methods. The ILD layer 112 may be formed of Phospho-Silicate glass (PSG), Boro-Silicate Glass (BSG), Boron-Doped Phospho-Silicate Glass (BPSG), undoped Silicate Glass (USG), Tetra Ethyl Ortho Silicate (TEOS) oxide, or the like.

FIG. 1A also illustrates the formation of an underlayer 114 over ILD layer 112. In some cases, other layers may be formed between ILD layer 112 and the underlayer 114. In some embodiments, underlayer 114 may be a photoresist layer or a polymer layer. Underlayer 114 may be formed by a spin-on process or another suitable process. As shown in FIG. 1A, underlayer 114 may be formed to an initial thickness $T_1$, which in some cases is between about 10 nm and about 600 nm. However, these thicknesses are meant to be illustrative only, and are not intended to limit the scope of the embodiments, as the precise thickness of the as-deposited layer may be any suitable desired thickness.

Although FIGS. 1A-1G illustrate ILD layer 112 being in physical contact with semiconductor substrate 102 or underlayer 114 being in physical contact with ILD layer 112, any number of intervening layers may be disposed between ILD layer 112 and semiconductor substrate 102. Such intervening layers may include another ILD layer comprising a low-k dielectric and having contact plugs formed therein, IMD layers having conductive lines and/or vias formed therein, one or more intermediary layers (e.g., etch stop layers, adhesion layers, anti-reflective coating (ARC) layers, etc.), combinations thereof, and the like. For example, an optional etch stop layer (not illustrated) may be disposed directly under ILD layer 112. An etch stop layer may act as a stop for an etching process subsequently performed on the ILD layer 112. The material and process used to form the etch stop layer may depend on the material of ILD layer 112.

Figure 1B:
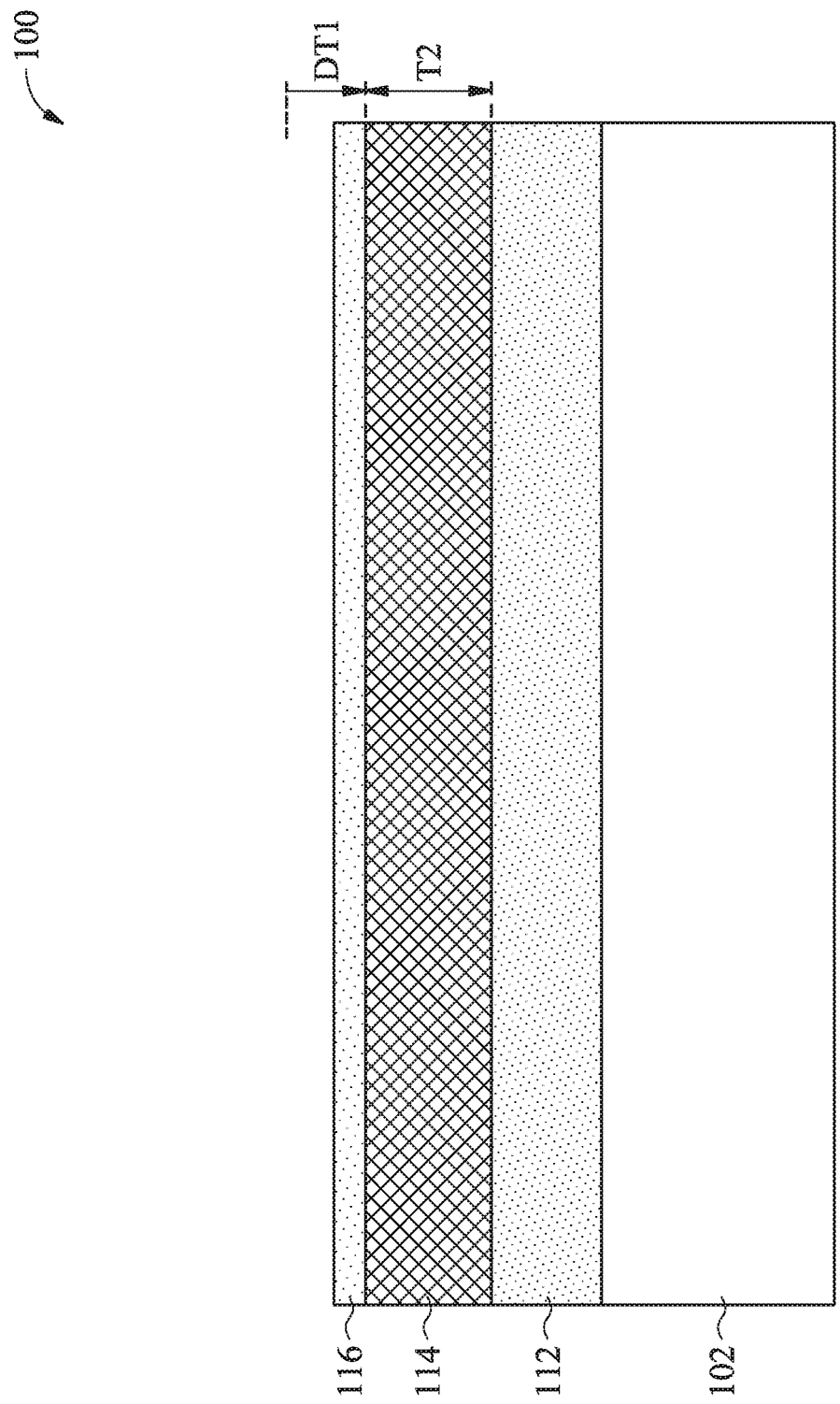

As illustrated in FIG. 1B, a low-temperature dielectric (LTD) film 116 is formed over underlayer 114. In some embodiments, LTD film 116 may be part of a multi-layer photoresist. For example, LTD film 116 may be a middle layer of a multi-layer photoresist stack, and underlayer 114 may be the bottom layer of a multi-layer photoresist stack. In some embodiments, LTD film 116 may be formed of SiN, SiON, SiCON, SiC, SiOC, SiO, TiO, an oxide, other dielectrics, combinations thereof, or the like. LTD film 116 may be formed by a deposition process such as plasma enhanced chemical vapor deposition (PECVD), low pressure CVD (LPCVD), physical vapor deposition (PVD), plasma-enhanced atomic layer deposition (PEALD), or the like. In some embodiments, LTD film 116 may be formed to a thickness between about 10 Å and about 50 nm. However, these thicknesses are meant to be illustrative only, and are not intended to limit the scope of the embodiments, as the precise thickness of the as-deposited layer may be any suitable desired thickness.

Figure 2:
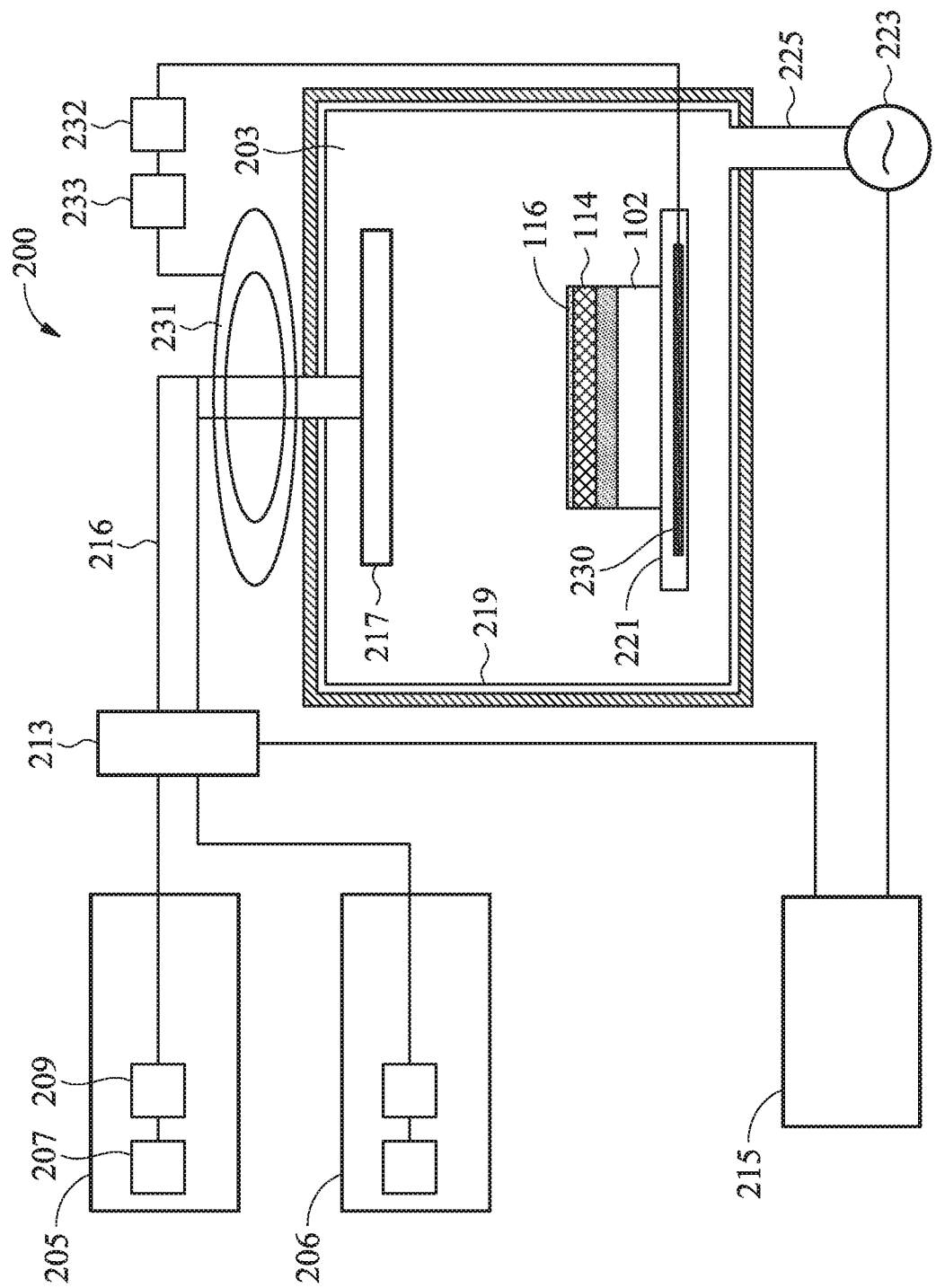
FIG. 2 illustrates a deposition system for depositing a low-temperature dielectric film in accordance with some embodiments.
Figure 3:
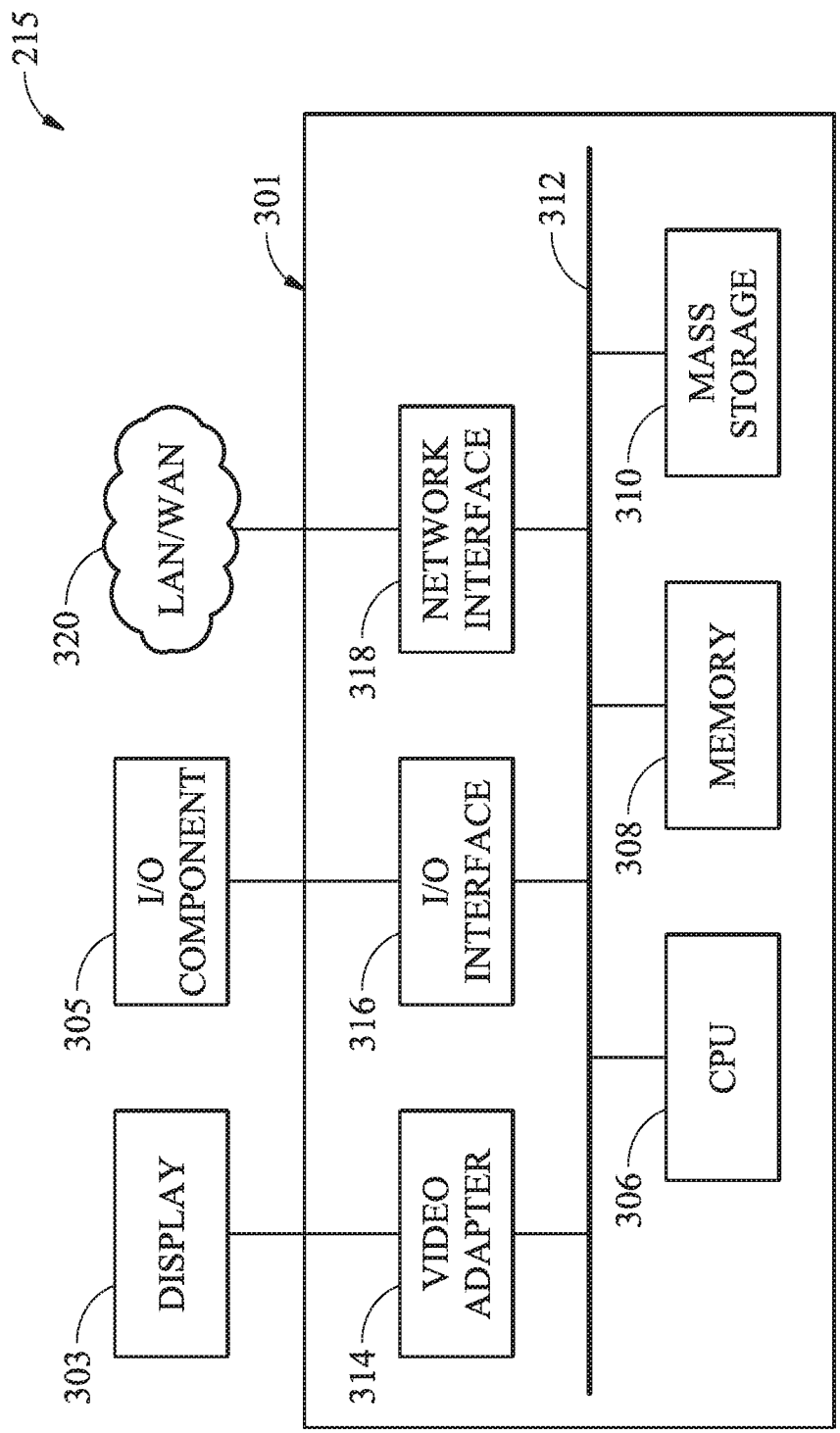
FIG. 3 illustrates a control unit for a deposition system in accordance with some embodiments.

FIGS. 2-3 illustrate a deposition system 200 that may be used to form a low-temperature dielectric (LTD) film such as LTD film 116. In some embodiments, deposition system 200 forms the LTD film using a PEALD process. In some embodiments, deposition system 200 receives a first precursor material from a first precursor delivery system 205 and a second precursor material from a second precursor delivery system 206 to form layers of materials onto substrate 102. In an embodiment, first precursor delivery system 205 and second precursor delivery system 206 may work in conjunction with one another to supply the various different precursor materials to a deposition chamber 203 in which substrate 102 is placed. In some cases, first precursor delivery system 205 and second precursor delivery system 206 may have physical components that are similar with each other. In some embodiments, other precursor delivery systems may be part of deposition system 200, and may be similar to first precursor delivery system 205 or second precursor delivery system 206.

In some embodiments, first precursor delivery system 205 and second precursor delivery system 206 may each include a gas supply 207 and a flow controller 209 (labeled in FIG. 2 with regards to first precursor delivery system 205 but not labeled for clarity with respect to second precursor delivery system 206). In an embodiment in which the first precursor material is stored in a gaseous state, gas supply 207 may supply the first precursor material to deposition chamber 203. Gas supply 207 may be a vessel, such as a gas storage tank, that is located either locally to deposition chamber 203 or else may be located remotely from deposition chamber 203. Alternatively, gas supply 207 may be a facility that independently prepares and delivers the first precursor material to flow controller 209. Any suitable source for the first precursor material may be utilized as gas supply 207, and all such sources are fully intended to be included within the scope of the embodiments.

Gas supply 207 may supply the desired first precursor material to flow controller 209. Flow controller 209 may be utilized to control the flow of the first precursor material to precursor gas controller 213 and, eventually, to deposition chamber 203, thereby also helping to control the pressure within deposition chamber 203. Flow controller 209 may be, e.g., a proportional valve, a modulating valve, a needle valve, a pressure regulator, a mass flow controller, combinations of these, or the like. However, any suitable method for controlling and regulating the flow of the carrier gas to precursor canister 211 may be utilized, and all such components and methods are fully intended to be included within the scope of the embodiments.

However, as one of ordinary skill in the art will recognize, while first precursor delivery system 205 and second precursor delivery system 206 have been described herein as having identical components, this is merely an illustrative example and is not intended to limit the embodiments in any fashion. Any type of suitable precursor delivery system, with any type or number of individual components identical to or different from any of the other precursor delivery systems within deposition system 200, may alternatively be utilized.

All such precursor systems are fully intended to be included within the scope of the embodiments.

Additionally, in an embodiment in which the first precursor material is stored in a solid or liquid state, gas supply 207 may store a carrier gas and the carrier gas may be introduced into a precursor canister (not separately illustrated), which stores the first precursor material in the solid or liquid state. The carrier gas is then used to push and carry the first precursor material as the first precursor material either evaporates or sublimates into a gaseous section of the precursor canister before being sent to precursor gas controller 213. In some embodiments, a carrier gas may be an inert gas such as Ar, He, or another gas. Any suitable method and combination of units may be utilized to provide the first precursor material, and all such combination of units are fully intended to be included within the scope of the embodiments.

First precursor delivery system 205 and second precursor delivery system 206 may supply their individual precursor materials into a precursor gas controller 213. Precursor gas controller 213 connects and isolates first precursor delivery system 205 and second precursor delivery system 206 from deposition chamber 203 in order to deliver the desired precursor materials to deposition chamber 203. Precursor gas controller 213 may include such devices as valves, flow meters, sensors, and the like to control the delivery rates of each of the precursors, and may be controlled by instructions received from a control unit 215 (described further below with respect to FIG. 3).

Precursor gas controller 213, upon receiving instructions from control unit 215, may open and close valves so as to connect one or more of first precursor delivery system 205 and second precursor delivery system 206 to deposition chamber 203 and direct a desired precursor material through a manifold 216, into deposition chamber 203, and to a showerhead 217. Showerhead 217 may be utilized to disperse the chosen precursor material(s) into deposition chamber 203 and may be designed to evenly disperse the precursor material in order to minimize undesired process conditions that may arise from uneven dispersal. In some embodiments, showerhead 217 may have a circular design with openings dispersed evenly around showerhead 217 to allow for the dispersal of the desired precursor material into deposition chamber 203.

However, as one of ordinary skill in the art will recognize, the introduction of precursor materials to deposition chamber 203 through a single showerhead 217 or through a single point of introduction as described above is intended to be illustrative only and is not intended to be limiting to the embodiments. Any number of separate and independent showerheads 217 or other openings to introduce precursor materials into deposition chamber 203 may alternatively be utilized. All such combinations of showerheads and other points of introduction are fully intended to be included within the scope of the embodiments.

Deposition chamber 203 may receive the desired precursor materials and expose the precursor materials to underlayer 114, and deposition chamber 203 may be any desired shape that may be suitable for dispersing the precursor materials and contacting the precursor materials with underlayer 114. In the embodiment illustrated in FIG. 2, deposition chamber 203 has a cylindrical sidewall and a bottom. However, deposition chamber 203 is not limited to a cylindrical shape, and any other suitable shape, such as a hollow square tube, an octagonal shape, or the like, may be utilized. Furthermore, deposition chamber 203 may be surrounded by a housing 219 made of material that is inert to the various process materials. As such, while housing 219 may be any suitable material that can withstand the chemistries and pressures involved in the deposition process, in an embodiment housing 219 may be steel, stainless steel, nickel, aluminum, alloys of these, combinations of these, and like.

Within deposition chamber 203, substrate 102 may be placed on a mounting platform 221 in order to position and control substrate 102 and underlayer 114 during the deposition processes. Mounting platform 221 may be disposed on the bottom of deposition chamber 203, and may include heating mechanisms in order to heat substrate 102 during the deposition processes. Furthermore, while a single mounting platform 221 is illustrated in FIG. 2, any number of mounting platforms 221 may additionally be included within deposition chamber 203.

In some embodiments, mounting platform 221 may also include a first electrode 230 coupled to a first RF generator 232. First electrode 220 may be electrically biased by first RF generator 232 (under control of control unit 215) at a RF voltage during a deposition process such as a PEALD process. By being electrically biased, first electrode 230 is used to provide a bias to the incoming gases (e.g., precursor materials and/or carrier gases) and assist to ignite them into a plasma. In some embodiments, a carrier gas may be ignited into a plasma along with a precursor material. Additionally, first electrode 230 is also used to maintain a plasma during a deposition by maintaining the bias.

Deposition chamber 203 also includes an upper electrode 231, for use as a plasma generator. In an embodiment the plasma generator may be a transformer coupled plasma generator and may be, e.g., a coil. The coil may be attached to a RF generator 233 that is used to provide power to the upper electrode 231 (under control of control unit 215) in order to ignite gases into a plasma.

However, while the upper electrode 231 is described above as a transformer coupled plasma generator, embodiments are not intended to be limited to a transformer coupled plasma generator. Rather, any suitable method of generating the plasma, such as inductively coupled plasma systems, magnetically enhanced reactive ion etching, electron cyclotron resonance, a remote plasma generator, or the like, may alternatively be utilized. For example, in some embodiments, incoming gases may be ignited into a plasma by a plasma generator located in a separate chamber that is connected to deposition chamber 203, or incoming gases may be ignited into a plasma in deposition chamber 203 by a plasma generator that is not coupled to mounting platform 221. All such methods are fully intended to be included within the scope of the embodiments.

Additionally, deposition chamber 203 and mounting platform 221 may be part of a cluster tool system (not shown). The cluster tool system may be used in conjunction with an automated handling system in order to position and place substrate 102 into deposition chamber 203 prior to the deposition processes, position, hold substrate 102 during deposition processes, and remove substrate 102 from deposition chamber 203 after the deposition processes.

Deposition chamber 203 may also have an exhaust outlet 225 for exhaust gases to exit deposition chamber 203. A vacuum pump 223 may be connected to exhaust outlet 225 of deposition chamber 203 in order to help evacuate the exhaust gases. Vacuum pump 223, under control of control unit 215, may also be utilized to reduce and control the pressure within deposition chamber 203 to a desired pressure and may also be utilized to evacuate precursor materials from deposition chamber 203 in preparation for the introduction of the next precursor material.

FIG. 3 illustrates an embodiment of control unit 215 that may be utilized to control precursor gas controller 213, vacuum pump 223, or RF generators 232, 233. Control unit 215 may be any form of computer processor that can be used in an industrial setting for controlling process machines. In an embodiment, control unit 215 may include a processing unit 301, such as a desktop computer, a workstation, a laptop computer, the like, or a dedicated unit customized for a particular application. Control unit 215 may be equipped with a display 303 and one or more input/output components 305, such as instruction outputs, sensor inputs, a mouse, a keyboard, printer, combinations of these, or the like. Processing unit 301 may include a central processing unit (CPU) 306, memory 308, a mass storage device 310, a video adapter 314, and an I/O interface 316 connected to a bus 312.

Bus 312 may be one or more of any type of several bus architectures including a memory bus or memory controller, a peripheral bus, or video bus. CPU 306 may include any type of electronic data processor, and memory 308 may include any type of system memory, such as static random access memory (SRAM), dynamic random access memory (DRAM), or read-only memory (ROM). Mass storage device 310 may include any type of storage device configured to store data, programs, or other information and configured to make the data, programs, or other information accessible via bus 312. Mass storage device 310 may include, for example, one or more of a hard disk drive, a magnetic disk drive, or an optical disc drive.

The video adapter 314 and the I/O interface 316 provide interfaces to couple external input and output devices to the processing unit 301. As illustrated in FIG. 3, examples of input and output devices include the display 303 coupled to the video adapter 314 and the I/O component 305, such as a mouse, keyboard, printer, and the like, coupled to the I/O interface 316. Other devices may be coupled to the processing unit 301, and additional or fewer interface cards may be utilized. For example, a serial interface card (not shown) may be used to provide a serial interface for a printer. The processing unit 301 also may include a network interface 318 that may be a wired link to a local area network (LAN) or a wide area network (WAN) 320 and/or a wireless link. It should be noted that control unit 215 may include other components. For example, control unit 215 may include power supplies, cables, a motherboard, removable storage media, cases, and the like. These other components, although not shown in FIG. 3, are considered part of control unit 215.

In some cases, an oxygen plasma present during deposition of a material over a photoresist or polymer underlayer can damage the underlayer surface. In some cases, the underlayer is damaged or consumed as oxygen radicals (O*) formed in the plasma break carbon-carbon bonds (C—C, C=C) or carbon-hydrogen bonds (C—H) within the underlayer. For example, the oxygen plasma may react with the underlayer according to:

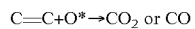

C=C+O*→CO$_2$ or CO

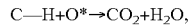

C—H+O*→CO$_2$+H$_2$O, though other reactions may be possible.

In a PEALD process, the use of oxygen-containing precursor materials for the deposition of an oxygen-containing film can form an oxygen plasma during deposition that damages the underlayer. In some cases, the oxygen plasma consumes or etches part of the underlayer, which can result in a reduction of the thickness of the underlayer with respect to the as-deposited thickness. For example, oxygen plasma damage to underlayer 114 due to the deposition of LTD film 116 may reduce the thickness of underlayer 114 from its initial as-deposited thickness T1 to a smaller thickness T2. This underlayer 114 thickness change is shown representatively in FIG. 1B by thickness change DT1. In some cases, the amount of thickness change DT1 is determined by the material of underlayer 114 and the characteristics of the oxygen plasma and the PEALD process. This damage can result in reduced process uniformity or reproducibility, and in some cases may affect the dimensions of patterned structures or other features.

In some embodiments, the use of an oxygen-containing precursor other than an allotrope of oxygen (e.g., gaseous oxygen O$_2$, ozone O$_3$, etc.) for the deposition of LTD film 116 allows for the formation of LTD film 116 with a reduction of oxygen plasma present during deposition. In some embodiments, instead of or in addition to an oxygen allotrope precursor, precursors such as CO$_2$, N$_2$O, or N$_2$O$_2$ may be used. In some embodiments, one or more alcohols may be used as a precursor, such as ethanol or other alcohols or combinations of alcohols. In some embodiments, more than one precursor may be used, and in some embodiments more than one precursor may be used in combination with or without the use of an oxygen allotrope precursor as another precursor material. The use of precursors with less oxygen content (e.g., precursors without gaseous oxygen O$_2$, ozone O$_3$, etc.) can form an oxygen-containing LTD film 116 over underlayer 114 with less damage to underlayer 114.

Figure 4:
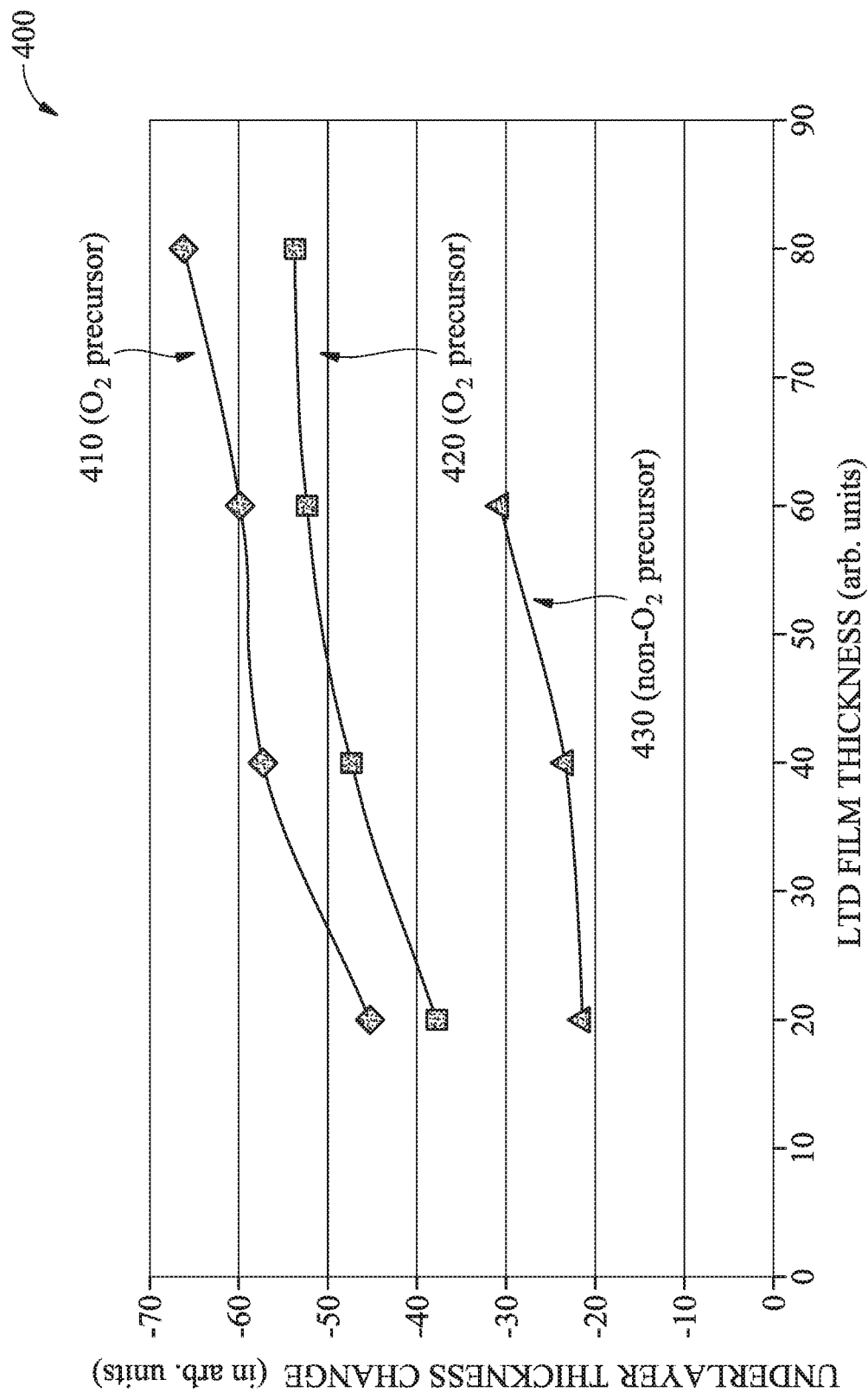
FIG. 4 illustrates experimental results reflecting the relationship between underlayer damage and low-temperature dielectric film thicknesses in accordance with some embodiments.

FIG. 4 illustrates a graph 400 showing example results of experiments of depositing an LTD film on an underlayer, producing a multilayer structure similar to the structure shown in FIG. 1B. Graph 400 shows curves 410, 420, 430 plotting the changes in the thickness of an underlayer against the thicknesses of different LTD films deposited directly on that underlayer. In some cases, the amount of change in underlayer thickness may be indicative of the amount of underlayer damage due to an oxygen plasma. In the experiments shown in graph 400, three different LTD films are deposited, represented by curves 410, 420, and 430. Curves 410, 420, and 430 show that deposition of the LTD films cause the underlayer thickness to decrease. In general, the change in underlayer thickness becomes greater as the thickness of the deposited LTD film increases. The LTD films of curves 410 and 420 were deposited using O$_2$ as a precursor. However, the LTD film of curve 430 was deposited using CO$_2$ as a precursor instead of O$_2$, and curve 430 indicates that less underlayer damage has occurred during its LTD film deposition than for curves 410 and 420. For example, the underlayer thickness change of curve 430 is at least approximately half of the underlayer thickness change of curve 410. Thus, graph 400 shows an example of how the techniques described by some embodiments herein may reduce damage to a photoresist or polymer underlayer when an oxygen-containing dielectric film is deposited directly on the underlayer.

Returning now to FIG. 1B, a deposition system such as deposition system 200 may be utilized to deposit LTD film 116 onto underlayer 114. In some embodiments, the formation of LTD film 116 may be initiated by introducing precursor materials into the first precursor delivery system 205 or the second precursor delivery system 206. In some embodiments, first precursor materials include CO$_2$, N$_2$O, N$_2$O$_2$, one or more alcohols, other materials, or a combination. In some embodiments, second precursor materials include tris(dimethylamino)silane (3DMAS), tetrakis(dimethylamino)titanium (TDMAT), bis(tertiary-butyl-amino)

silane (BTBAS), bis(diethylamino)silane (BDEAS), other materials, or a combination. In some embodiments, an oxygen allotrope precursor may be used as a third precursor material in combination with another first precursor material.

Once a first precursor material and a second precursor material have been placed into first precursor delivery system 205 and second precursor delivery system 206, the formation of LTD film 116 may be initiated by control unit 215 sending an instruction to precursor gas controller 213 to sequentially or alternately connect first precursor delivery system 205 and second precursor delivery system 206 to deposition chamber 203. Once connected, first precursor delivery system 205 and second precursor delivery system 206 can deliver the first precursor material and the second precursor material to showerhead 217 through precursor gas controller 213 and manifold 216. Showerhead 217 can then disperse the first precursor material and the second precursor material into deposition chamber 203, in which the first precursor material and the second precursor material can form LTD film 116 on underlayer 114. Control unit 215 can also ignite a precursor material into a plasma within deposition chamber 203, for example, using RF generators 232, 233. In some embodiments, a first precursor material such as those described above may be ignited into a plasma during deposition of LTD film 116. In some cases, LTD film 116 may be deposited in the same deposition chamber 203 as other processing steps such as deposition processes or etching processes. For example, a plasma etching process or another plasma-enhanced deposition process may also be performed on semiconductor device 100 within deposition chamber 203.

In some embodiments, for the formation of LTD film 116, first precursor material may be flowed into deposition chamber 203 at a flow rate of between about 10 sccm and about 5000 sccm, and second precursor material may be flowed into deposition chamber 203 at a flow rate of between about 10 sccm and about 5000 sccm. For example, $CO_2$ as a first precursor material may be flowed into deposition chamber 203 at a flow rate of between about 10 sccm and about 5000 sccm. Additionally, deposition chamber 203 may be held at a pressure of between about 0.1 Torr and about 10 Torr and a temperature of between about 0° C. and about 200° C., such as about 90° C. In some embodiments, LTD film 116 is formed using an RF power of between about 1 Watt and about 2000 Watts. In some embodiments, LTD film 116 is formed using a DC power of between about 1 Watt and about 2000 Watts. However, as one of ordinary skill in the art will recognize, these process conditions are only intended to be illustrative, as any suitable process conditions may be utilized while remaining within the scope of the embodiments.

Figure 1C:
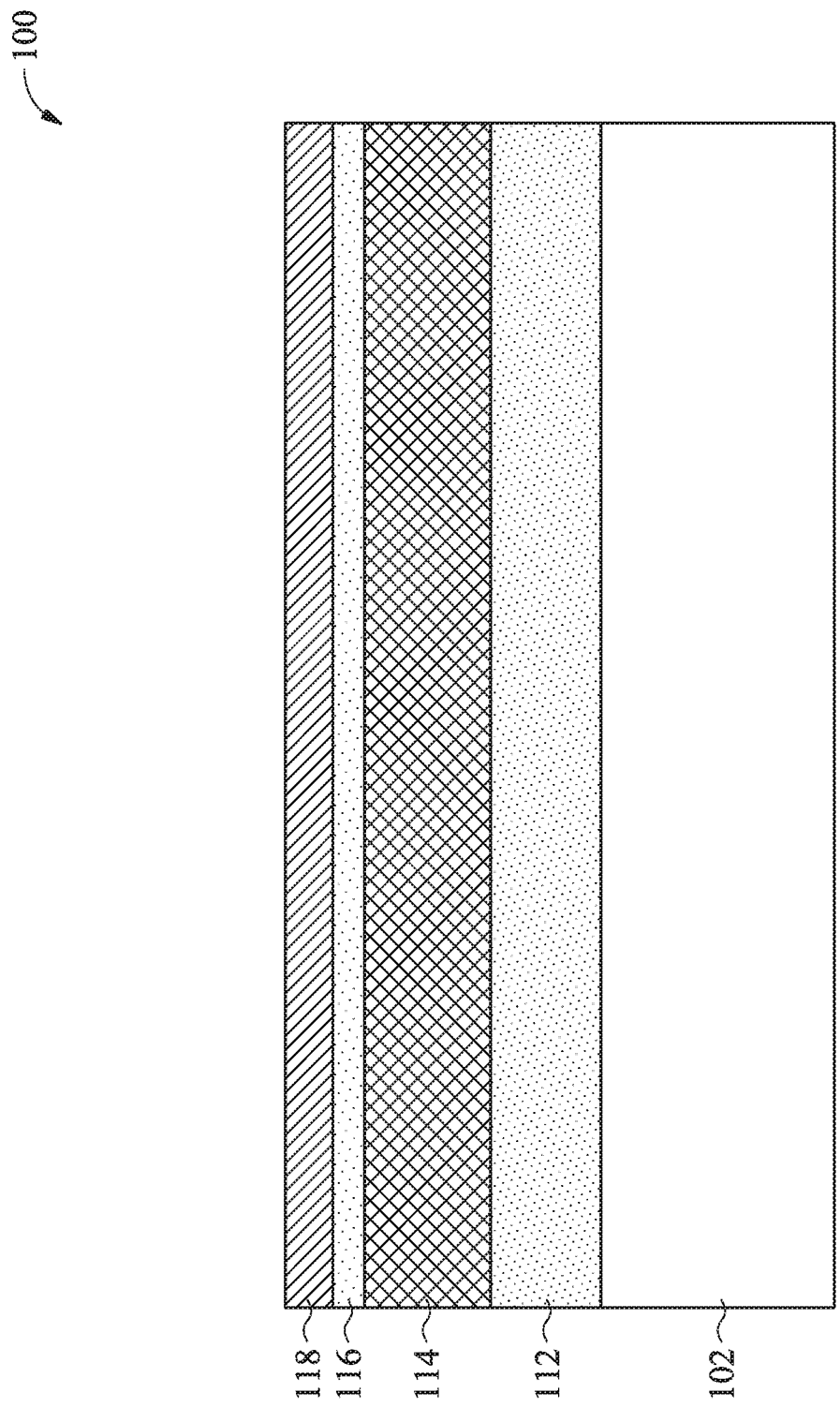
Figure 1D:
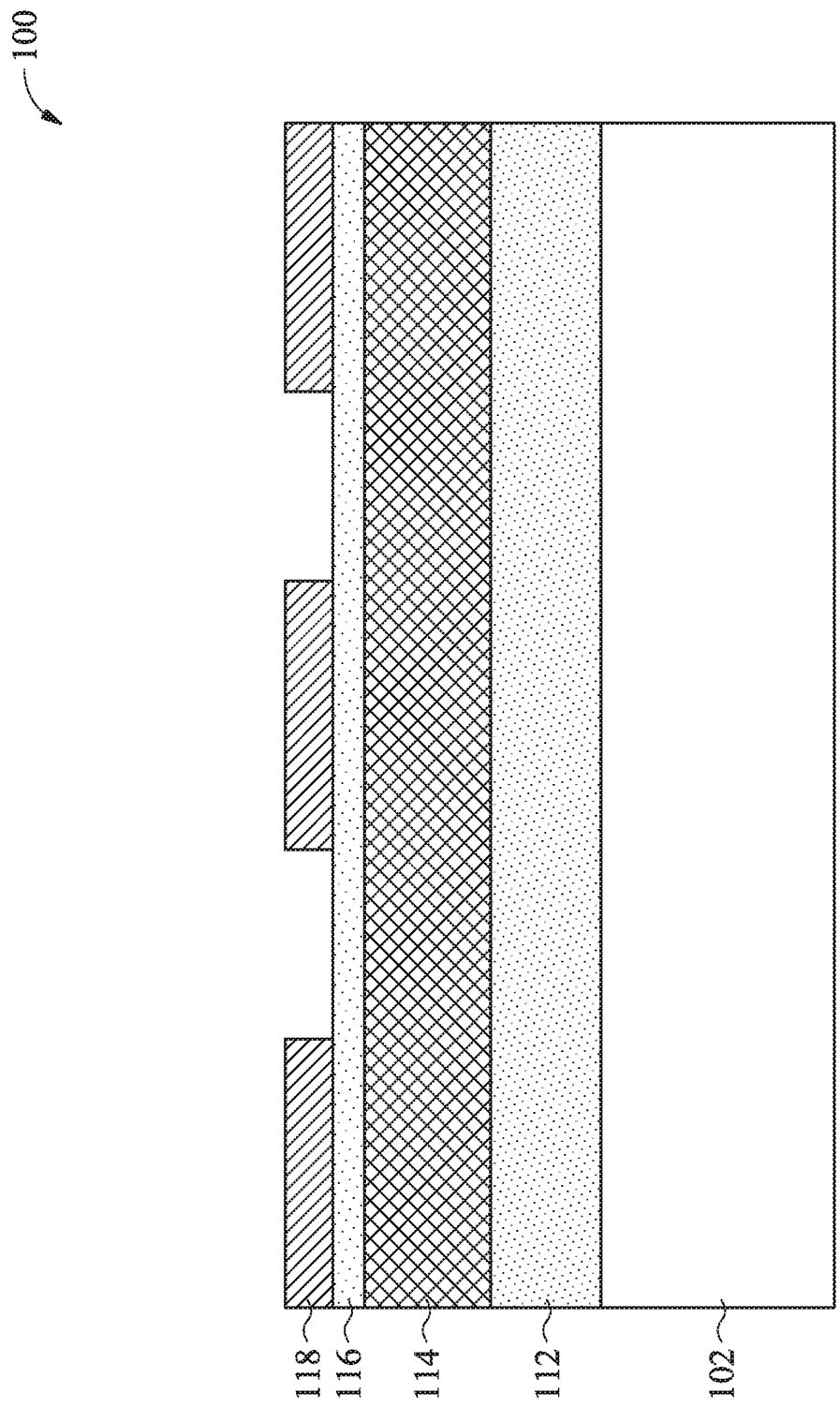

Turning to FIG. 1C, an upper layer 118 is formed over LTD film 116. In some embodiments, upper layer 118 may be a photoresist. In some cases, upper layer 118 may be part of a multi-layer photoresist stack. For example, upper layer 118 may be the uppermost layer of a multi-layer photoresist stack and LTD film 116 may be a middle layer of the multi-layer photoresist stack. Upper layer 118 may be formed by a spin-on process or another suitable process. In some embodiments, an additional layer such as an adhesion layer may be formed over LTD film 116 prior to forming upper layer 118. In FIG. 1D, upper layer 118 is patterned using a photolithographic process to form openings within upper layer 118.

Figure 1E:
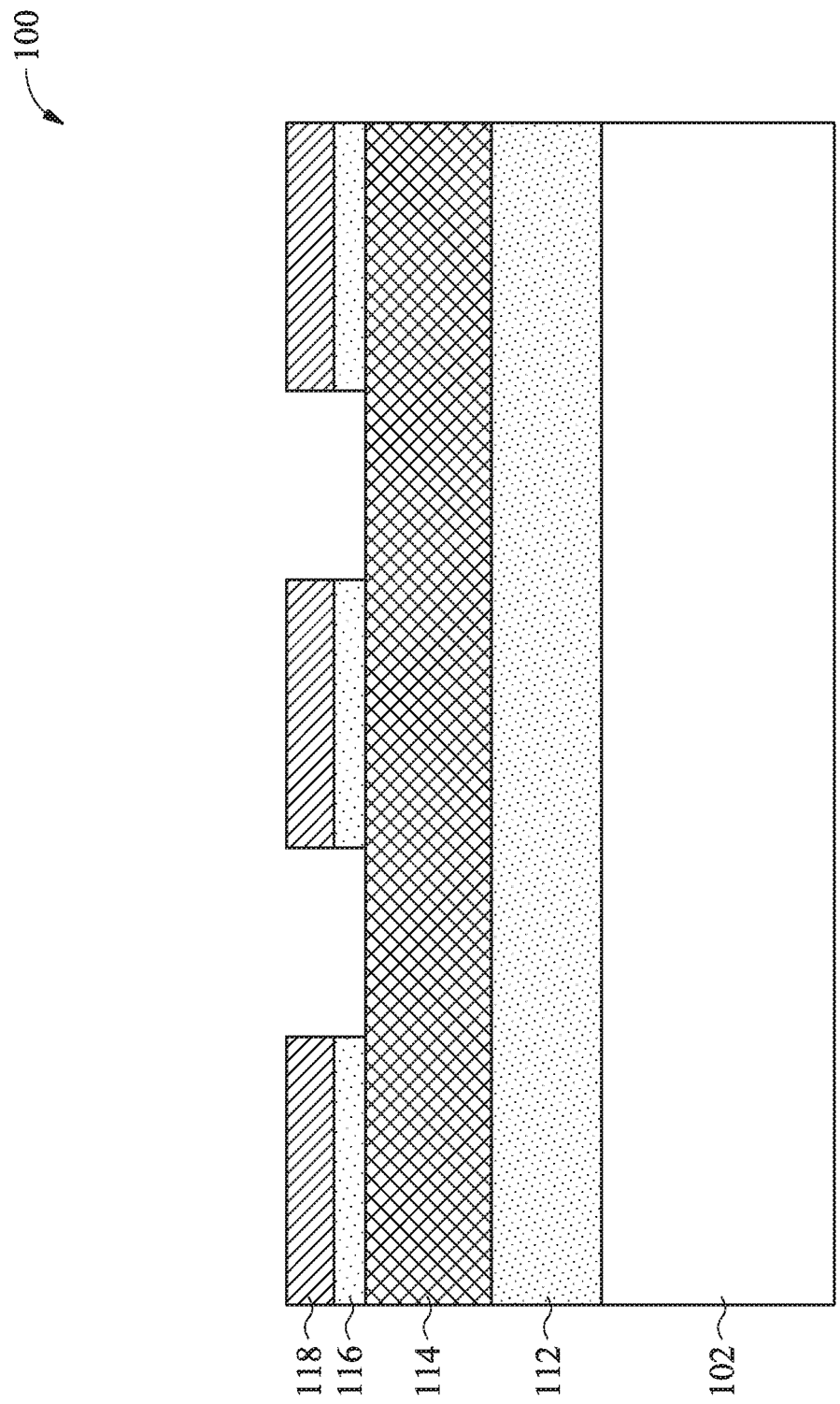

As shown in FIG. 1E, the patterned upper layer 118 is used as an etching mask for patterning of LTD film 116. The pattern of upper layer 118 may be transferred to LTD film 116 via an etching process. In some cases, the etching process is anisotropic, so that the openings in upper layer 118 are extended through LTD film 116 and have about the same sizes in LTD film 116 as they do in upper layer 118. In some embodiments, one or more etching processes are performed in the same chamber (e.g., deposition chamber 203) as the deposition of LTD film 116.

Figure 1F:
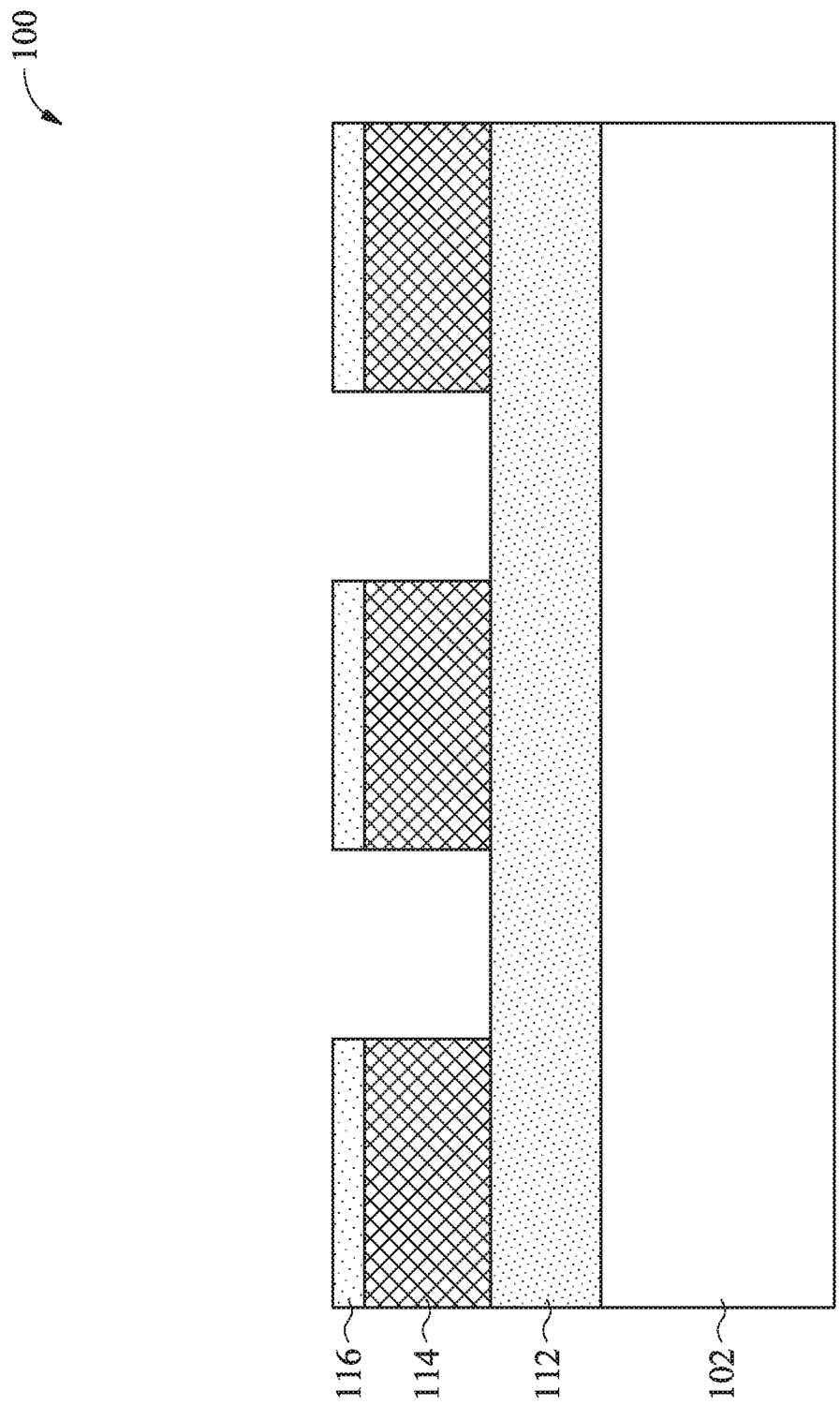
Figure 1G:
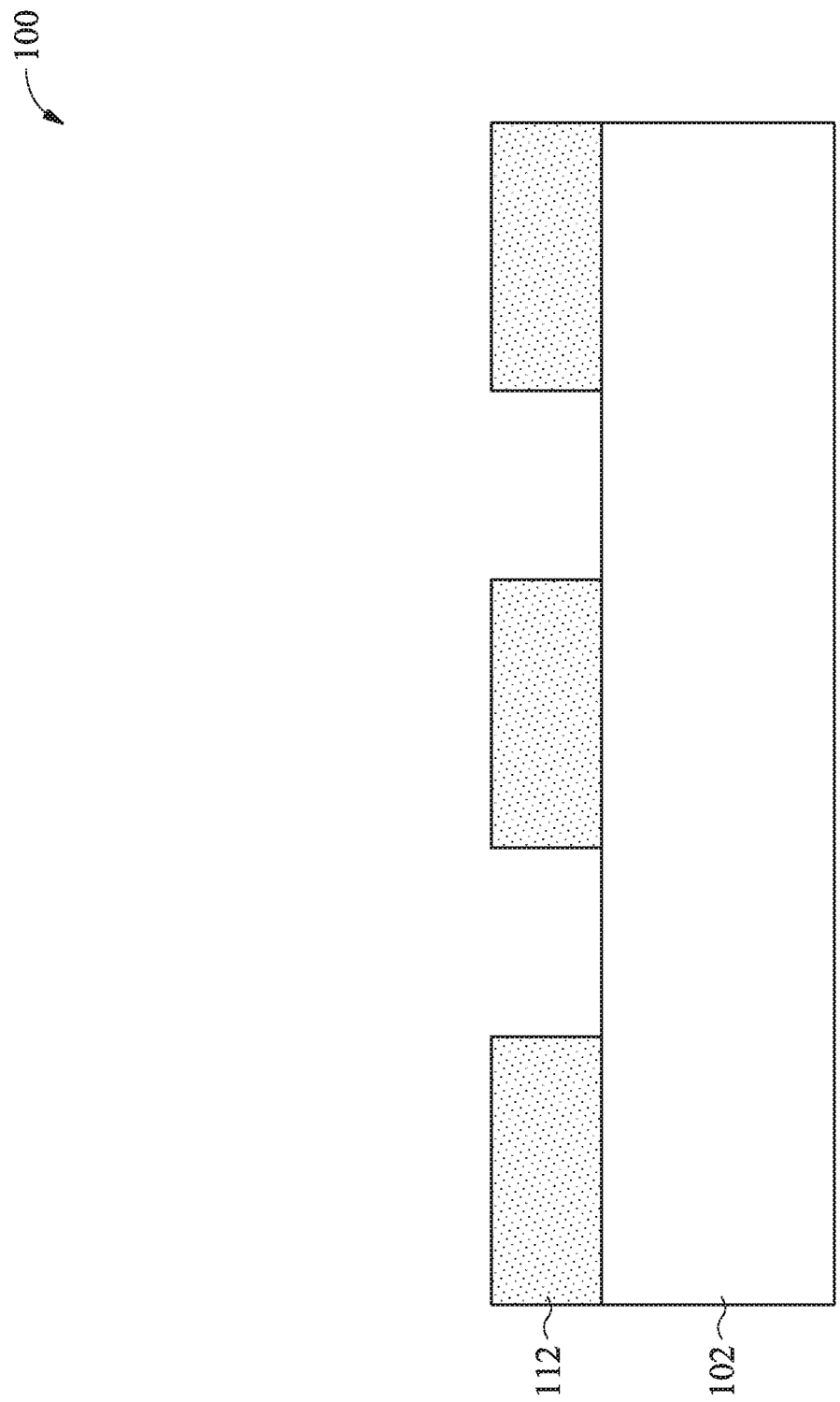

As shown in FIG. 1F, patterned LTD film 116 is used as an etching mask for patterning of underlayer 114. The pattern of LTD film 116 may be transferred to underlayer 114 via an etching process. In some cases, the etching process is anisotropic, so that the openings in LTD film 116 are extended through underlayer 114 and have about the same sizes in underlayer 114 as they do in LTD film 116. In some cases, as part of etching underlayer 114, some of or all of upper layer 118 may be consumed. As shown in FIG. 1G, patterned underlayer 114 is then used as an etching mask for patterning of ILD layer 112. The pattern of underlayer 114 may be transferred to ILD layer 112 via an etching process. In some cases, as part of etching ILD layer 112, some of or all of LTD film 116 or underlayer 114 may be consumed. In embodiments when underlayer 114 is not completely consumed while etching ILD layer 112, an ashing process may be performed to remove remaining residue of the underlayer 114.

Figure 1H:
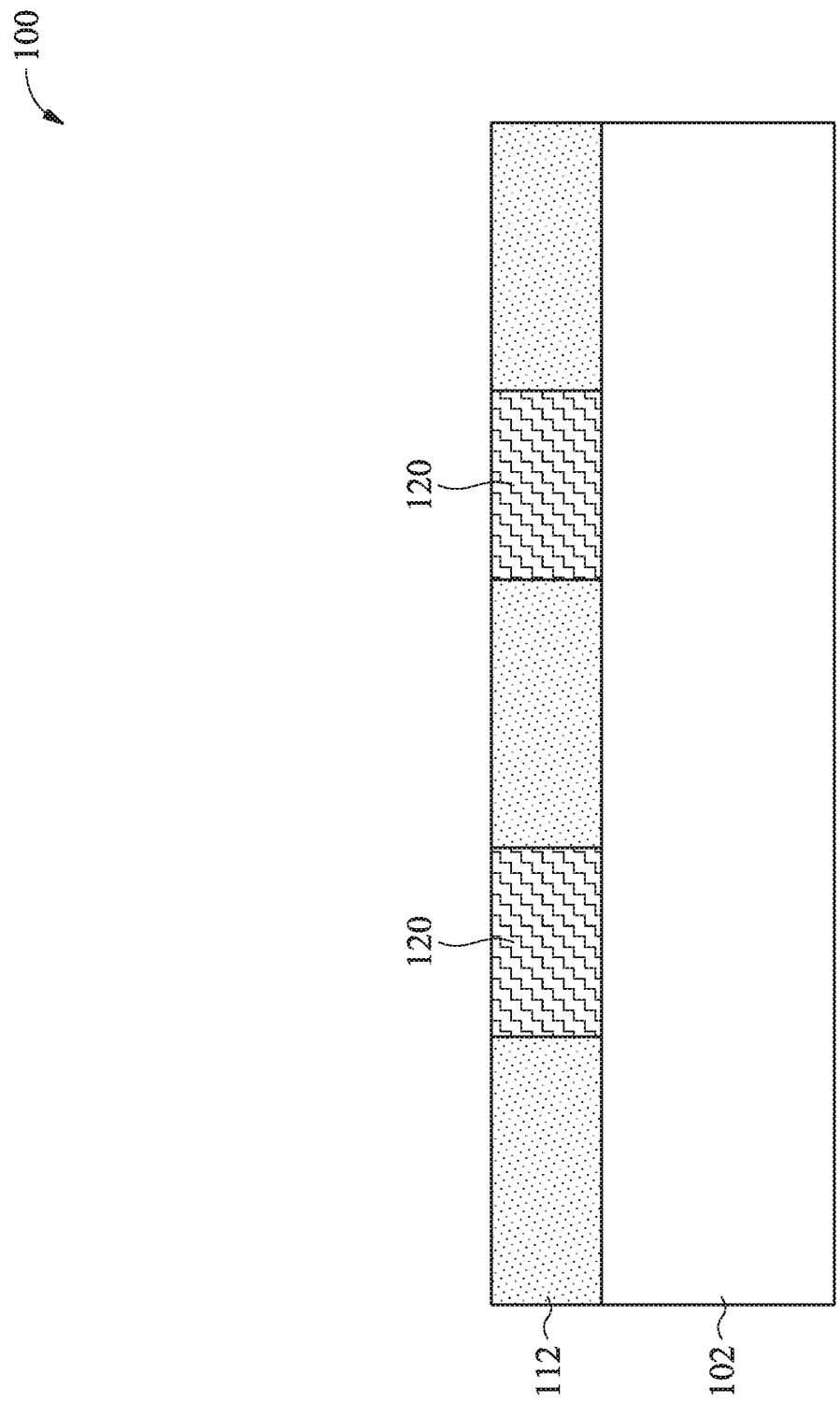

In FIG. 1H, etched portions of ILD layer 112 are filled with a conductive material. Any suitable conductive material may be used, such as copper, aluminum, or another metal, and the conductive material may be formed using a plating process or another suitable process. In some embodiments, one or more additional layers may be deposited over the etched portions of ILD layer 112 before forming the conductive material, such as barrier layers, adhesion layers, seed layers, or other layers. After filling the etched portions, a planarization process, such as a chemical mechanical polish (CMP), may be performed to remove excess portions of the conductive material over the ILD layer 112 to form conductive lines 120.

While the example embodiment of FIGS. 1A-1H shows an LTD film 116 used to pattern an ILD layer 112, in other embodiments, the ILD layer 112 may be another type of layer. For example, ILD layer 112 may be a semiconductor substrate used to form devices such as FinFETs rather than an ILD layer. In some cases, ILD layer 112 includes one or more layers, such as additional inter-layer dielectric layers, other types of dielectric layers, semiconductor layers, conductive layers, etc. As such, ILD layer 112 is an example layer representative of one or more different kinds of layers that may be present during the formation of a semiconductor device 100.

In some cases, the presence of LTD film 116 may improve adhesion of an overlying layer such as upper layer 118. In some cases, the presence of LTD film 116 may reduce the chance of peeling of patterned features formed in upper layer 118. For example, using LTD film 116 may improve adhesion of patterned upper layer 118, shown in FIG. 1D.

By using a deposition process having lower temperatures and reduced oxygen plasma, the techniques described herein allow for the deposition of an oxide LTD film on an underlayer with less damage to the underlayer. In particular, oxygen plasma damage to a photoresist or polymer underlayer may be reduced. In some cases, the use of an LTD film as described may allow for critical dimension shrinkage for patterned structures to enable smaller feature sizes. The deposition of an LTD film as described can enable finely patterned features to be formed with greater process control, decreased feature size, and increased yield.

Figure 5A:
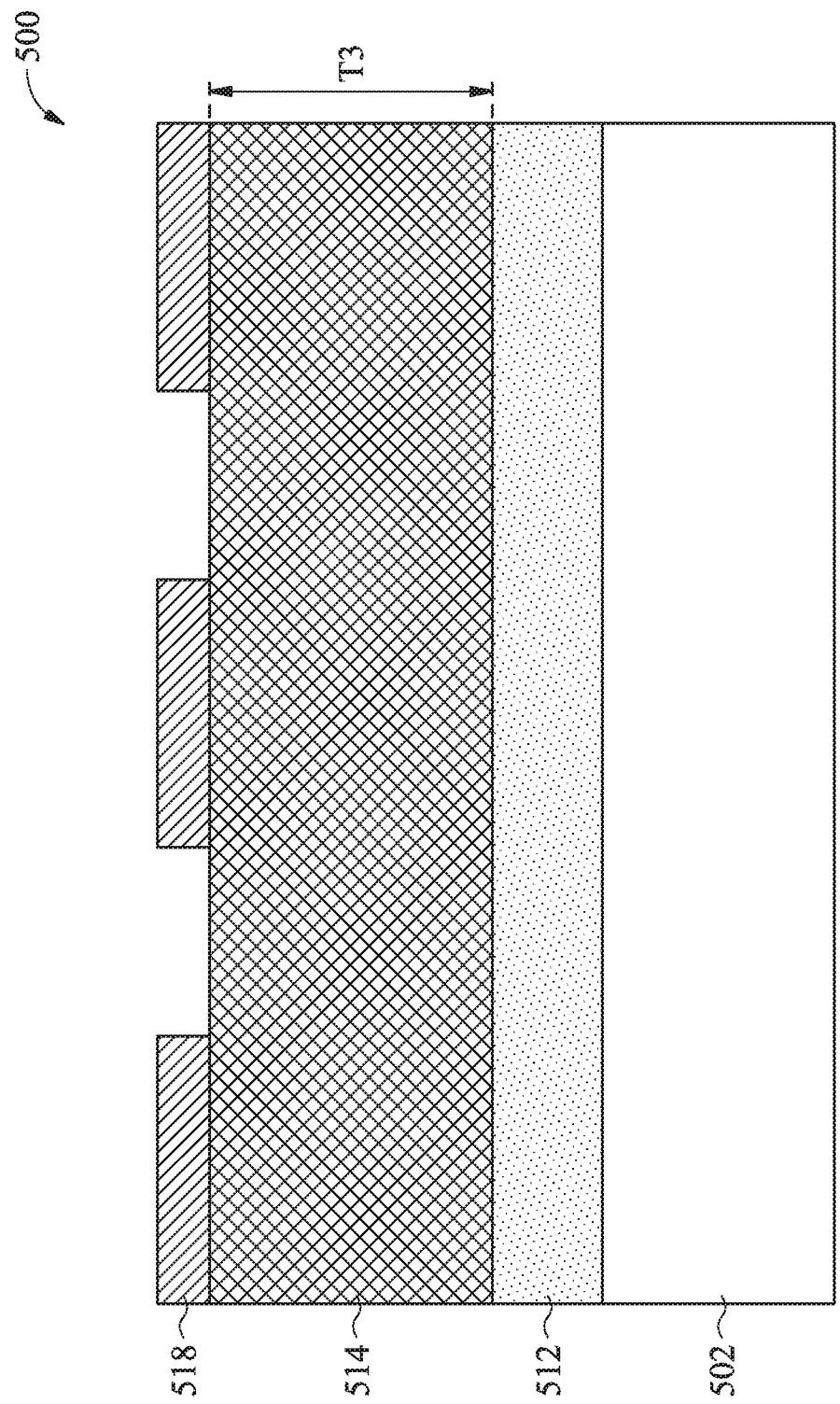
FIGS. 5A-5C illustrate cross-sectional views of various intermediary stages of manufacturing a semiconductor device using a low-temperature dielectric film in accordance with some embodiments.
Figure 5B:
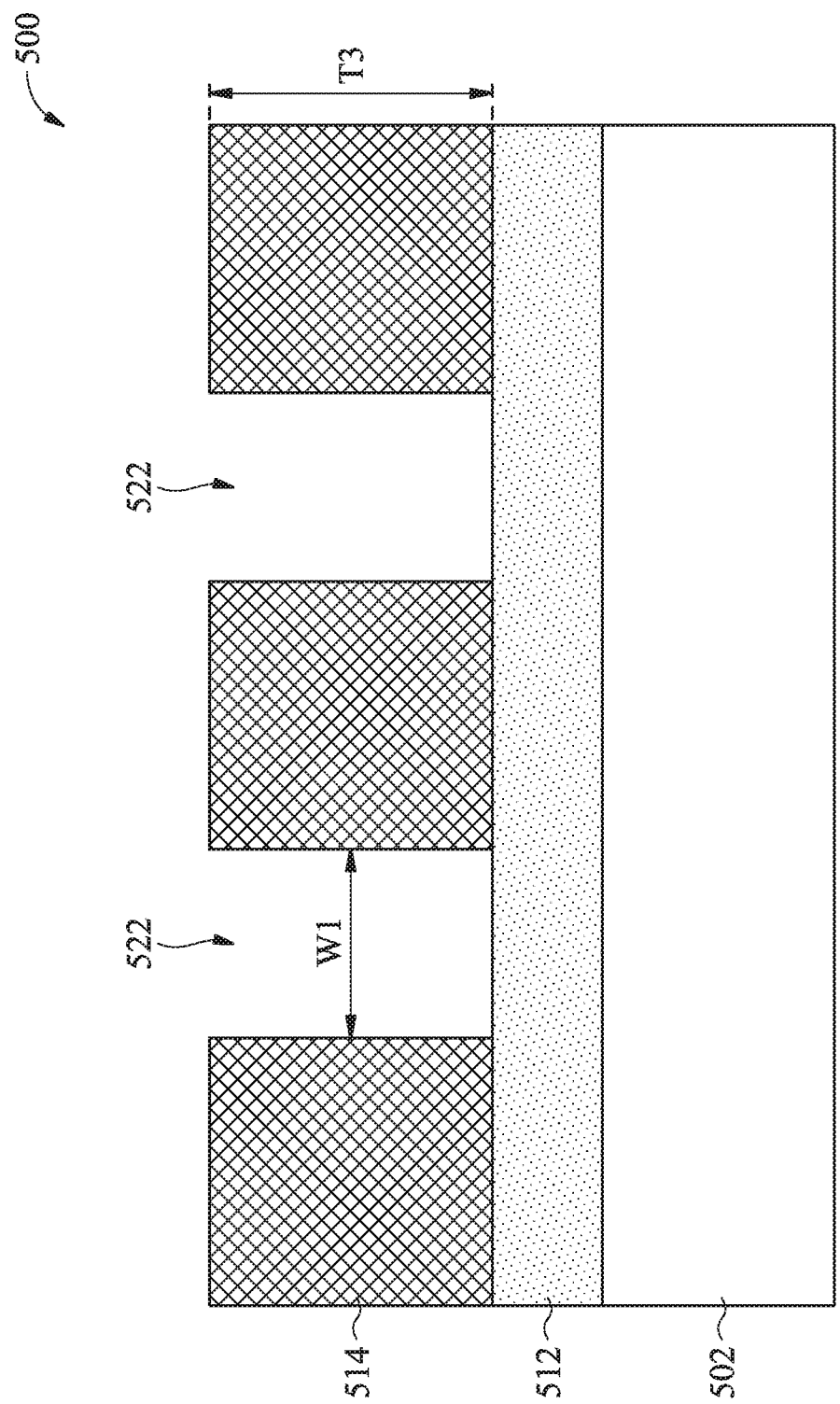
Figure 5C:
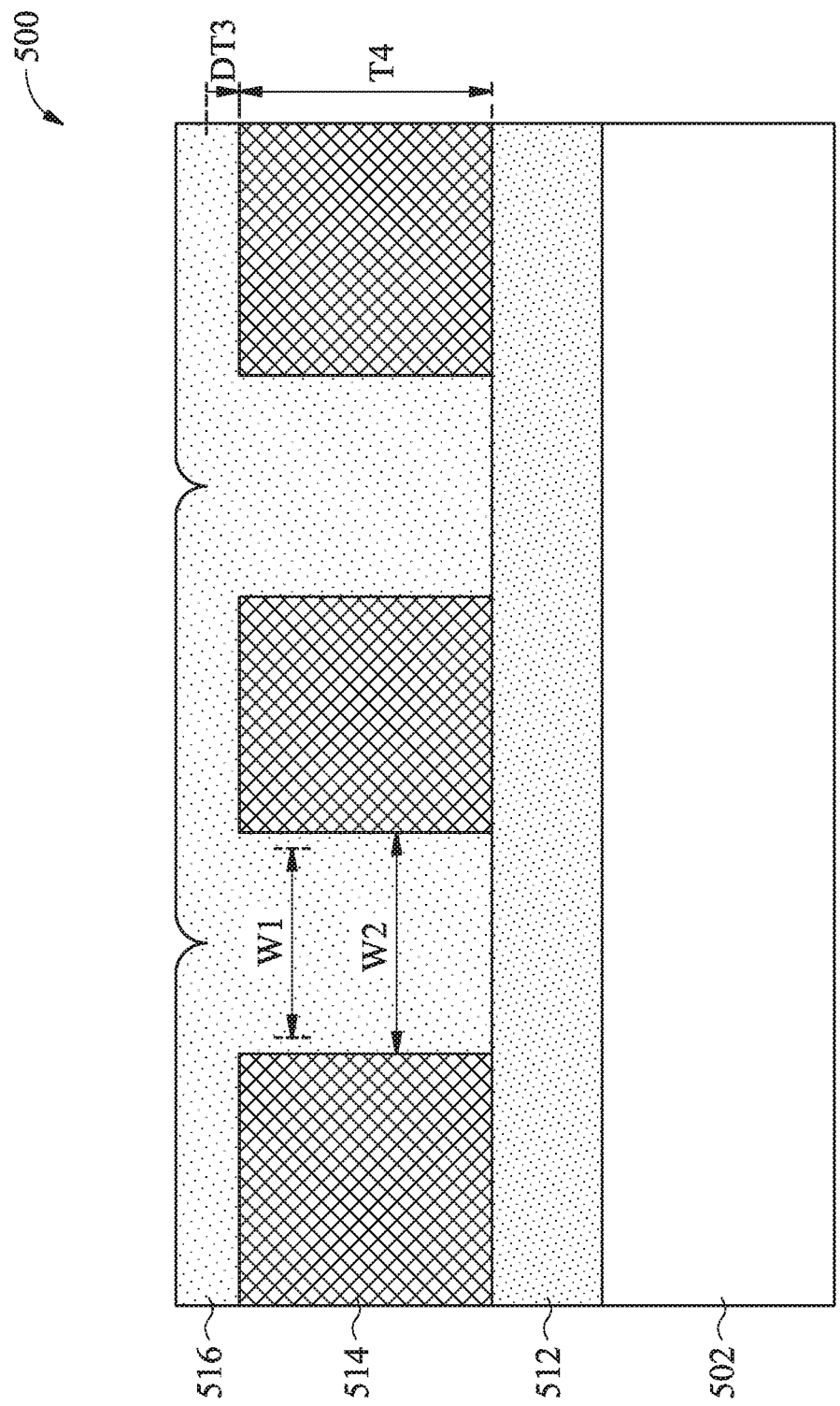

In other embodiments, LTD film as described herein may be used as a gap-fill material deposited within gaps or openings during processing of a semiconductor device. For example, in accordance with an exemplary embodiment, FIGS. 5A-5C illustrate cross-sectional views of intermediate stages of forming a semiconductor device 500 using an LTD film 516 as a gap-fill material. In FIG. 5A, an optional bottom layer 512 is formed over a substrate 502. In some embodiments, substrate 502 may be similar to substrate 102 and bottom layer 512 may be similar to ILD layer 112, described above with respect to FIGS. 1A-1G.

FIG. 5A also illustrates an underlayer 514 formed over bottom layer 512. In some embodiments, underlayer 514 is a photoresist or polymer material, and underlayer 514 may be similar to underlayer 114 described previously with respect to FIGS. 1A-1G. In some embodiments, underlayer 514 is formed to have an as-deposited thickness T3 between about 5 nm and about 1000 nm. Underlayer 514 may be formed by a spin-on process or another suitable process.

FIG. 5A also illustrates an upper layer 518 formed over underlayer 514. As shown in FIG. 5A, upper layer 518 has been patterned using a photolithographic process to form openings within upper layer 518. In some embodiments, upper layer 518 is an oxygen-containing dielectric material similar to LTD film 116, but upper layer 518 may be another dielectric material in other embodiments. As shown in FIG. 5B, patterned upper layer 518 is used as an etching mask for a patterning of underlayer 514. The pattern of upper layer 518 may be transferred to underlayer 514 via an etching process, forming openings 522 within underlayer 514. In some cases, the etching process is anisotropic, so that openings in upper layer 518 are extended through underlayer 514 as openings 522 and have about the same sizes in underlayer 514 as they do in upper layer 518. In some cases, as part of etching underlayer 514, some of or all of upper layer 518 may be consumed, as shown in FIG. 5B. FIG. 5B also illustrates that openings 522 patterned into underlayer 514 may have an initial width W1. In some embodiments, the initial width W1 may be between about 5 nm and about 100 nm. In some embodiments, openings 522 may be considered recesses in underlayer 514.

In FIG. 5C, an LTD film 516 is deposited over the underlayer 514 and into the openings 522 as a gap-fill material. In some embodiments, LTD film 516 is also deposited over remaining portions of upper layer 518. In some embodiments, LTD film 516 may be used as a gap-fill material, sacrificial material, or a reverse material. In some embodiments, LTD film 516 may be deposited conformally to form on sidewalls and a bottom surface of openings 522, but in other embodiments film 516 is not deposited conformally. As deposition continues, portions of LTD film 516 on opposing sidewalls of the openings 522 may merge, which fills the openings 522. In some embodiments, a top surface of LTD film 516 may not be planar, as shown in FIG. 5C.

In some embodiments, LTD film 516 may be similar to LTD film 116 described previously with respect to FIGS. 1A through 4. For example, LTD film 516 may be deposited by a PEALD process without using $O_2$ as a precursor material in order to reduce possible damage to underlayer 514. By forming LTD film 516 using one or more precursors that reduce oxygen plasma during deposition as described herein, damage to the underlayer 514 can be reduced during formation of LTD film 516. For example, the formation of LTD film 516 over underlayer 514 may reduce the thickness of underlayer 514 from a thickness T3 to a smaller thickness T4, shown representatively in FIG. 5C as thickness change DT3. By depositing LTD film 516 using the techniques described herein, the thickness change DT3 may be less than using other techniques in which more oxygen plasma is present during deposition. In some cases, deposition of LTD film 516 may also consume portions of the underlayer 514 sidewalls of openings 522. For example, as shown in FIG. 5C, the initial width W1 of openings 522 may increase to W2 after deposition of LTD film 516. In some embodiments, the increase in width from W1 to W2 during formation of LTD film 516 may be less than about 5 nm, such as about 3 nm. In some cases, the change in width after depositing an LTD film as described herein may be as much as about 5 nm less than the change in width after depositing a dielectric film using an $O_2$ precursor.

In some embodiments, the device 500 shown in FIGS. 5A-5C may be processed further. For example, LTD film 516 may be subsequently planarized using a CMP process. The remaining portions of underlayer 514 may then be removed, leaving portions of LTD film 516 remaining on the bottom layer 512. The remaining portions of LTD film 516 may then be used as an etch mask for the patterning of the bottom layer 512. A conductive material may be deposited over the patterned bottom layer 512 to form conductive lines, contacts, vias, or the like. This is an example process, and other processes using an LTD film as a gap-fill material are within the scope of this disclosure.

Figure 6A:
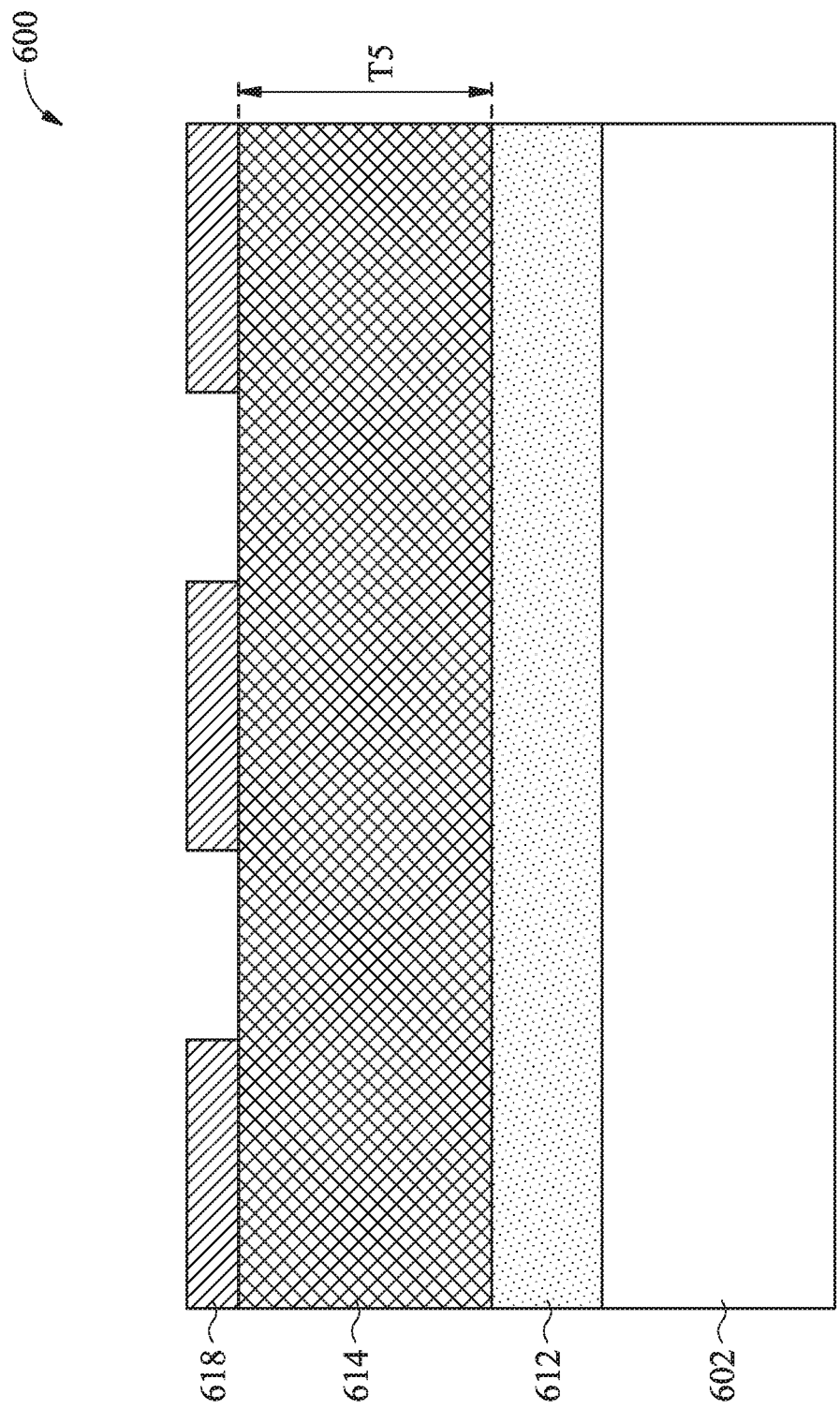
FIGS. 6A-6J illustrate cross-sectional views or plan views of various intermediary stages of manufacturing conductive lines in a semiconductor device using a low-temperature dielectric film in accordance with some embodiments.

An LTD film as described herein may also be used for reducing feature sizes in a BEOL process of a semiconductor device. In accordance with another exemplary embodiment, FIGS. 6A-6J illustrate cross-sectional views of intermediate stages of forming conductive lines in a semiconductor device 600. In particular, FIGS. 6A-6J illustrate an embodiment in which a LTD film 616 is used as a conformal material to decrease patterned feature size during processing of semiconductor device 600. In FIG. 6A, ILD layer 612 is formed over a substrate 602. In some embodiments, substrate 602 may be similar to substrate 102 or substrate 502 and ILD layer 612 may be similar to ILD layer 112 or bottom layer 512, described above with respect to FIGS. 1A-1H and FIGS. 5A-5C. In some cases, substrate 602 may be a partially processed semiconductor device. The embodiment shown in FIGS. 6A through 6J may, for example, be part of a BEOL process or part of another process.

FIG. 6A also illustrates an underlayer 614 formed over ILD layer 612. In some embodiments, underlayer 614 is a photoresist material, and underlayer 614 may be similar to underlayer 114 or underlayer 514 described previously with respect to FIGS. 1A-1H and FIG. 5A-5C. In some embodiments, underlayer 614 is formed to have an as-deposited thickness T5 between about 5 nm and about 1000 nm. Underlayer 614 may be formed by a spin-on process or another suitable process.

Figure 6B:
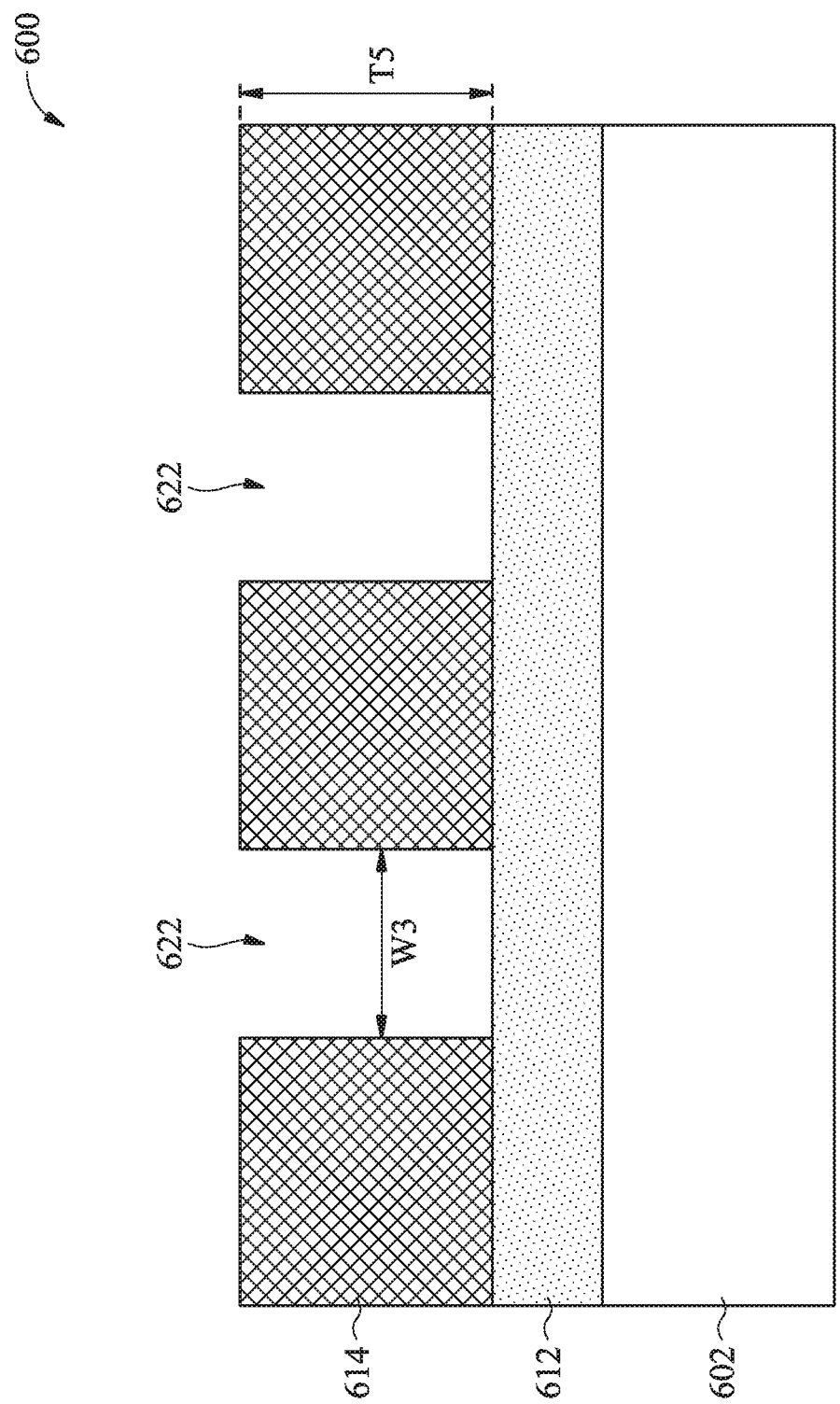

FIG. 6A also illustrates an upper layer 618 formed over underlayer 614. As shown in FIG. 6A, upper layer 618 has been patterned using a photolithographic process to form openings within upper layer 618. In some embodiments, upper layer 618 is an oxygen-containing dielectric material similar to LTD film 116, but upper layer 618 may be another dielectric material in other embodiments. As shown in FIG. 6B, patterned upper layer 618 is used as an etching mask for patterning of underlayer 614. The pattern of upper layer 618 may be transferred to underlayer 614 via an etching process, forming first openings 622 within underlayer 614. In some cases, the etching process is anisotropic, so that openings in upper layer 618 are extended through underlayer 614 as openings 622 and have about the same sizes in underlayer 614 as they do in upper layer 618. In some cases, as part of etching underlayer 614, some of or all of upper layer 618 may be consumed, as shown in FIG. 6B. FIG. 6B also illustrates that openings 622 patterned into underlayer 614 may have an initial width W3. In some embodiments, openings 622 may be considered recesses in underlayer 614.

Figure 6D:
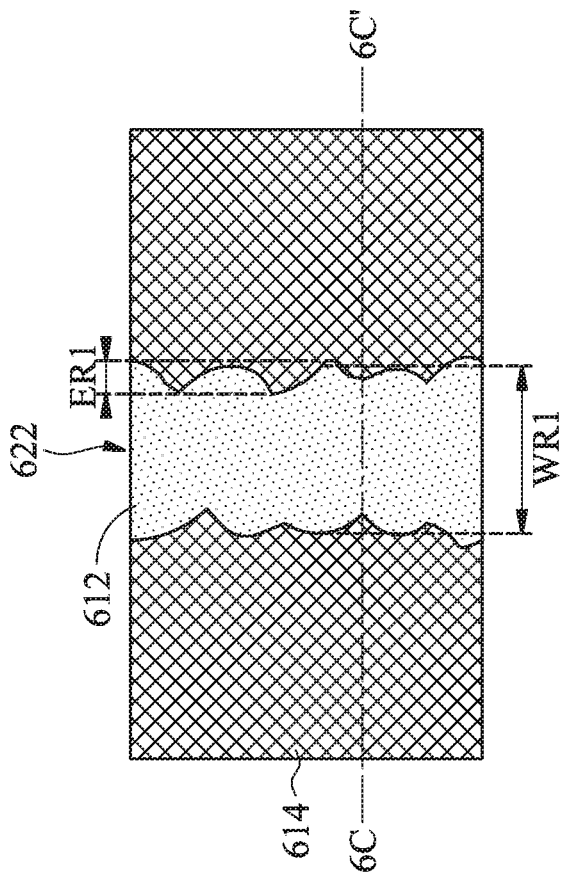
Figure 6C:
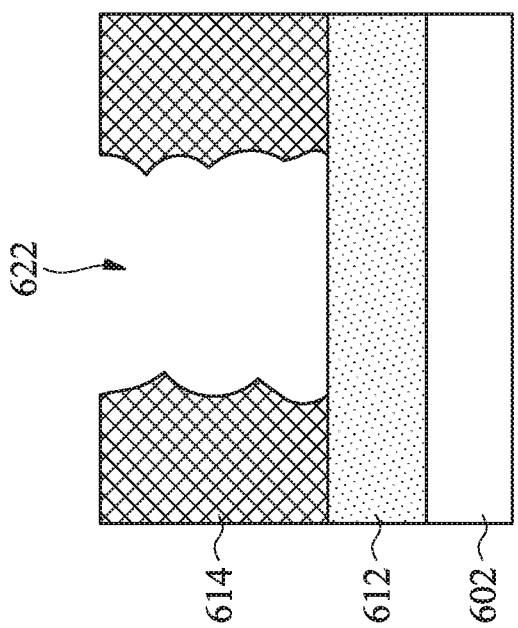

In some cases, the sidewalls of openings 622 may have rough surfaces after patterning. As an illustrated example, FIG. 6C shows a cross-sectional view of an example opening 622, similar to openings 622 shown in FIG. 6B. FIG. 6D shows the opening 622 of FIG. 6C in a plan view, and the cross-sectional view of FIG. 6C is along line 6C-6C' shown in the plan view of FIG. 6D. As shown in FIG. 6D, the opening 622 sidewalls also exhibit roughness in a plan view. In some cases, the roughness may be characterized from one or more measurements of the deviation of the opening 622 sidewall edge from a fixed position, shown as Edge Roughness ER1 in FIG. 6D. In some cases, the roughness may be characterized from one or more measurements of the distance across the opening 622, shown as Width Roughness WR1 in FIG. 6D. In some cases, the use of LTD film 616 may allow for improved width roughness or improved edge roughness of openings, patterned layers, or subsequently formed features. An example is described below in FIGS. 6F-6J.

Figure 6E:
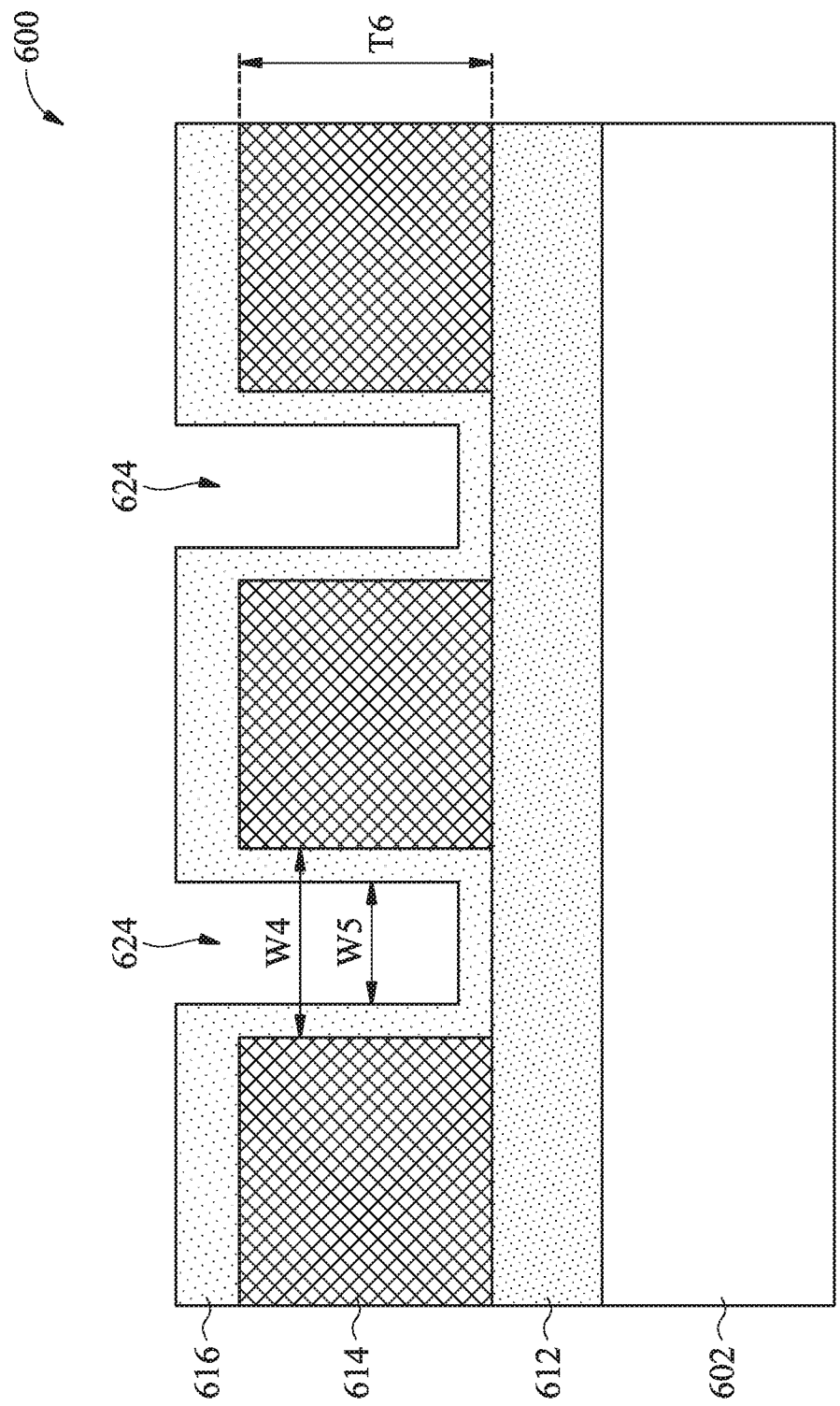

Turning to FIG. 6E, an LTD film 616 is deposited over the underlayer 614 and into first openings 622. In some embodiments, LTD film 616 is also deposited over remaining portions of upper layer 618 (when present). As shown in FIG. 6C, LTD film 616 may be deposited conformally to form on sidewalls and a bottom surface of openings 622. In some embodiments, LTD film 616 may have a thickness between about 0.1 nm and about 100 nm. In some embodiments, LTD film 516 may be similar to LTD film 116 or LTD film 516 described previously with respect to FIGS. 1A-4 and FIGS. 5A-5C. For example, LTD film 616 may be deposited by a PEALD process without using $O_2$ as a precursor material in order to reduce possible damage to underlayer 614.

Depositing LTD film 616 conformally within first openings 622 forms second openings 624. Due to the LTD film 616, second openings 624 have a width W5 that is smaller than the initial width W3 of first openings 622. The use of LTD 616 in this manner may allow for smaller feature sizes to be patterned into target layer 612, described below in greater detail with respect to FIG. 6D.

Additionally, by forming LTD film 616 using one or more precursors that reduce oxygen plasma during deposition as described herein, damage to the underlayer 614 can be reduced during formation of LTD film 616. For example, the formation of LTD film 616 over underlayer 614 may reduce the thickness of underlayer 614 from a thickness T5 to a smaller thickness T6, similar to underlayer 514 as described above with respect to FIGS. 5A-5C. In some cases, deposition of LTD film 616 may also consume portions of the underlayer 614 sidewalls of openings 622. For example, as shown in FIG. 6C, the initial width W3 of openings 622 may increase to W4 after deposition of LTD film 616. In some embodiments, during formation of a LTD film 616 that is about 3 nm thick, the increase in width from W3 to W4 may be less than about 50 nm, such as about 3 nm. In some embodiments, the thickness of an LTD film 616 deposited on a surface of the underlayer 614 may be less than, greater than, or about the same as the thickness of underlayer 614 at that surface that is consumed during the deposition of the LTD film 616. By reducing the possible damage to the sidewalls of openings 622, openings 624 may be formed having smaller widths W5, which can reduce subsequently patterned feature sizes and allow for improved process control.

Figure 6G:
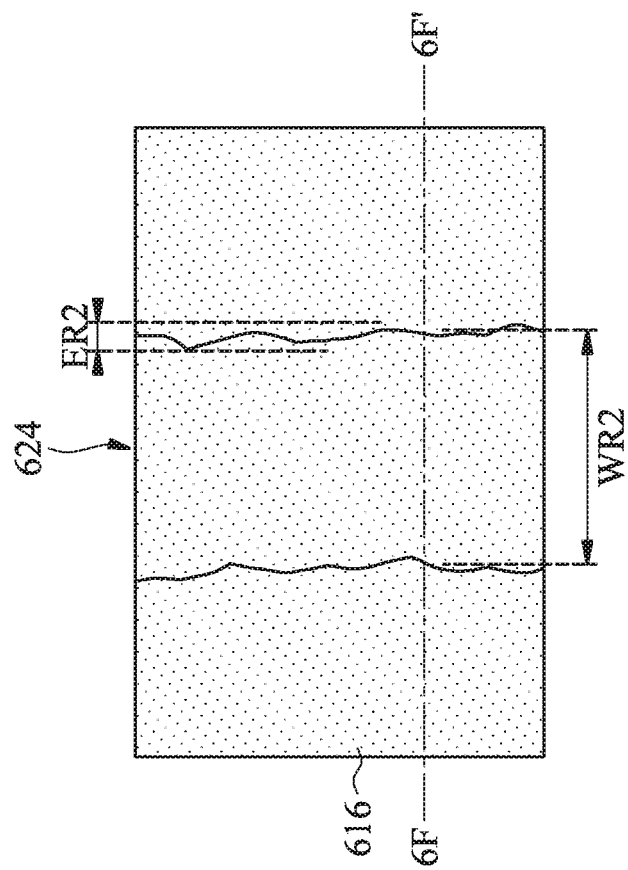
Figure 6F:
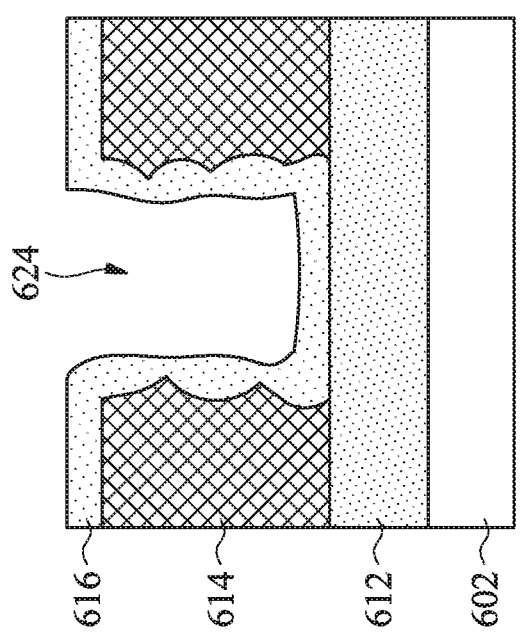

In some cases, forming LTD film 616 over the underlayer 614 and within openings 622 may improve sidewall roughness. As an illustrated example, FIGS. 6F-6G show a cross-sectional view and a plan view of the example opening 622 shown in FIGS. 6C-6D after forming an LTD film 616 within the opening 622, forming opening 624. The opening 624 shown in FIGS. 6F-6G is similar to openings 624 shown in FIG. 6E. The cross-sectional view of FIG. 6F is along line 6F-6F' shown in the plan view of FIG. 6G. The LTD film 616 may fill small recesses in the rough sidewalls of the underlayer 614 and may have a smoother surface as deposited than the rough sidewalls of the underlayer 614. Thus, as shown in FIG. 6F, the LTD film 616 of the sidewalls of openings 624 may be less rough than the sidewalls of the underlayer 614. In some cases, an Edge Roughness ER2 of a sidewall of an opening 624 may be less than an Edge Roughness ER1 of a sidewall of an opening 622. In some cases, a Width Roughness WR2 of a sidewall of an opening 624 may be less than a Width Roughness WR1 of a sidewall of an opening 622. The use of an LTD film to reduce sidewall roughness in this manner may allow subsequently formed features to have less roughness or more uniformity.

Figure 6H:
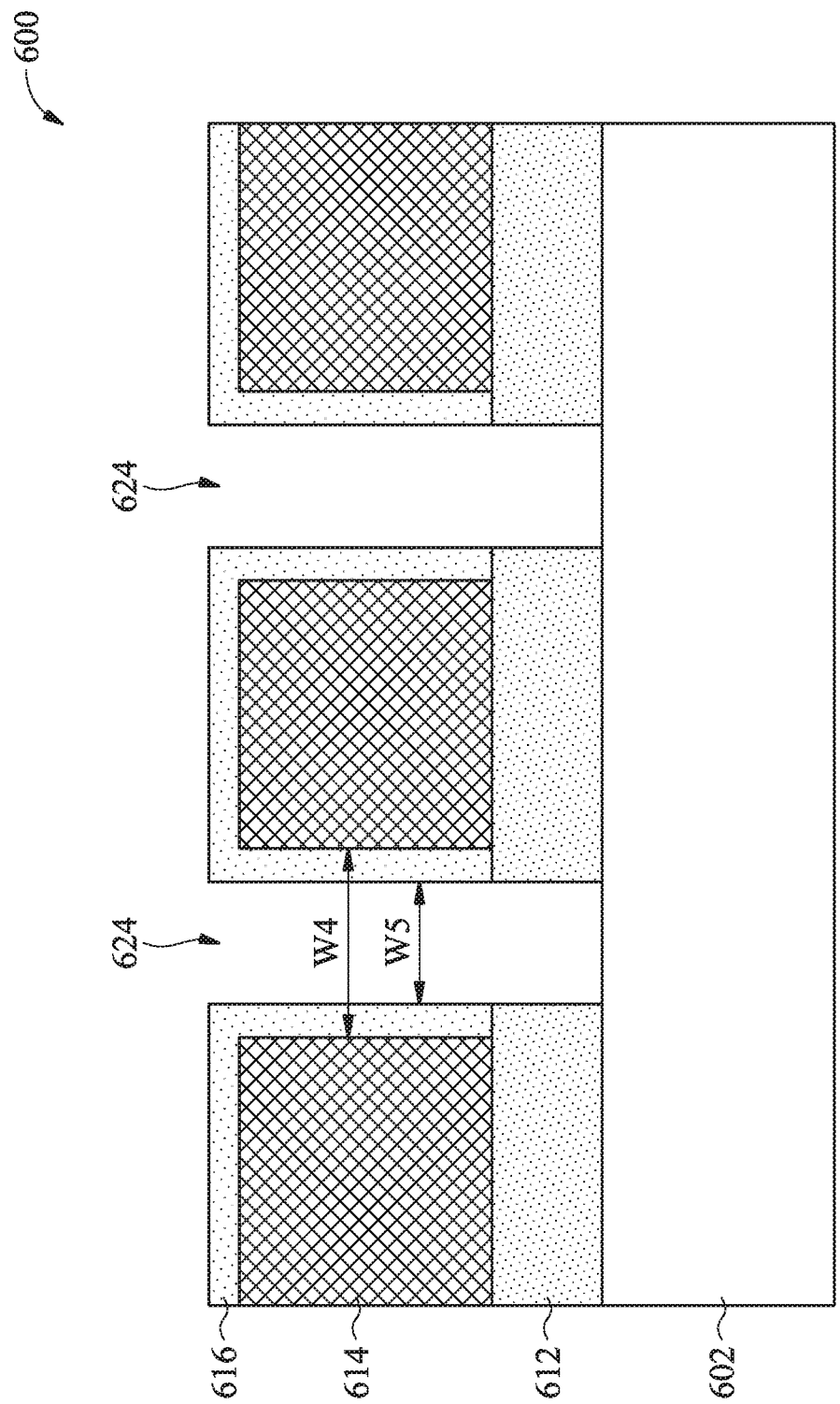

Turning to FIG. 6H, openings 624 may be transferred to target layer 612 via an etching process. In some cases, the etching process is anisotropic, so that the openings 624 are extended through target layer 612 and have about the same sizes in target layer 612 as they do in openings 624. The etching process may also etch top surfaces of LTD film 616 over underlayer 614, as shown in FIG. 6H. In some cases, the use of an LTD film deposition process as described herein can allow for smaller feature sizes when used to decrease the size of openings formed in a previous patterning step. A planarization process (e.g., a chemical mechanical polish (CMP), dry etching, combinations thereof, or the like) may optionally be performed to remove portions of LTD film 616 covering underlayer 614. In some cases, upper portions of underlayer 614 may also be removed by the planarization process.

Figure 6I:
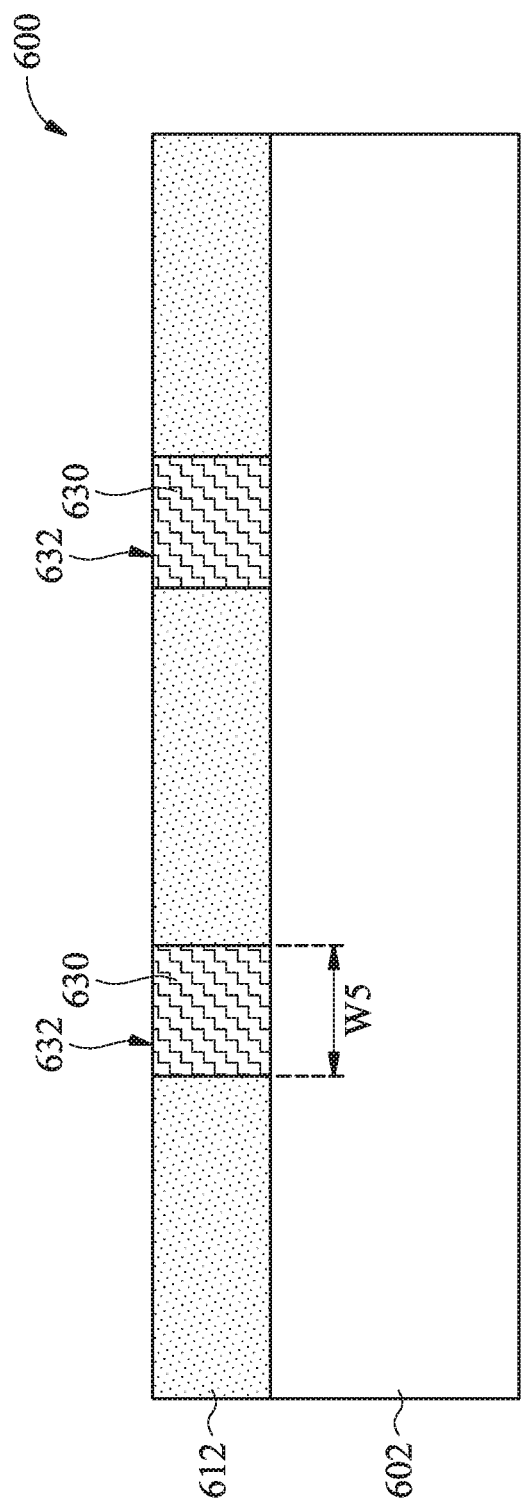
Figure 6J:
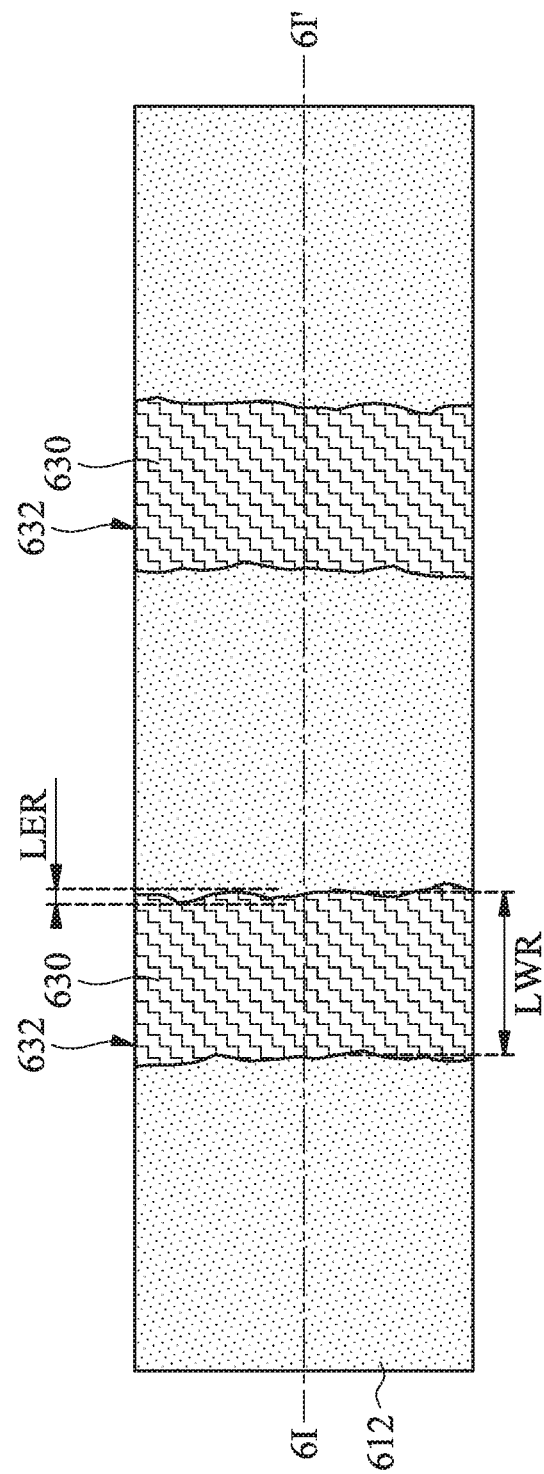

In some embodiments, further processing may be performed. For example, in some embodiments, the openings 624 in target layer 612 may subsequently be filled with a conductive material to form vias, conductive lines, or other conductive features. As shown in FIGS. 6I-6J, the openings 624 in target layer 612 are filled with a conductive material 630 to form conductive lines 632. The cross-sectional view of FIG. 6I is along line 6I-6I' shown in the plan view of FIG. 6J. After the conductive material 630 is formed, the LTD film 616, underlayer 614, and excess portions of conductive material 630 may be removed by a planarization process such as CMP or by an etching process. In some embodiments, the LTD film 616 is removed before forming the conductive material 630. In this manner, the LTD film 616 may be used to form features having smaller dimensions, such as conductive lines 632. The embodiment shown in FIGS. 6A-6J is for illustrative purposes, and other embodiments may include additional layers, features, or process steps.

Using LTD film 616 to improve the roughness of openings 622 may then also reduce roughness of features patterned from the openings 622. For example, using LTD film 616 to reduce sidewall roughness of openings 622 may reduce a Line Edge Roughness LER or a Line Width Roughness LWR of conductive lines 632, shown in FIG. 6J. In this manner, the use of an LTD film to reduce the roughness of patterned features may allow subsequently formed features to have less roughness or more uniformity.

Figure 7A:
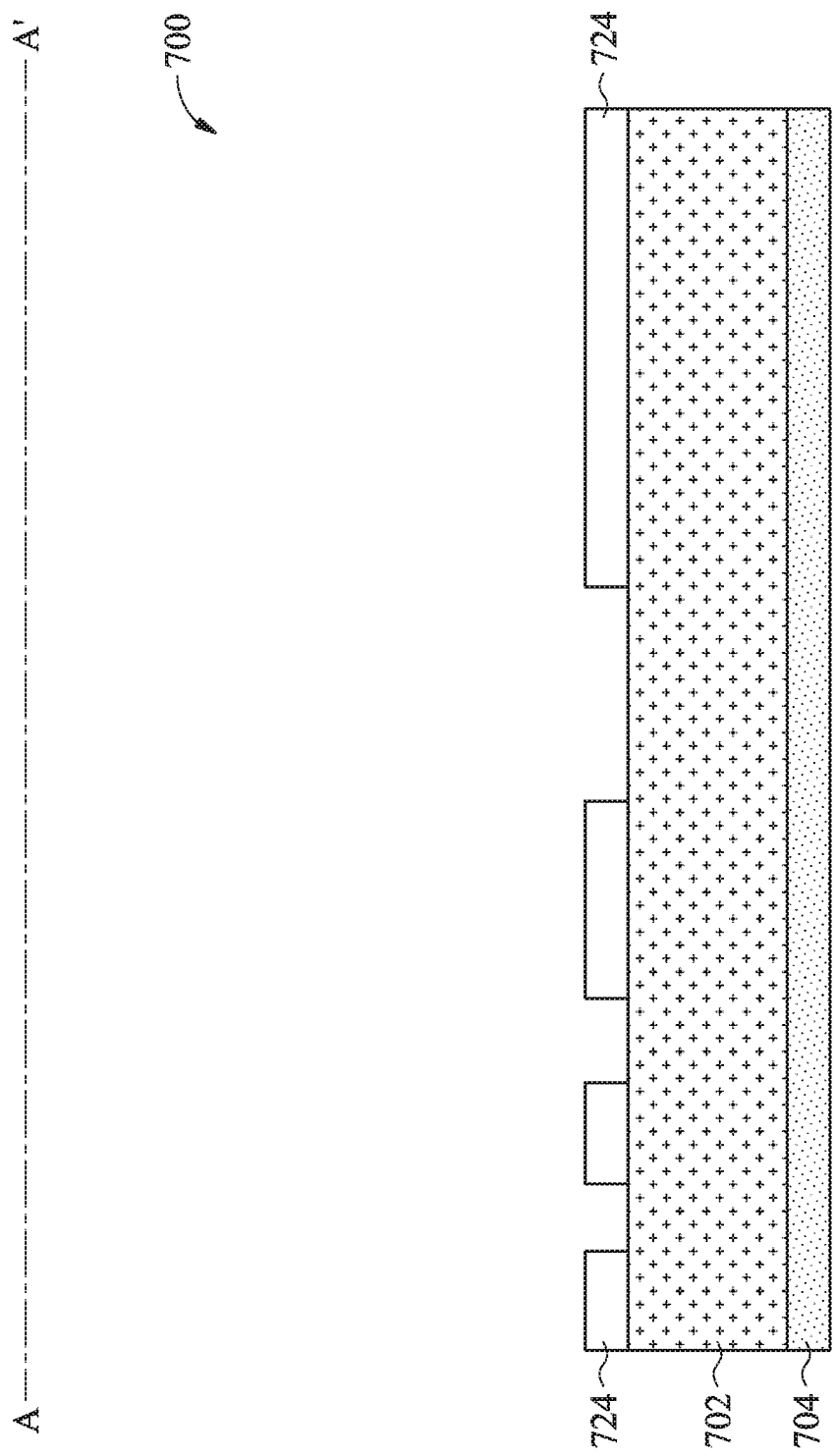
FIGS. 7A-15B illustrate cross-sectional views, plan views, or perspective views of various intermediary stages of manufacturing conductive lines in a semiconductor device using a low-temperature dielectric film in accordance with some embodiments.
Figure 7B:
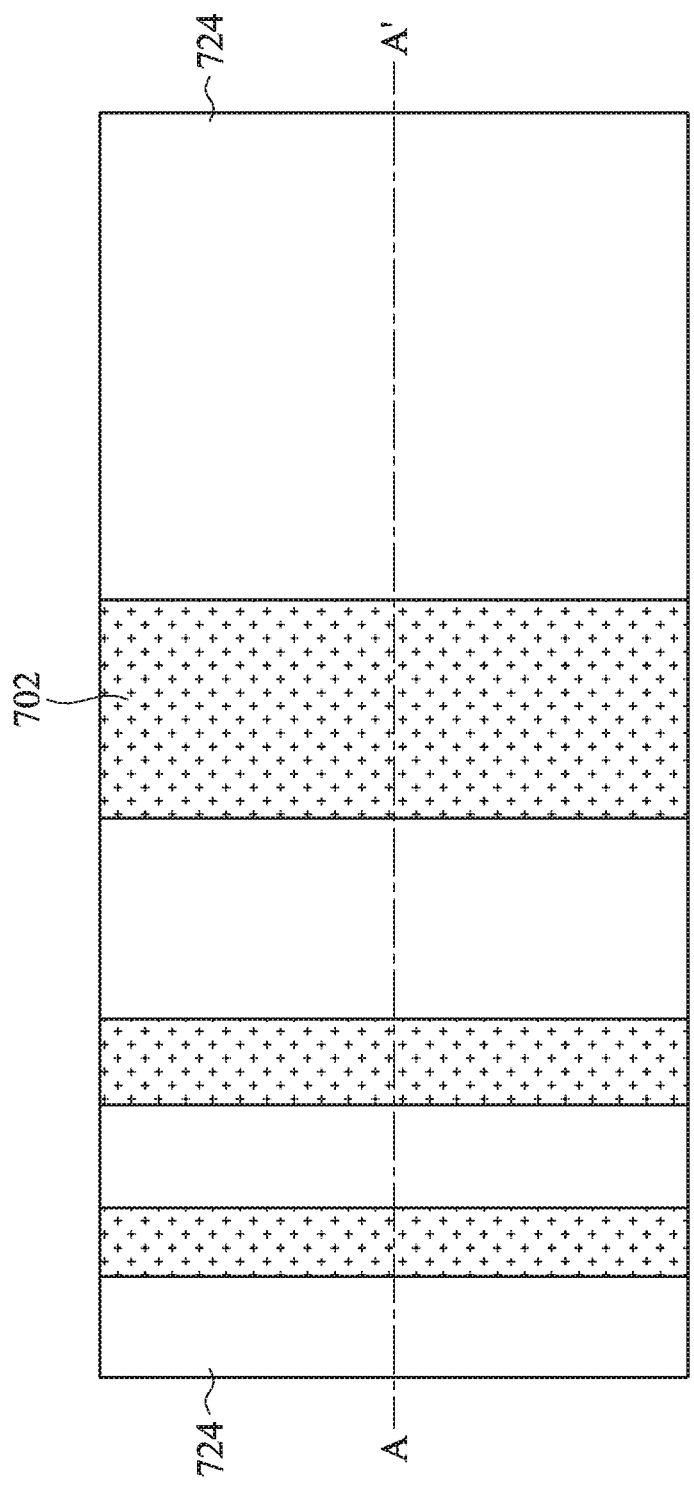

An LTD film as described herein may be used may also be used as a gap-fill material deposited within gaps or openings in a BEOL process of a semiconductor device. In accordance with an exemplary embodiment, FIGS. 7A through 15B illustrate cross-sectional views and/or plan views of intermediate stages in the formation of conductive features in an ILD layer 702 of a semiconductor device 700. The process shown in FIGS. 7A through 15B illustrate an embodiment in which an LTD film 736 may be used as a gap-fill material, and LTD film 736 may be used as a gap-fill material similar to LTD film 516 described above with respect to FIGS. 5A-5C. The semiconductor device 700 is shown in FIG. 7A (in cross-sectional view) and FIG. 7B (in plan view). The cross-sectional view of FIG. 7A is along line A-A' shown in the plan view of FIG. 7B. In FIGS. 7A-7B, ILD layer 702 is formed over a substrate 704. In some embodiments, substrate 704 may be similar to other substrates described above, or ILD layer 702 may be similar to other layers described above, such as ILD layer 112 as described with respect to FIG. 1A, or may be another type of layer. The embodiment shown in FIGS. 7A through 15B may, for example, be part of a BEOL process or part of another process.

Figure 8:
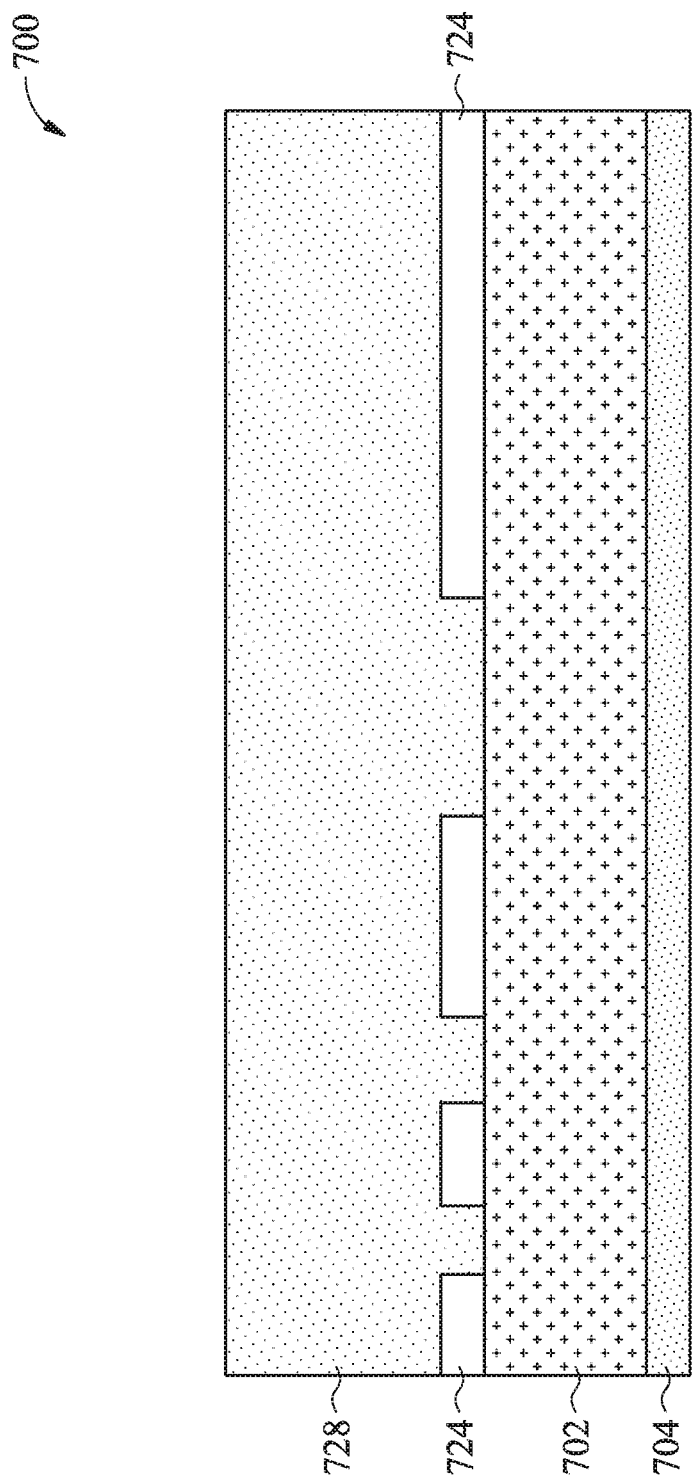

FIGS. 7A-7B illustrate mask regions 724 formed over ILD layer 702. The mask regions 724 may be formed, for example, by patterning a blanket dielectric layer using a photolithographic process. In a plan view, gaps between mask regions 724 define regions in which conductive features may be formed in ILD layer 702. In FIG. 8, masking layer 728 is formed over mask regions 724 and ILD layer 702. In some embodiments, masking layer 728 is a photoresist or polymer material, and may be similar to underlayer 114, underlayer 514, or underlayer 614 described previously with respect to FIGS. 1A-1G, FIGS. 5A-5C, or FIGS. 6A-6J. In some embodiments, masking layer 728 includes multiple layers and multiple materials.

Figure 9A:
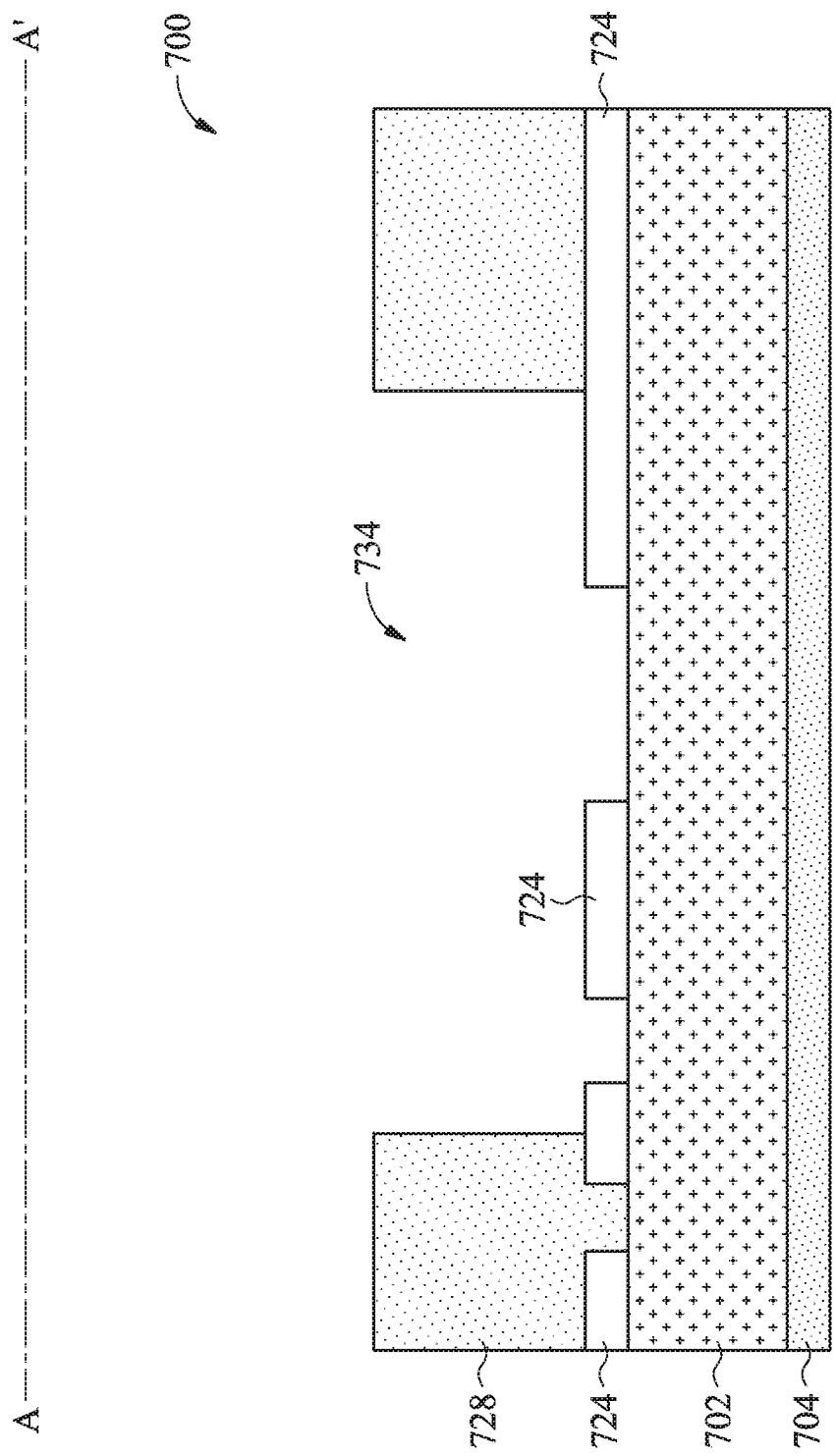
Figure 9B:
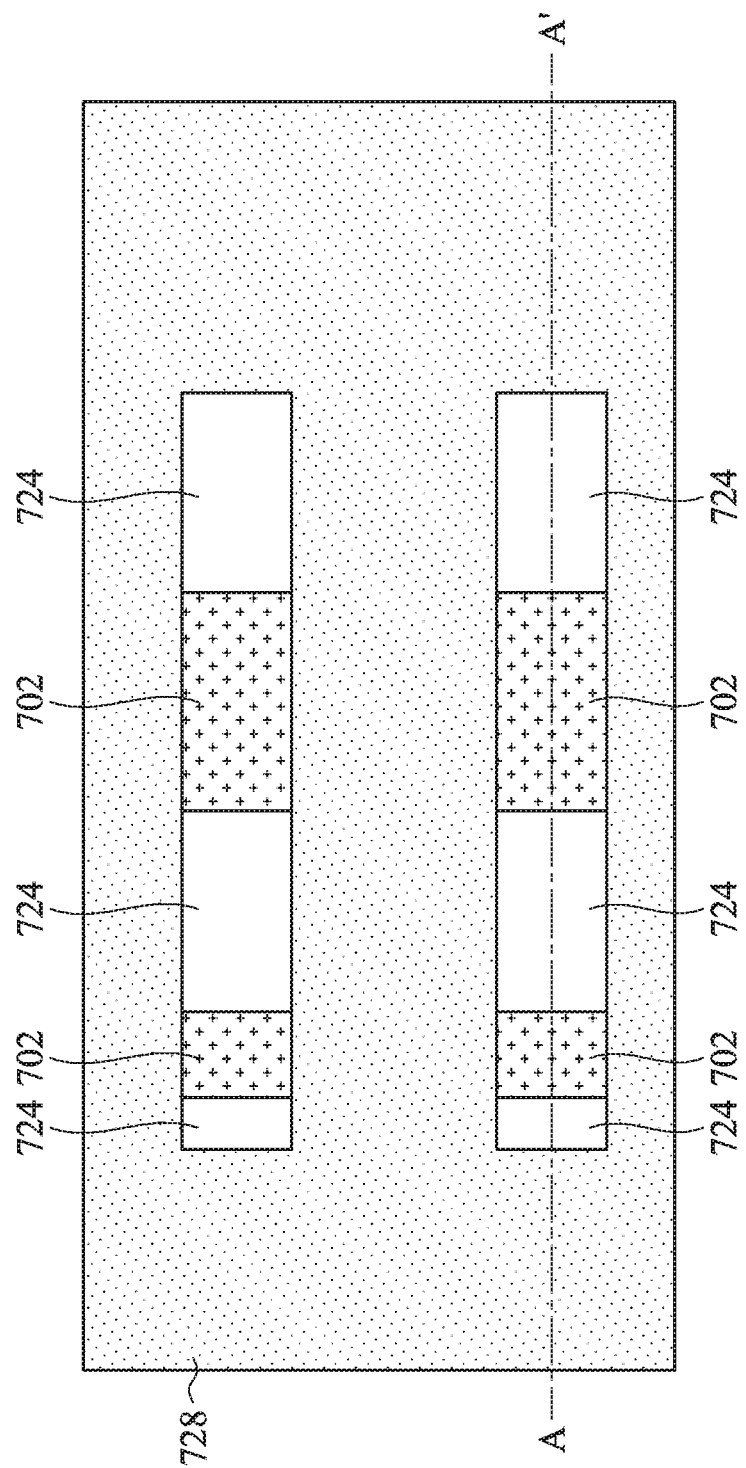
Figure 9C:
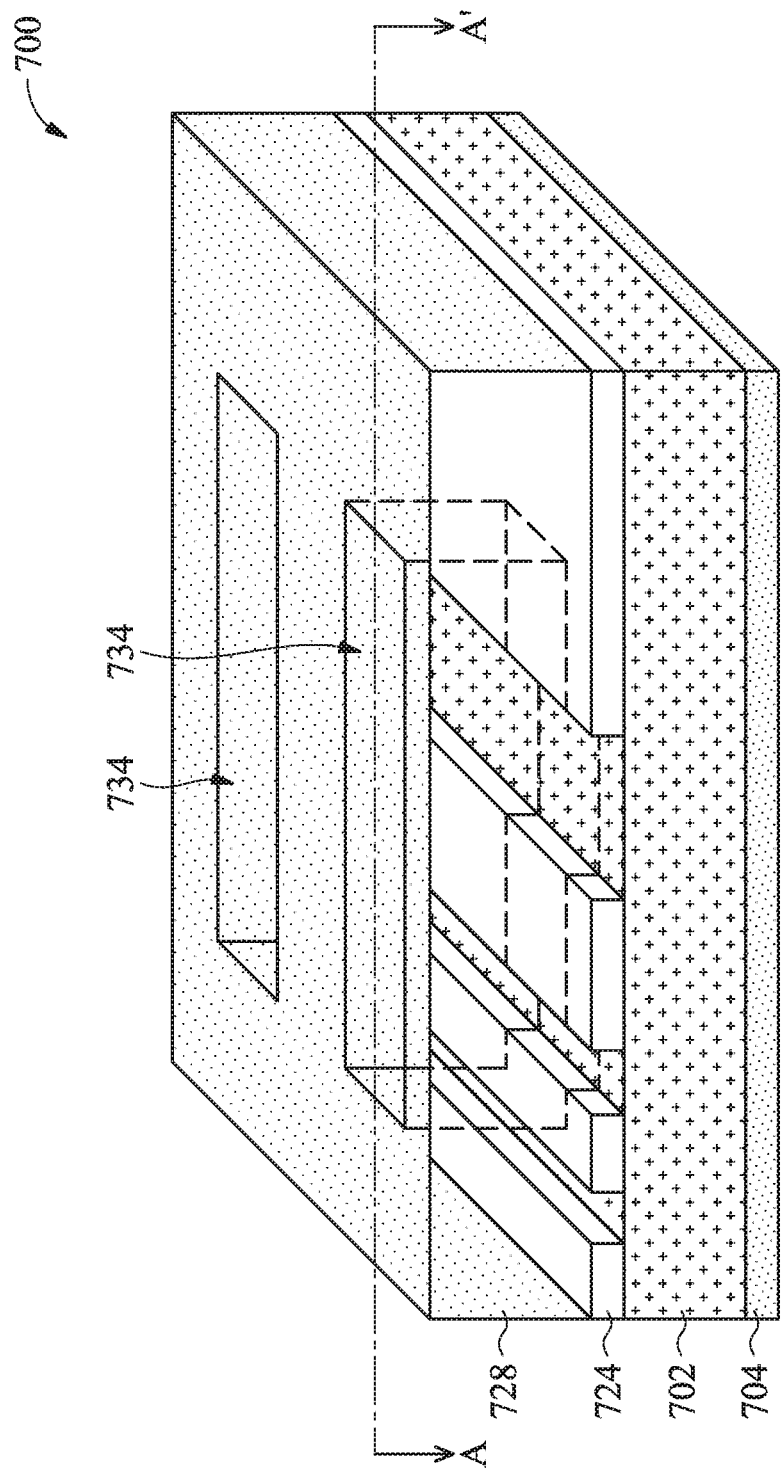

In FIGS. 9A-9C, masking layer 728 is patterned using a photolithographic process to form openings 734. The cross-sectional view of FIG. 9A is along line A-A' shown in the plan view of FIG. 9B, which is also shown in the perspective view of FIG. 9C. In the perspective view of FIG. 9C, portions of masking layer 728 have been shown as transparent so that an opening 734 may be more clearly displayed.

Figure 10A:
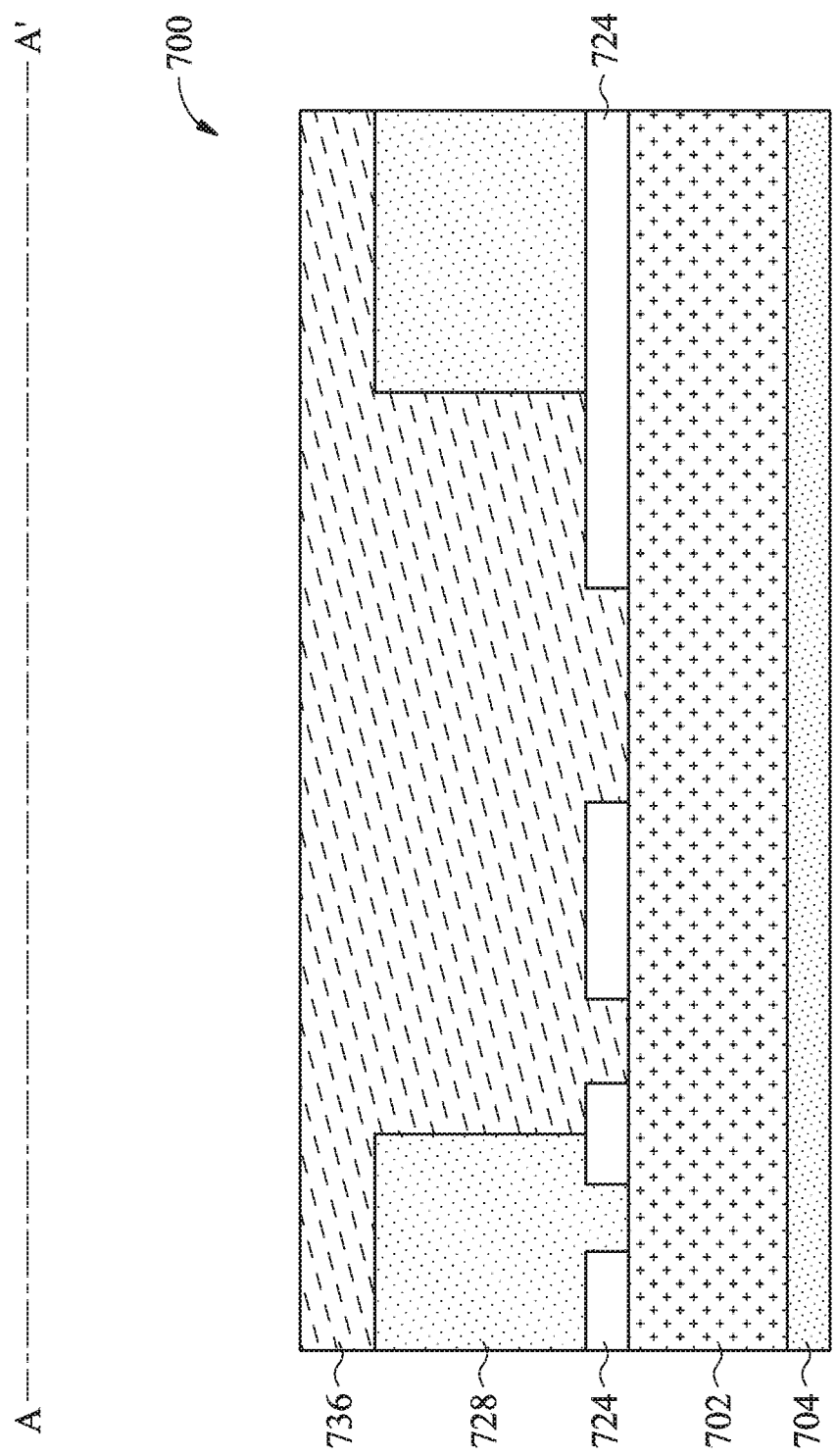
Figure 10B:
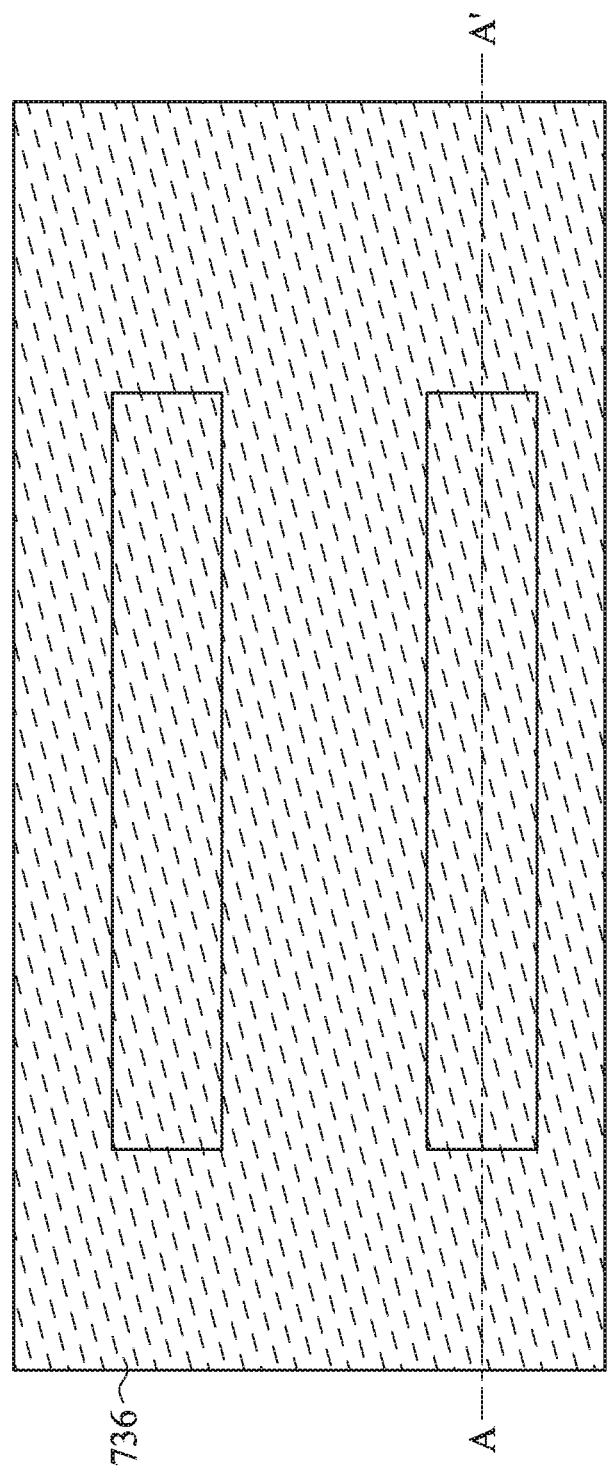
Figure 10C:
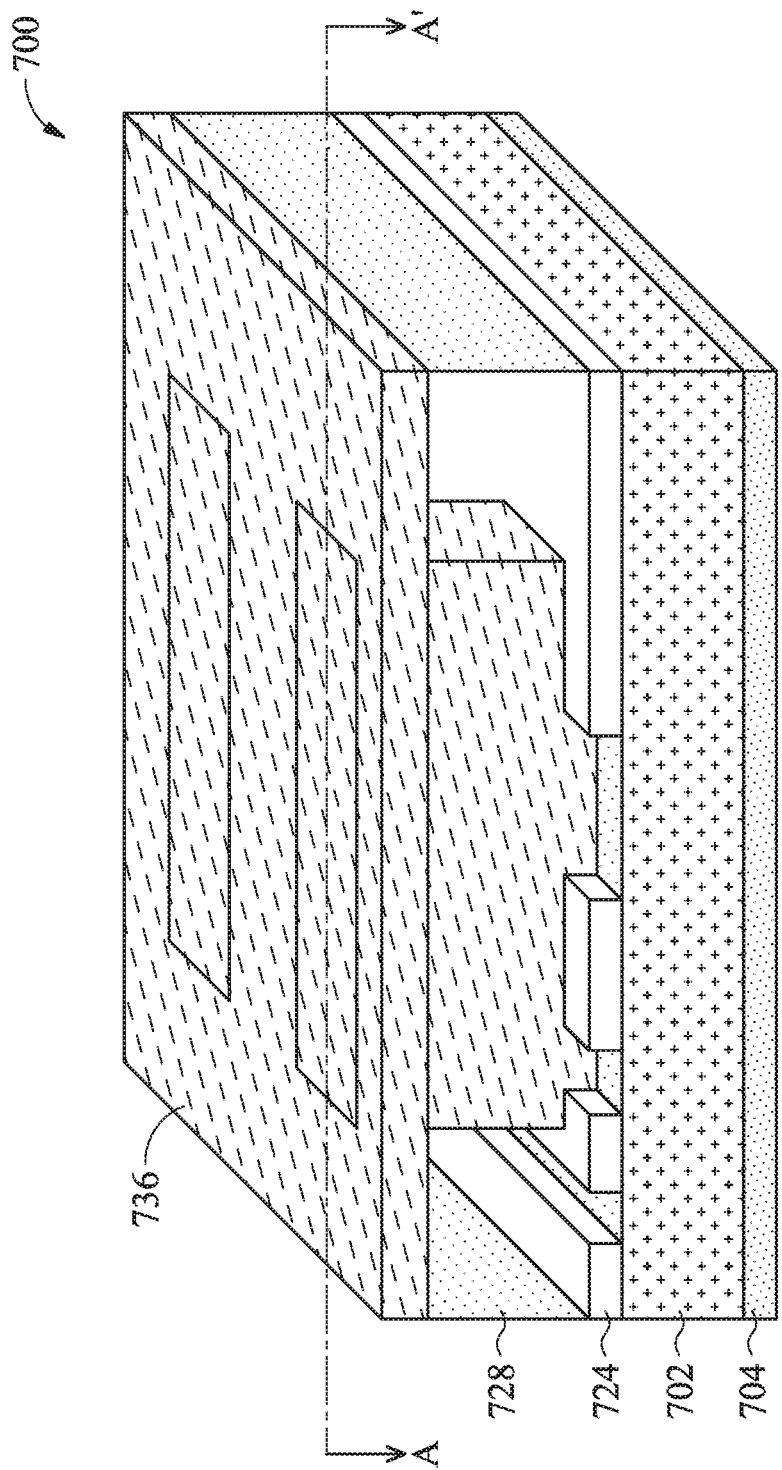

In FIGS. 10A-10C, LTD material 736 is formed in openings 734 and over masking layer 728. The cross-sectional view of FIG. 10A is along line A-A' shown in the plan view of FIG. 10B, which is also shown in the perspective view of FIG. 10C. In the perspective view of FIG. 10C, portions of masking layer 728 have been shown as transparent so that the LTD material 736 formed within an opening 734 may be more clearly displayed. In some embodiments, LTD material 736 may be used as a gap-fill material or as a sacrificial material. In some embodiments, LTD material 736 may be similar to LTD film 116, LTD film 516, or LTD film 616 described previously with respect to FIGS. 1A-4, FIGS. 5A-5C, and FIGS. 6A-6J. For example, LTD material 736 may be deposited by a PEALD process without using $O_2$ as a precursor material in order to reduce possible damage to masking layer 728. In some embodiments, LTD material 736 may be deposited conformally to fill opening 734.

As will be described in greater detail below, in subsequent processing the LTD material 736 will be further patterned, and the patterned LTD material 736 may be used to define a line cut between two adjacent conductive lines that will be formed in the ILD layer 702. Although FIG. 10 depicts the forming of LTD material 736 in a single opening 734, in some embodiments only one or more than two openings 734 may be present and LTD material 736 may be formed in the one or more than two openings 734 (for example, to form less line cuts or additional line cuts).

Figure 11:
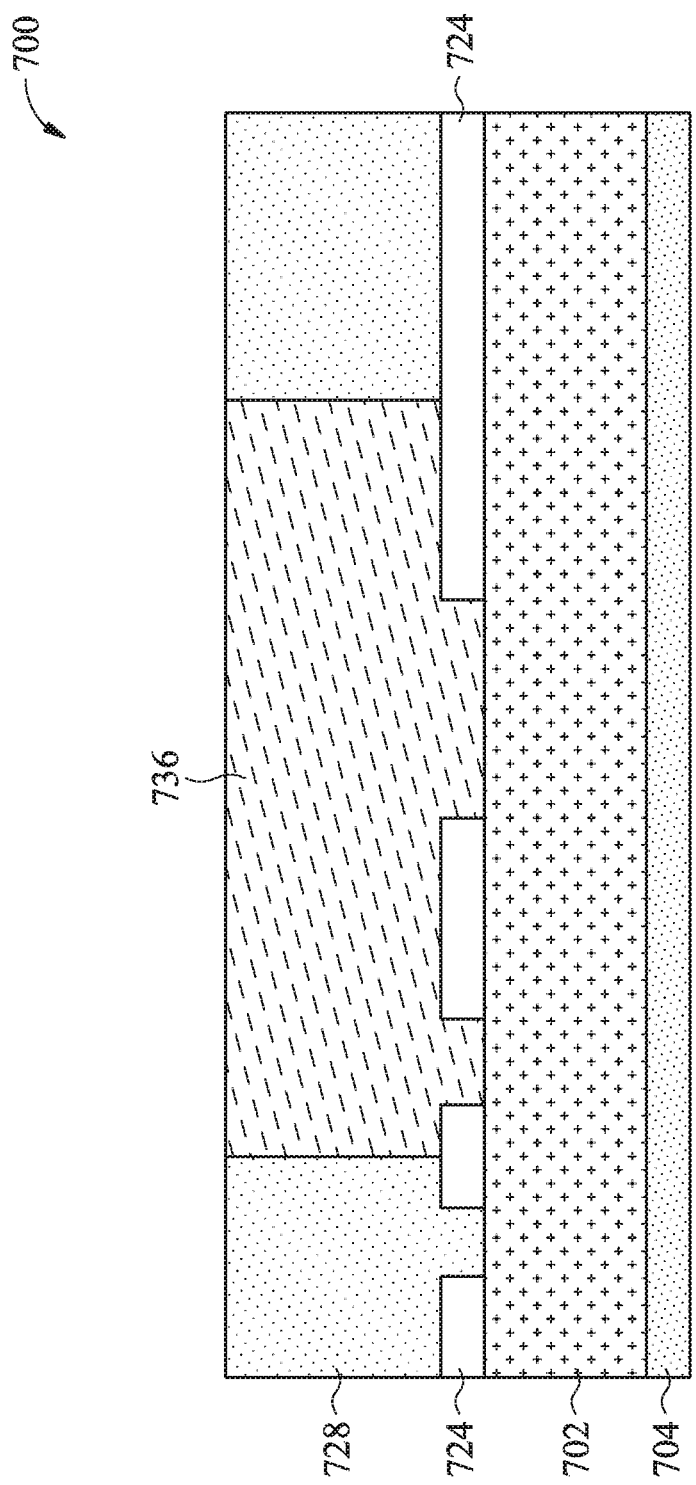
Figure 12A:
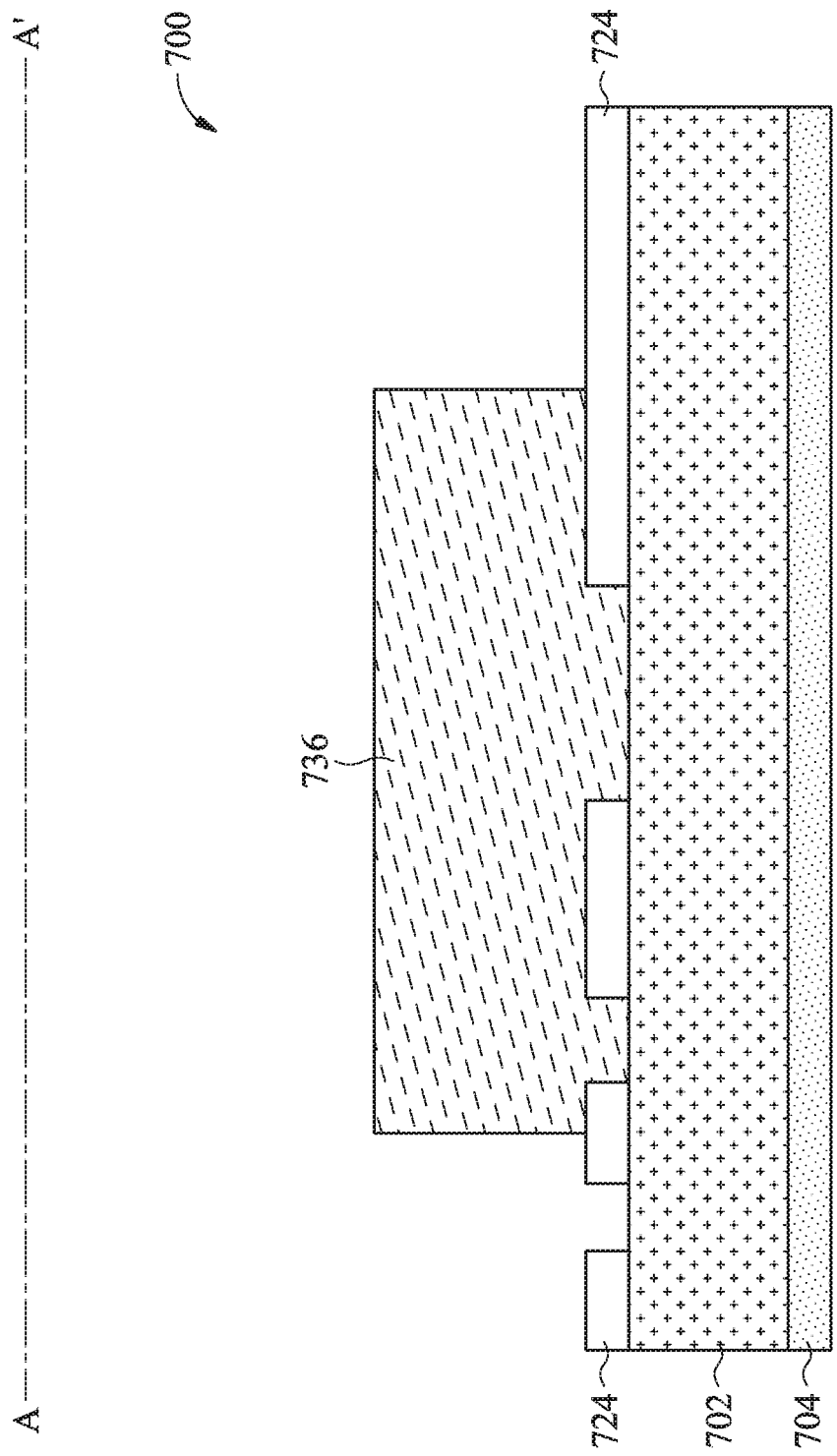
Figure 12B:
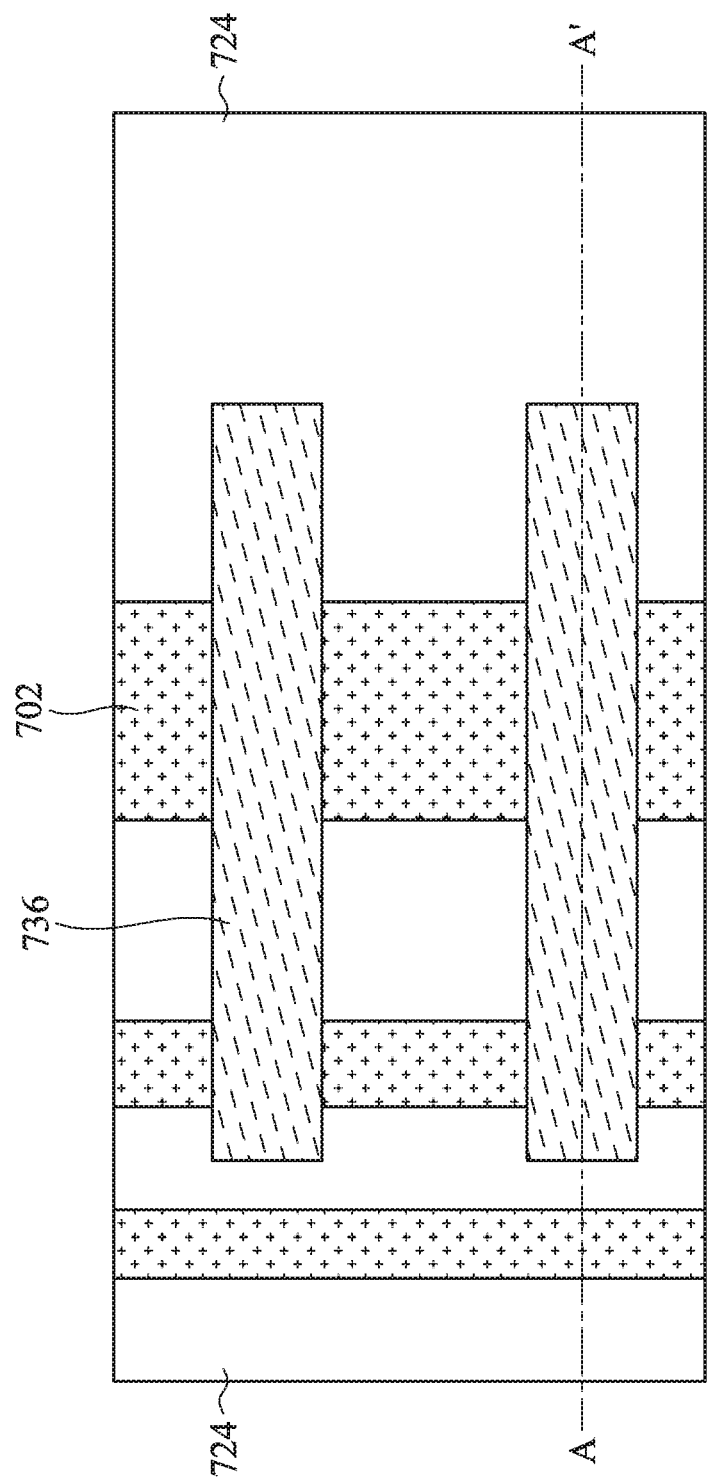

Next, in FIG. 11, a planarization process (e.g., CMP, dry etching, combinations thereof, or the like) may be performed to remove excess portions of LTD material 736 outside of openings 734. Next, in FIGS. 12A-12B, remaining portions of masking layer 728 are removed. The cross-sectional view of FIG. 12A is along line A-A' shown in the plan view of FIG. 12B. In some embodiments, the masking layer 728 may be removed using an ashing process. After the masking layer 728 is removed, LTD material 736 remains and covers a portion of the mask regions 724 and ILD layer 702.

Figure 13A:
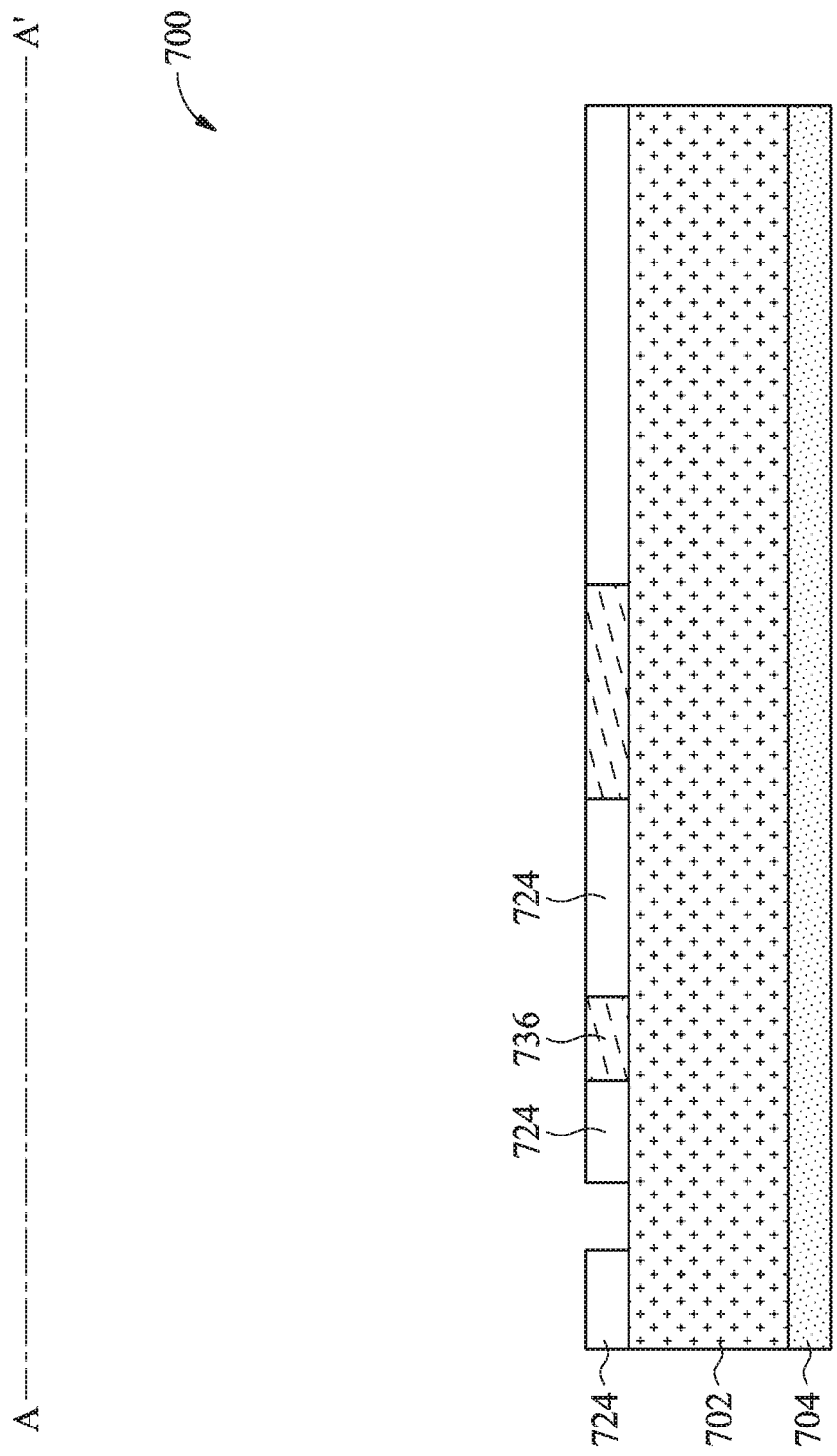
Figure 13B:
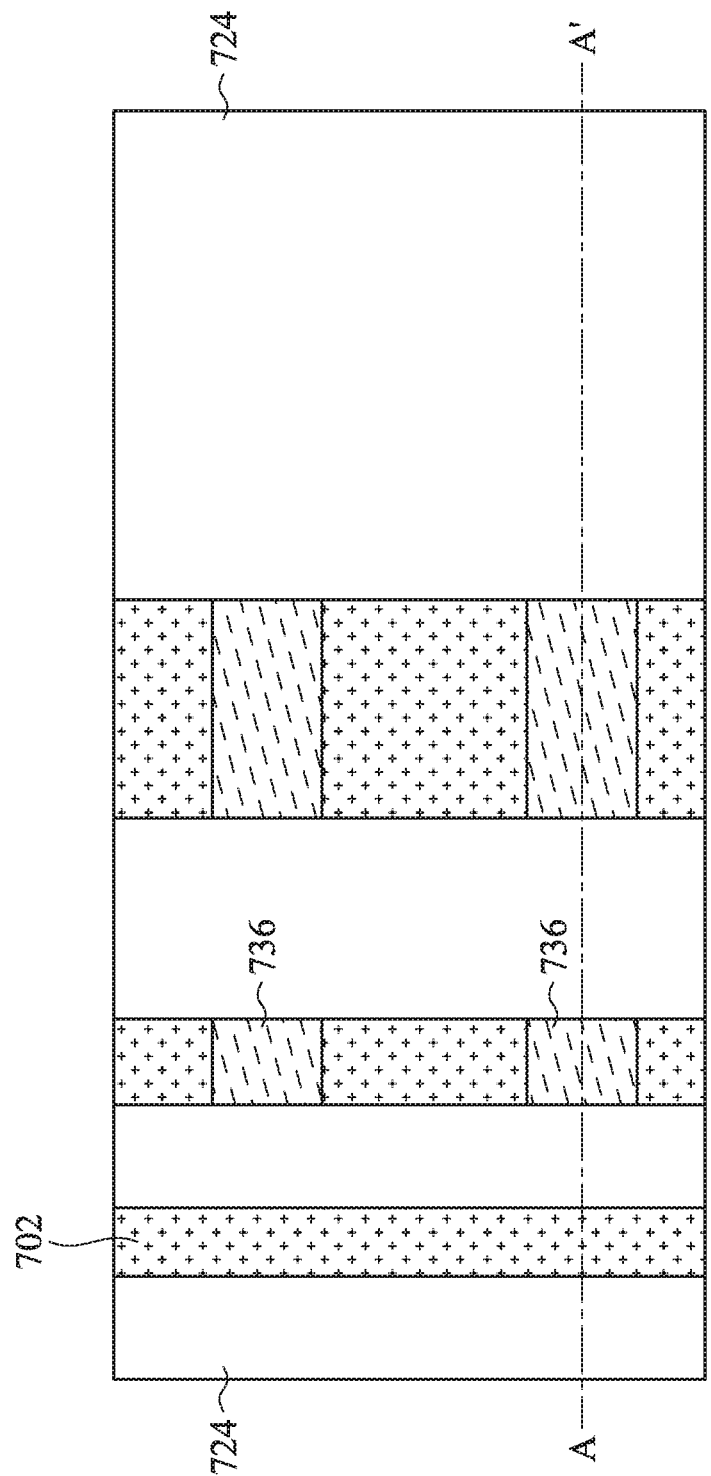
Figure 13C:
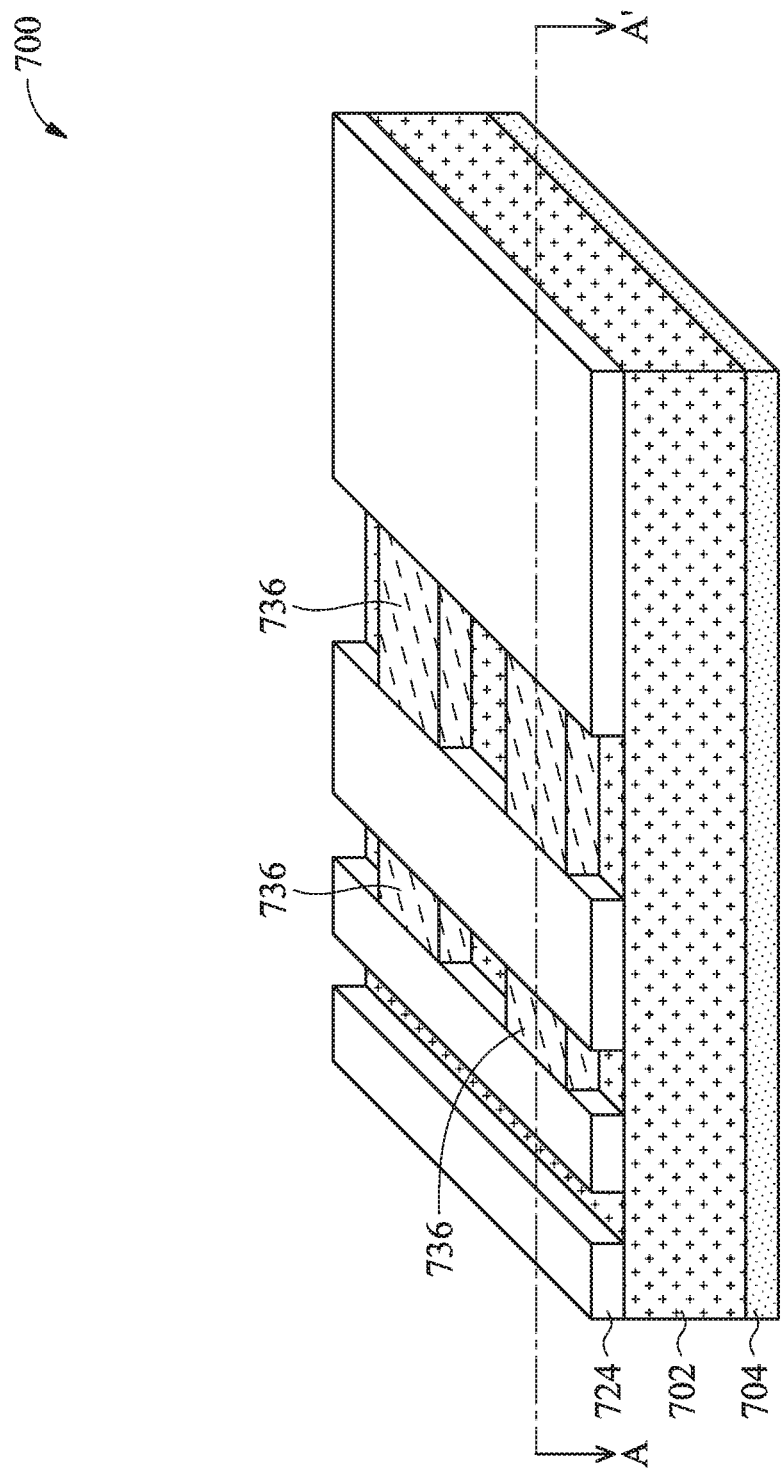

Next, referring to FIGS. 13A-13C, a planarization process is performed to remove excess portions of LTD material 736 and planarize a top surface of LTD material 736 to be level with top surfaces of the mask regions 724. The cross-sectional view of FIG. 13A is along line A-A' shown in the plan view of FIG. 13B, which is also shown in the perspective view of FIG. 13C. In some embodiments, the planarization process includes one or more etching processes. For example, a dry etching process or a wet etching process may be used. In other embodiments, a grinding process such as CMP may be used. The resulting structure is depicted in FIGS. 13A and 13B. As can be seen in FIGS. 13A-13B, the planarization of LTD material 736 has created discrete portions of the LTD material 736, where each discrete portion overlies a gap between two adjacent mask regions 724. In some embodiments, each discrete portion overlies a region in which a line cut between two adjacent portions of conductive line will be formed.

Figure 14A:
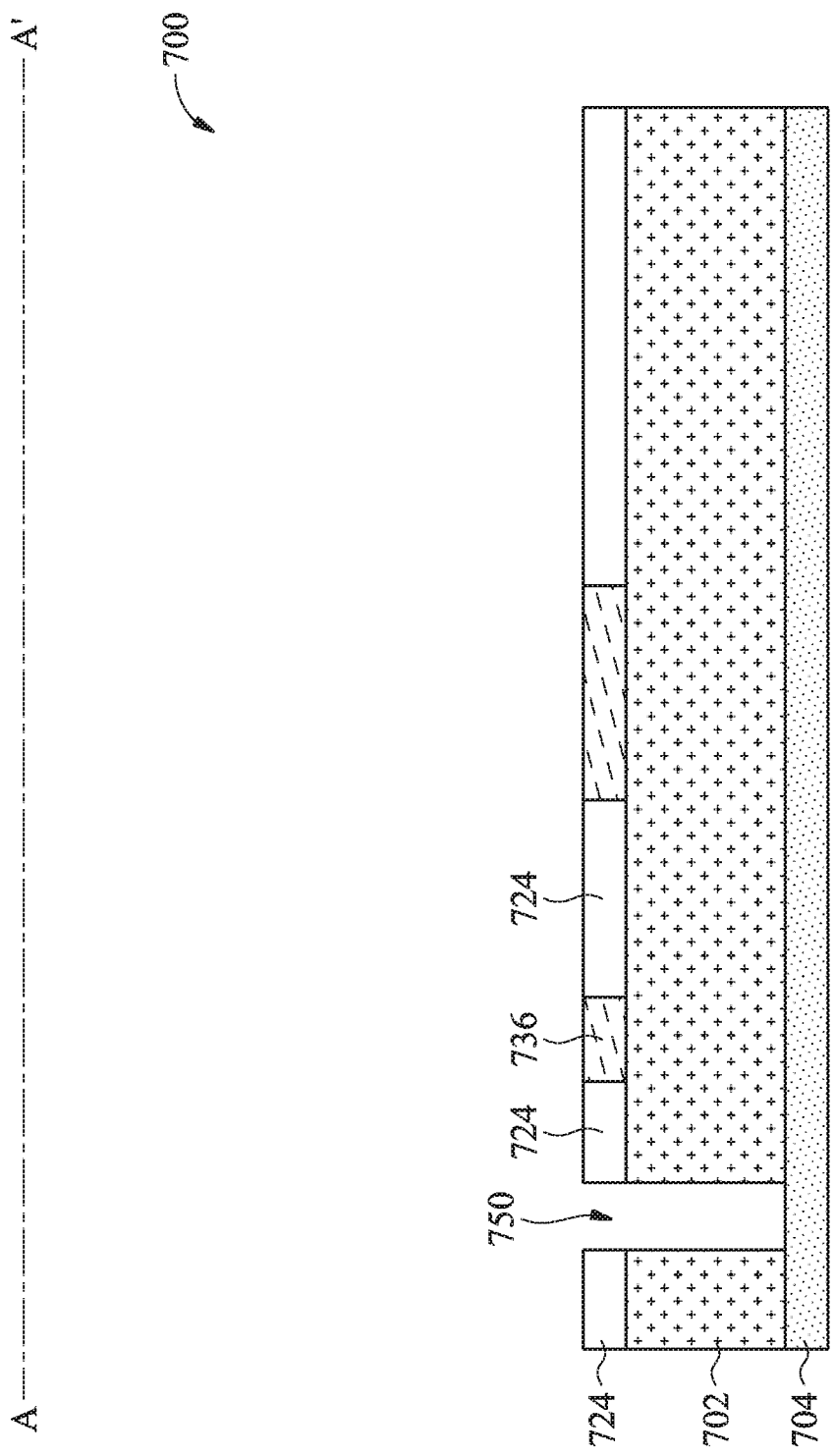
Figure 14B:
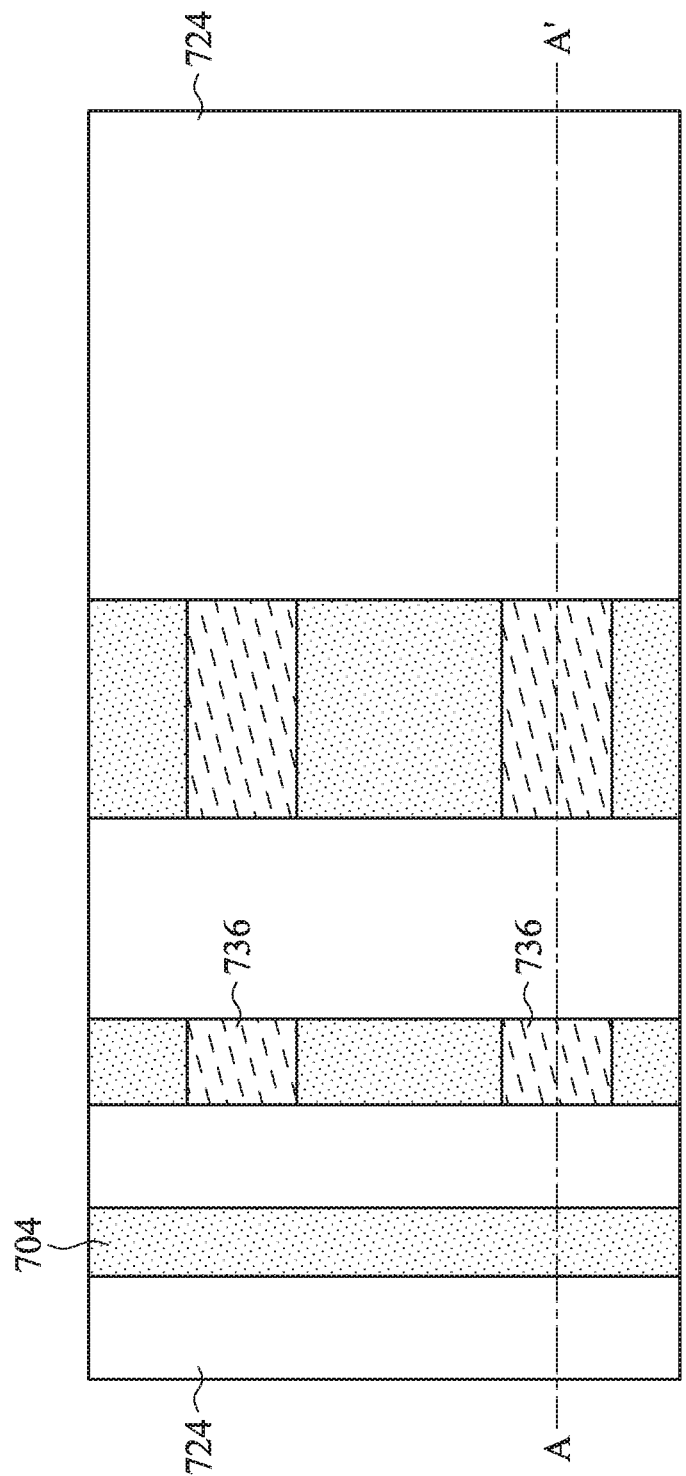

Subsequently, in FIGS. 14A and 14B, LTD material 736 and mask regions 724 are used as an etching mask to form openings 750 into the ILD layer 702. Etching the ILD layer 702 may include an anisotropic dry etch process or a wet etch process. Remaining portions of the ILD layer 702 may have a same pattern as the mask regions 724 and the LTD material 736 of FIGS. 14A-14B.

Figure 15A:
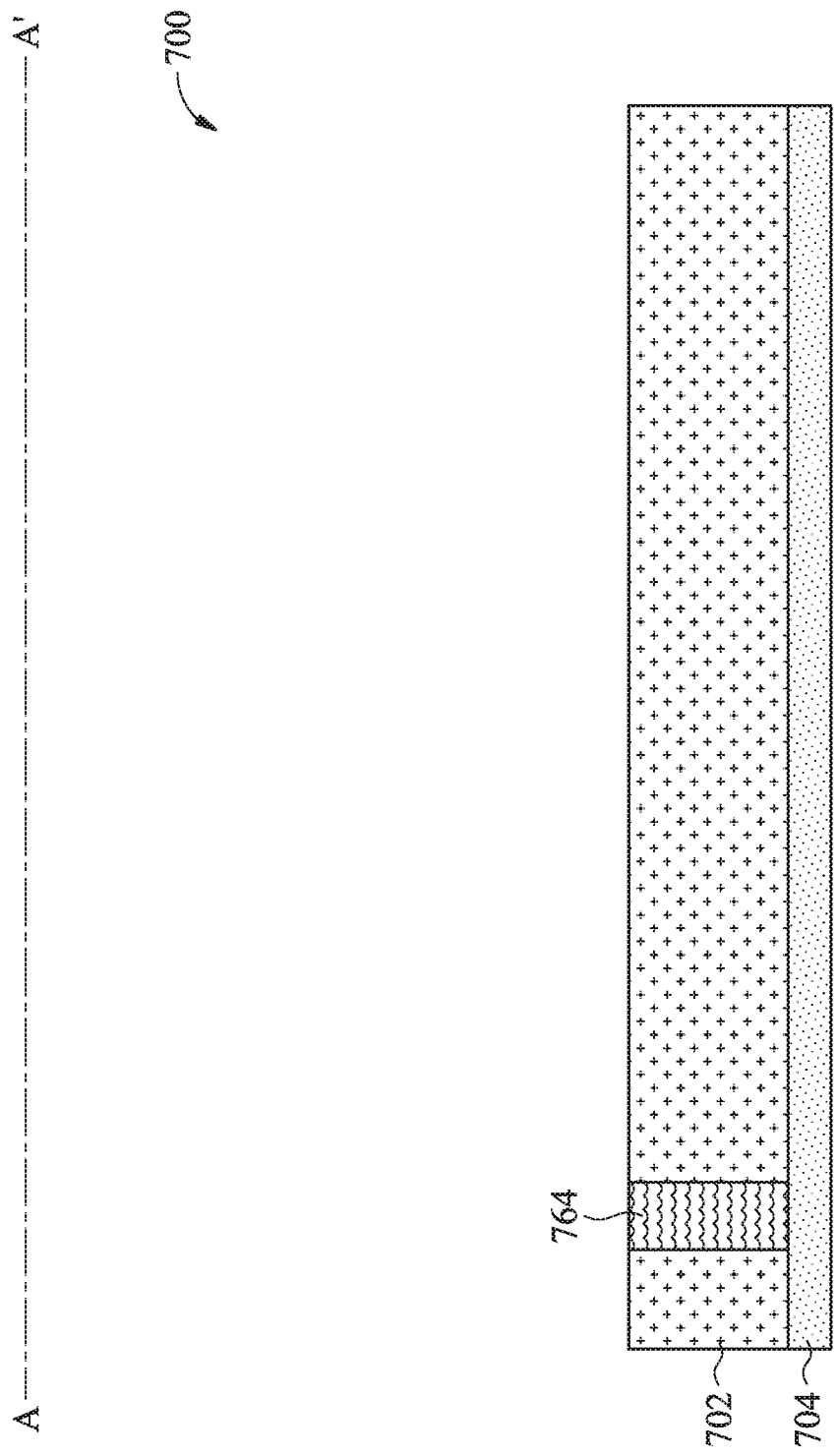
Figure 15B:
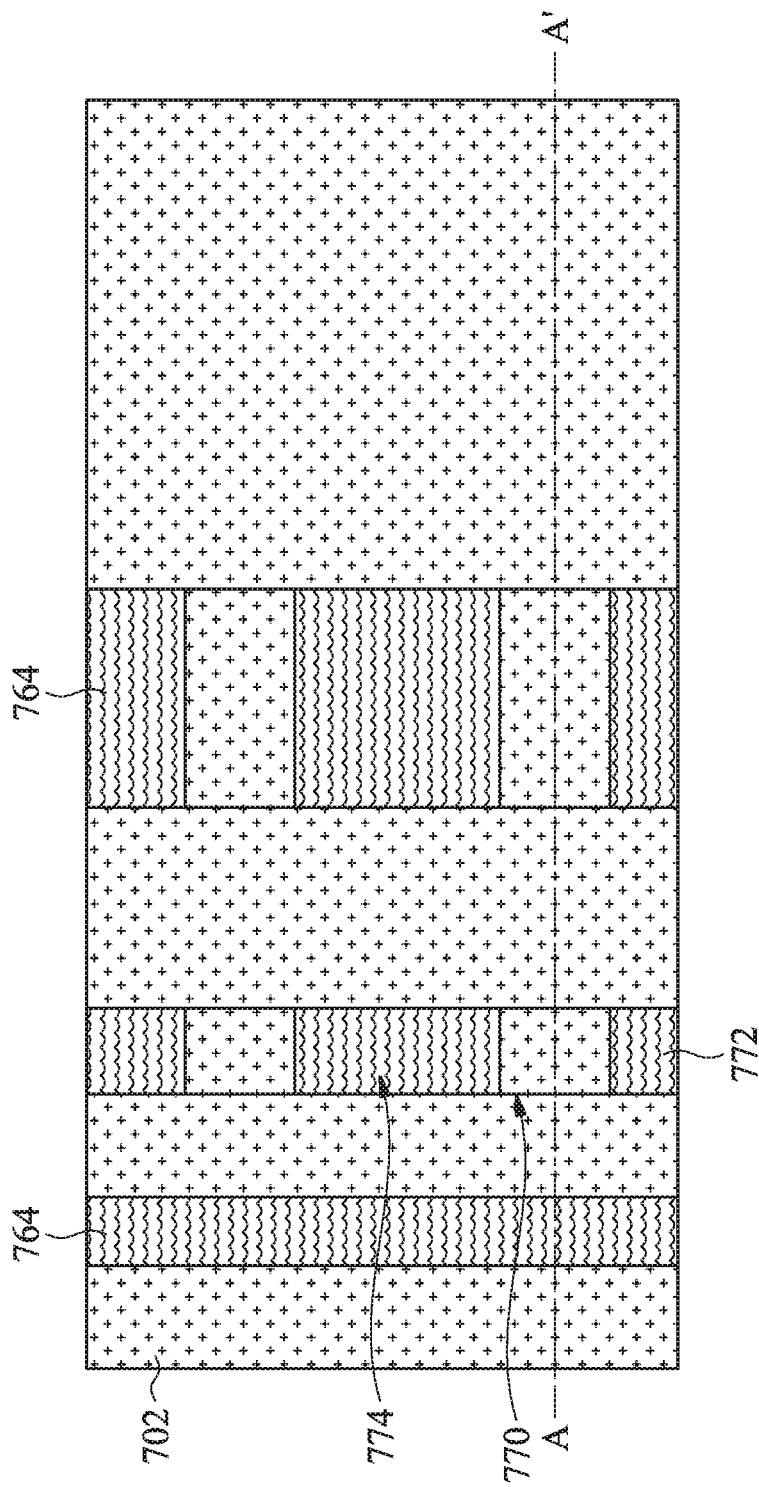

Next, as shown in FIGS. 15A and 15B, remaining portions of the openings 750 may be filled with a conductive material 764. Conductive material 764 may be used, such as copper, aluminum, or another metal, and conductive material 764 may be formed using a plating process or another suitable process. In some cases, conductive material 764 may be initially deposited to overfill openings 750. After filling the openings 750, a planarization process, such as a chemical mechanical polish (CMP), may be performed to remove excess portions of conductive material 764. In some embodiments, a liner material may be formed within openings 750 before forming the conductive material 764.

As shown in FIGS. 15A-15B, a planarization process may be performed to remove excess portions of the conductive material 764 over the ILD layer 702. Thus, conductive features may be formed in the ILD layer 702. In some embodiments where the conductive features in the ILD layer 702 are conductive lines, areas that are underneath the portions of LTD material 736 when ILD layer 702 is patterned are areas where the conductive lines have gaps, or "line cuts." For example, using LTD material 736, line cut 770 separates first conductive line 772 from second conductive line 774. The use of LTD material 736 as described may allow for improved line width variation or improved line edge roughness, which may allow for smaller conductive features and smaller line cuts between conductive features.

Figure 16:
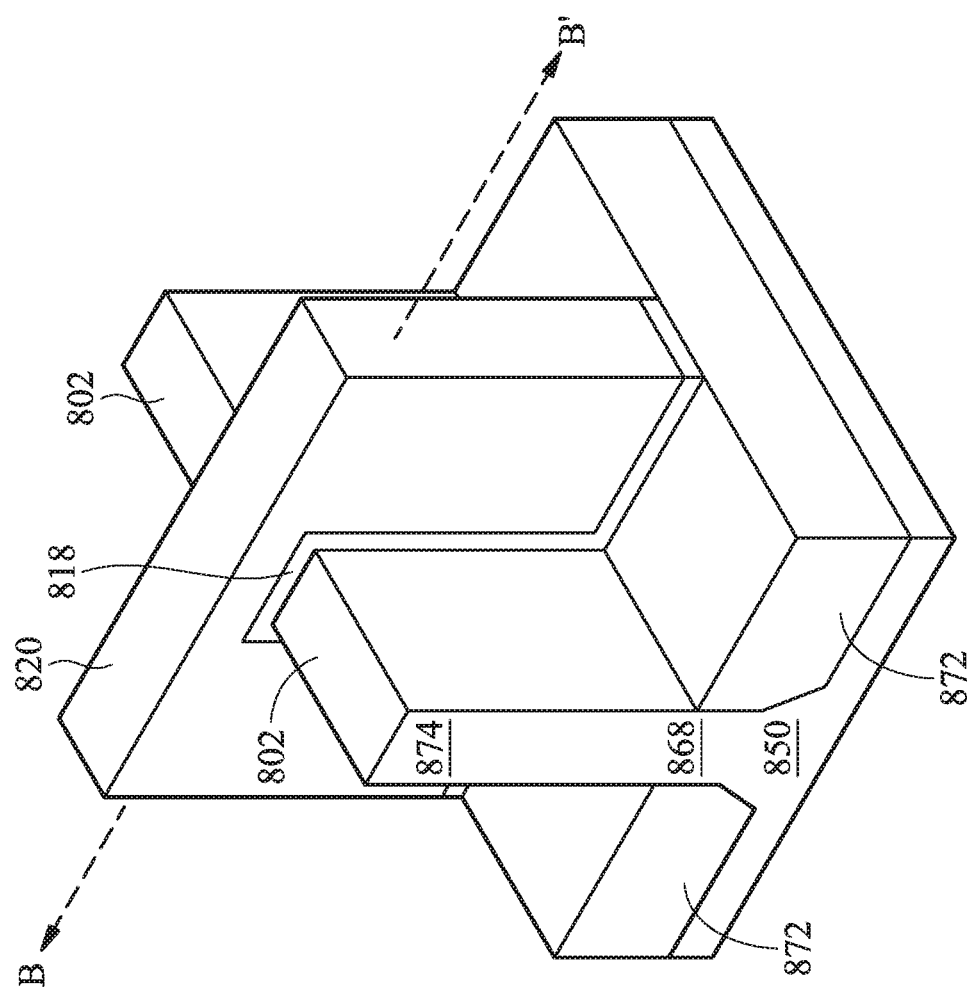
FIGS. 16-25 illustrate cross-sectional views of various intermediary stages of manufacturing a FinFET semiconductor device using a low-temperature dielectric film in accordance with some embodiments.

An LTD film as described herein may be used for forming features in a Front End of Line (FEOL) process of a semiconductor device. In accordance with an exemplary embodiment, FIGS. 16-25 illustrate intermediate stages in a FEOL process using an LTD layer 862 to form fins 868 of a FinFET device. FIG. 16 illustrates an example of a FinFET in a three-dimensional view, according to some embodiments. FIGS. 17 through 25 illustrate cross-sectional views of intermediate stages of forming fins of FinFETs according to some embodiments. The cross-sectional views of FIGS. 17 through 25 are taken along the line B-B' shown in the three-dimensional view of FIG. 16. The example FinFET shown in FIG. 16 includes a fin 874 on a substrate 850. Isolation regions 872 are on substrate 850, and fin 874 protrudes above and from between neighboring isolation regions 872. A gate dielectric layer 818 is along sidewalls and over a top surface of fin 874, and a gate electrode 820 is over gate dielectric layer 818. Source/drain regions 802 are disposed in opposite sides of fin 874 with respect to gate dielectric layer 818 and gate electrode 820. Some embodiments discussed herein are discussed in the context of FinFETs formed using a gate-last process. In other embodiments, a gate-first process may be used. Also, some embodiments contemplate aspects used in planar devices, such as planar FETs. The embodiment shown in FIGS. 16 through 25 may, for example, be part of a Front End of Line (FEOL) process or part of another process.

Figure 17:
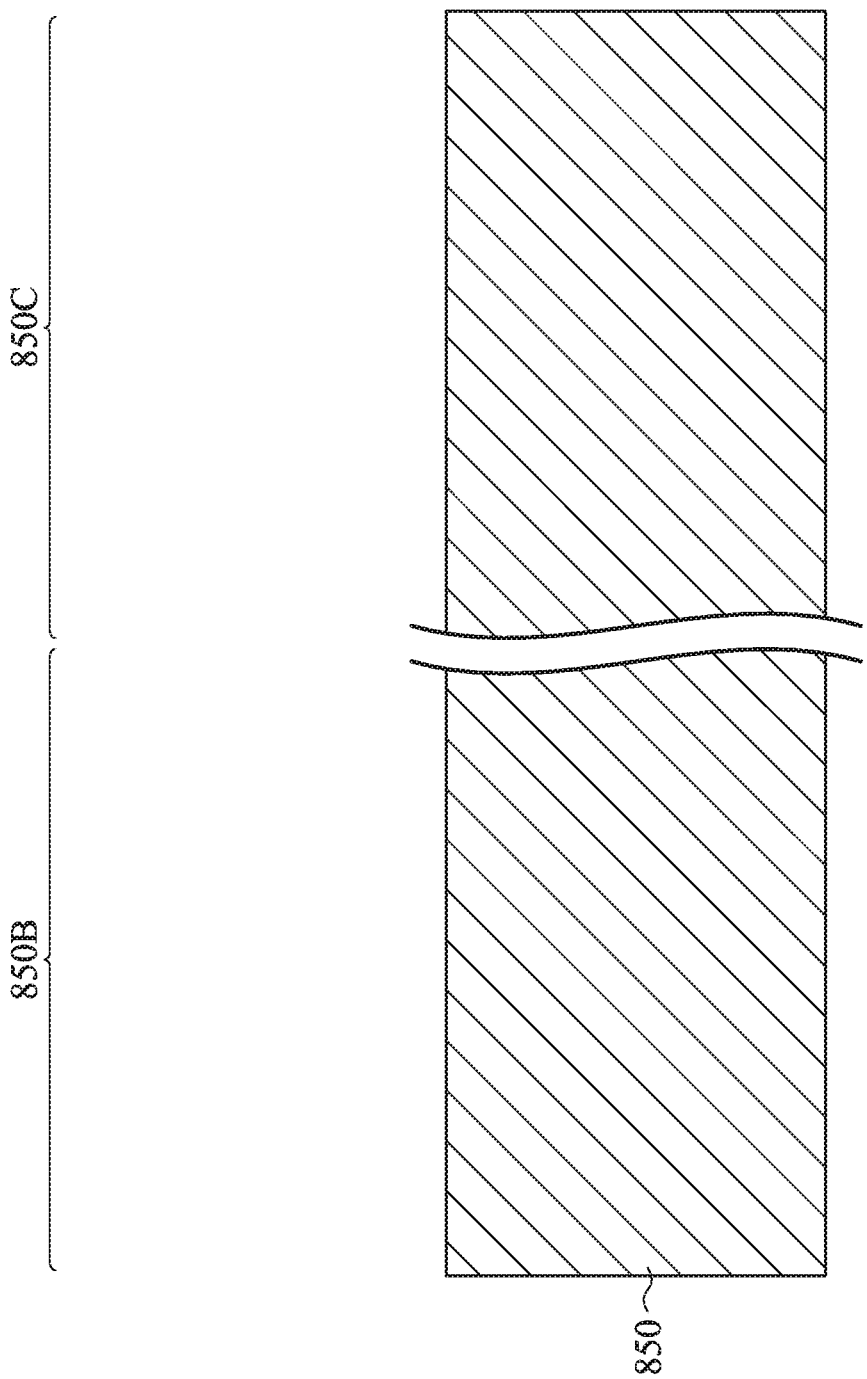

FIG. 17 illustrates a substrate 850 according to some embodiments. The substrate 850 has a first region 850B and a second region 850C. The first region 850B can be for forming n-type devices, such as NMOS transistors, e.g., n-type FinFETs. Second region 850C can be for forming p-type devices, such as PMOS transistors, e.g., p-type FinFETs. In some embodiments, both first region 850B and second region 850C are used to form the same type of devices, such as both regions being for n-type devices or p-type devices. First region 850B and second region 850C may be physically separated from each other, and any number of structures (e.g., isolation regions, active devices, etc.) may be disposed between first region 850B and second region 850C. Substrate 850 may be a semiconductor substrate, such as a bulk semiconductor, a semiconductor-on-insulator (SOI) substrate, or the like, which may be doped (e.g., with a p-type or an n-type dopant) or undoped. Substrate 850 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of substrate 850 may include silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof.

Figure 18:
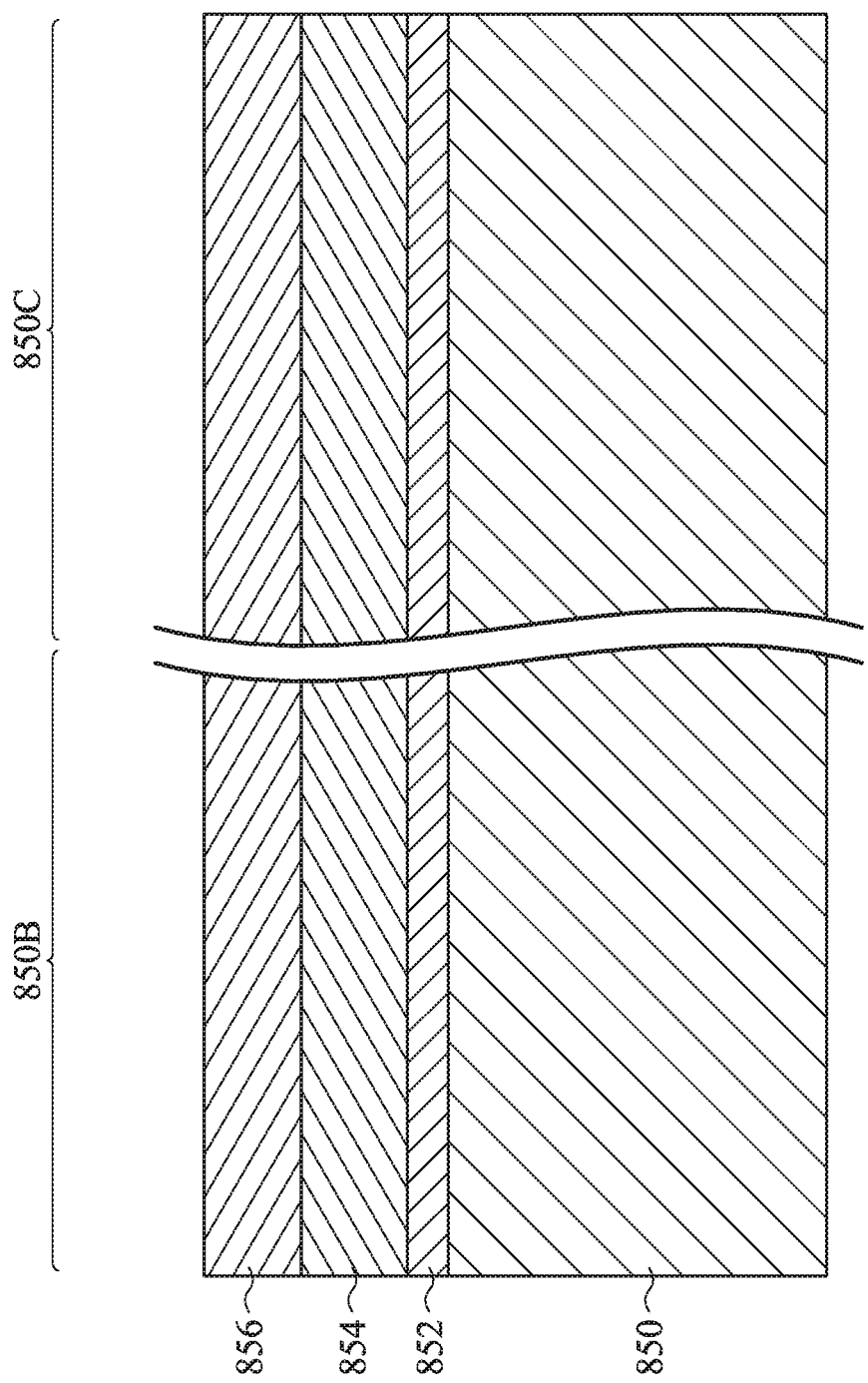

In FIG. 18, a film stack is formed over substrate 850. The film stack is used during processing to form features in substrate 850 that may be a fraction of the minimum photolithographic pitch. In some embodiments, the process is a self-aligned double patterning (SADP) process, where the features formed are one half the minimum photolithographic pitch. In other embodiments, the process may be a self-aligned quadruple patterning (SAQP) process, where the features formed are one quarter of the minimum photolithographic pitch. The film stack includes an anti-reflective coating (ARC) 852, a mask layer 854, and a mandrel layer 856. In other embodiments, the film stack may include more or fewer layers.

ARC 852 is formed over substrate 850, and aids in the exposure and focus of overlying photoresist layers (discussed below) during patterning of the photoresist layers. In some embodiments, ARC 852 may be formed from SiON, SiC, materials doped with oxygen (O) and nitrogen (N), or the like. In some embodiments, ARC 852 is substantially free from nitrogen, and may be formed from an oxide.

Mask layer 854 is formed over ARC 852. In some embodiments, the mask layer 854 is an LTD film, which may be similar to LTD film 116, LTD film 516, LTD film 616, or LTD material 736 described previously with respect to FIGS. 1A-4, FIGS. 5A-5C, FIGS. 6A-6E, and FIGS. 7A-15B. In some cases, using an LTD film for the mask layer 854 may improve adhesion of an overlying layer or overlying features. In some cases, using an LTD film for the mask layer 854 instead of another material for the mask layer 854 may reduce the chance of peeling of patterned features formed on the mask layer 854. For example, using an LTD film for the mask layer 854 may improve adhesion of a mandrel layer 856 or mandrels 858, described below. In other embodiments, mask layer 854 may be formed of a hard masking material, and may include a metal and/or a dielectric. In embodiments where mask layer 854 includes a metal, it may be formed of titanium nitride, titanium, tantalum nitride, tantalum, or the like. In embodiments where mask layer 854 includes a dielectric, it may be formed of an oxide, a nitride, or the like. Mask layer 854 may be formed by PVD, Radio Frequency PVD (RFPVD), Atomic Layer Deposition (ALD), or the like. In subsequent processing steps, a pattern is formed in the mask layer 854 as part of the SADP process. Mask layer 854 is then used as an etching mask, where the pattern of mask layer 854 is transferred to substrate 850.

Mandrel layer 856 is a sacrificial layer formed over mask layer 854. In some embodiments, mandrel layer 856 is a photoresist or polymer material, and may be similar to underlayer 114, underlayer 514, underlayer 614, or masking layer 728 described previously with respect to FIGS. 1A-1G, FIGS. 5A-5C, FIGS. 6A-6F, or FIGS. 7A-14B. In some embodiments, mandrel layer 856 may formed of a material that has a high etching selectivity with the underlying layer, e.g., with mask layer 854. In some embodiments, mandrel layer 856 may be formed of a material such as amorphous silicon, polysilicon, silicon nitride, silicon oxide, the like, or a combination thereof, and may be formed using a process such as a chemical vapor deposition (CVD), PECVD, or the like. In an embodiment, mandrel layer 856 is formed of polysilicon.

Figure 19:
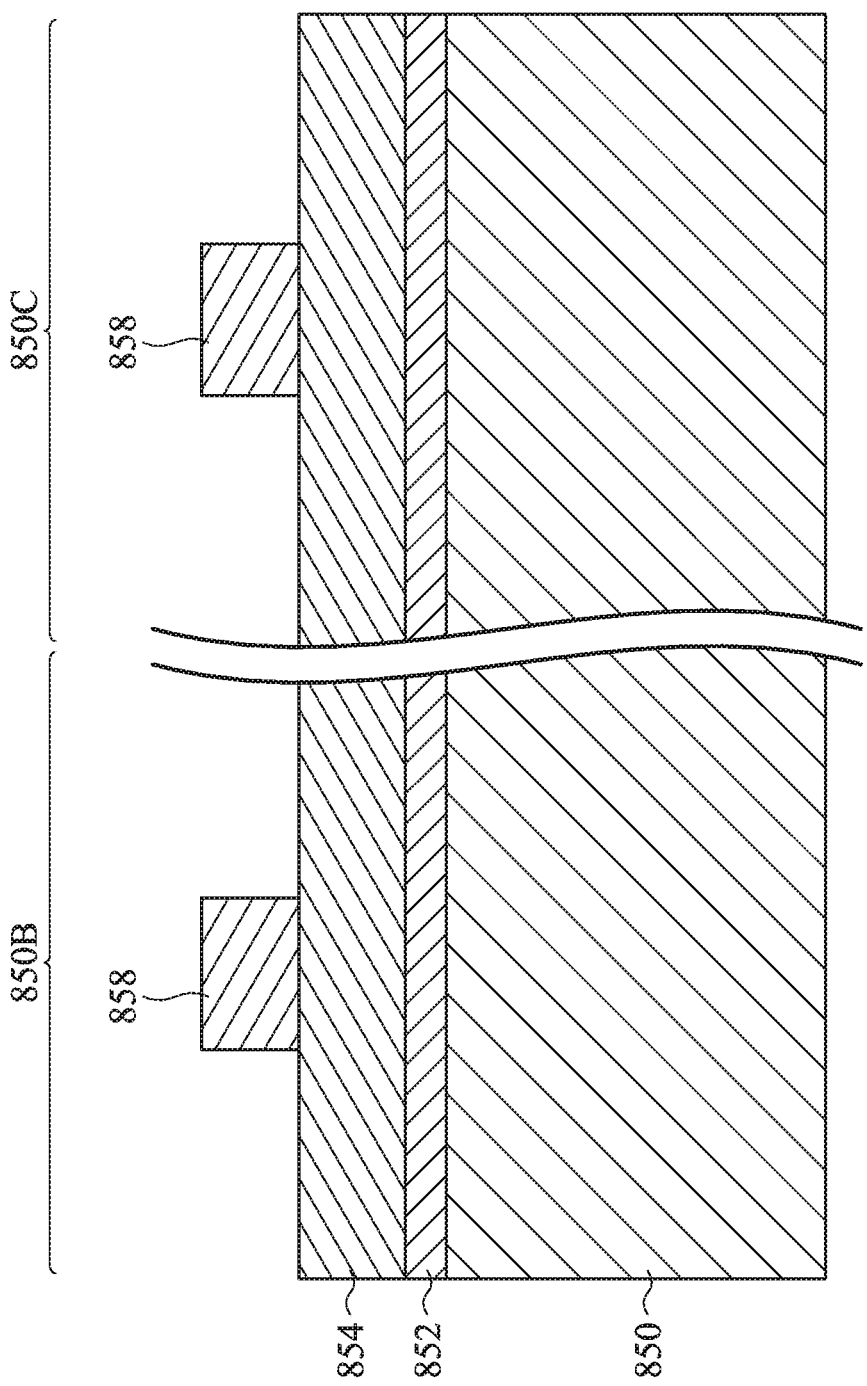

In FIG. 19, mandrel layer 856 is patterned to form mandrels 858. Mandrel layer 856 may be patterned using any suitable photolithography technique. As an example of patterning mandrel layer 856, a tri-layer photoresist (not shown) may be formed over the film stack. The tri-layer photoresist may include a bottom layer, a middle layer, and an upper layer. The upper layer may be formed of a photosensitive material, such as a photoresist, which may comprise organic materials. The bottom layer may be a bottom anti-reflective coating (BARC). The middle layer may be formed of or include an inorganic material, which may be a nitride (such as silicon nitride), an oxynitride (such as silicon oxynitride), an oxide (such as silicon oxide), or the like. The middle layer has a high etching selectivity relative to the upper layer and the bottom layer. As a result, the upper layer is used as an etching mask for the patterning of the middle layer, and the middle layer is used as an etching mask for the patterning of the bottom layer.

After the pattern is transferred to the bottom layer, an etching process is performed to transfer the pattern of the bottom layer to mandrel layer 856. The etching process may remove the portions of mandrel layer 856 exposed by the middle and bottom layers. In an embodiment, the etching process may be a dry etch where mandrel layer 856 is exposed to a plasma source and one or more etchant gases. The etch may be an inductively coupled plasma (ICR) etch, a transformer coupled plasma (TCP) etch, an electron cyclotron resonance (ECR) etch, a reactive ion etch (RIE), or the like. Remaining portions of mandrel layer 856 form mandrels 858. In some embodiments, the etching process used to transfer the pattern to mandrel layer 856 may remove the middle layer and partially remove portions of the bottom layer. An ashing process may be performed to remove remaining residue of the middle and/or bottom layers.

Figure 20:
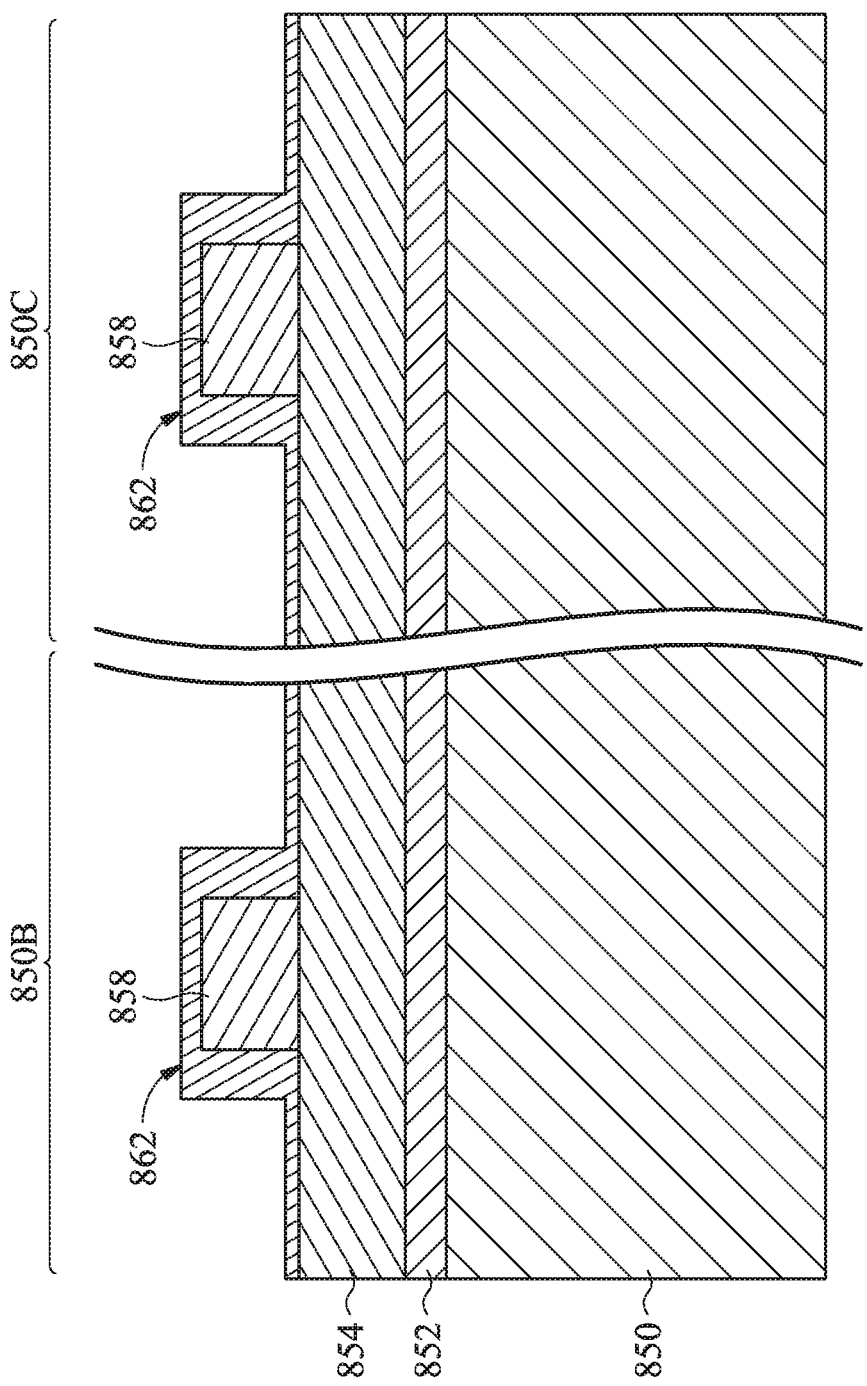

In FIG. 20, a LTD layer 862 is formed over mask layer 854 and mandrels 858. After formation, LTD layer 862 may extend along top surfaces of mask layer 854 and mandrels 858, and along sidewalls of mandrels 858. In some embodiments, LTD layer 862 may be similar to LTD film 116, LTD film 516, LTD film 616, or LTD material 736 described previously with respect to FIGS. 1A-4, FIGS. 5A-5C, FIGS. 6A-6E, and FIGS. 7A-14B. For example, LTD layer 862 may be deposited by a PEALD process without using $O_2$ as a precursor material in order to reduce possible damage to mandrels 858. Reducing damage to mandrels 858 may improve process uniformity during formation of fins 874, described below.

Figure 21:
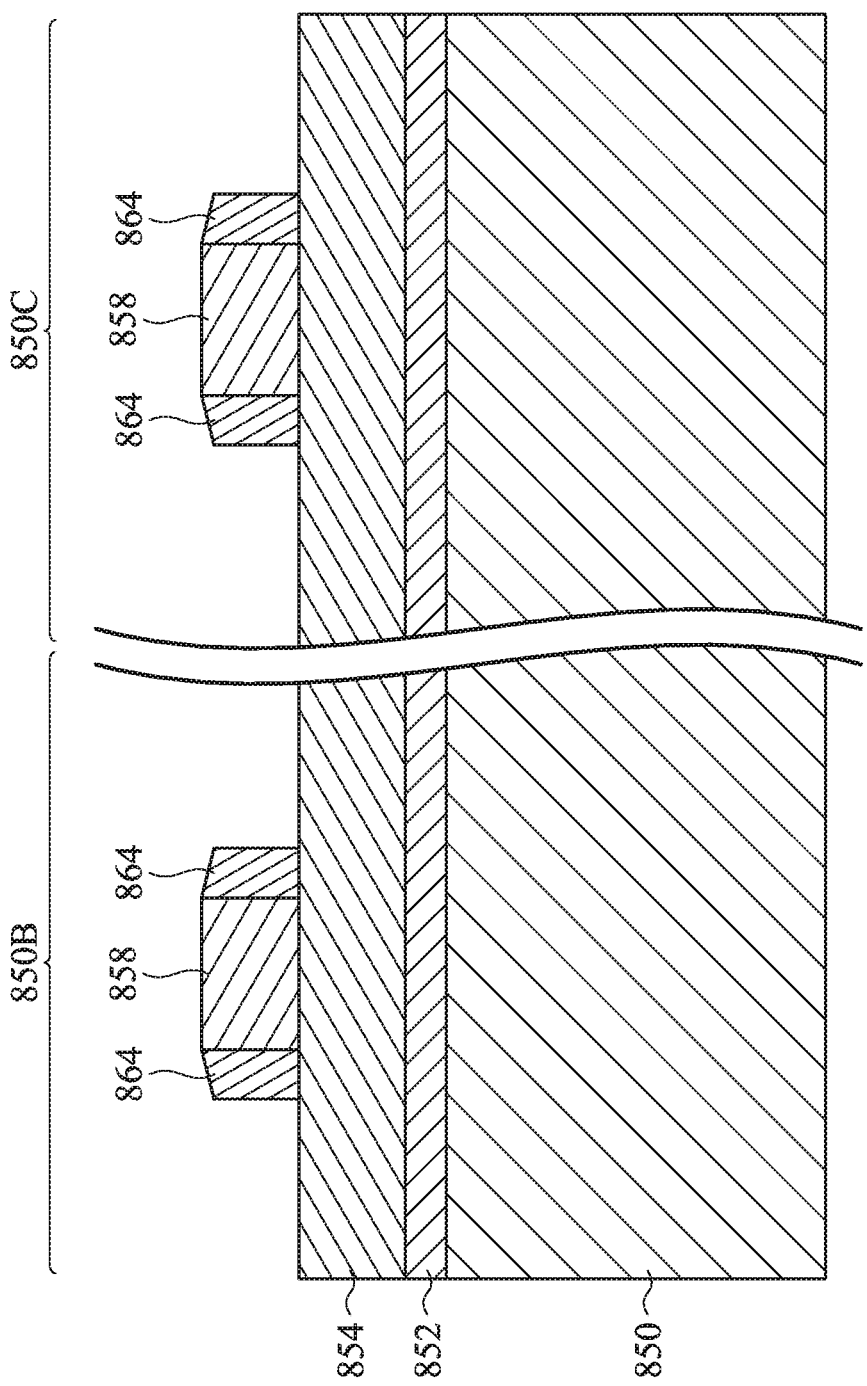

In FIG. 21, a suitable etching process is performed to remove the horizontal portions of LTD layer 862. In some embodiments, the etchant used to etch the horizontal portions of the LTD layer 862 is $Cl_2$, $CH_4$, $N_2$, Ar, the like, or a combination thereof. After the etching process, the vertical portions of LTD layer 862 may remain along the sides of mandrels 858, and are referred to as spacers 864 hereinafter. The etching process may be anisotropic, so that the width of spacers 864 does not significantly decrease.

Figure 22:
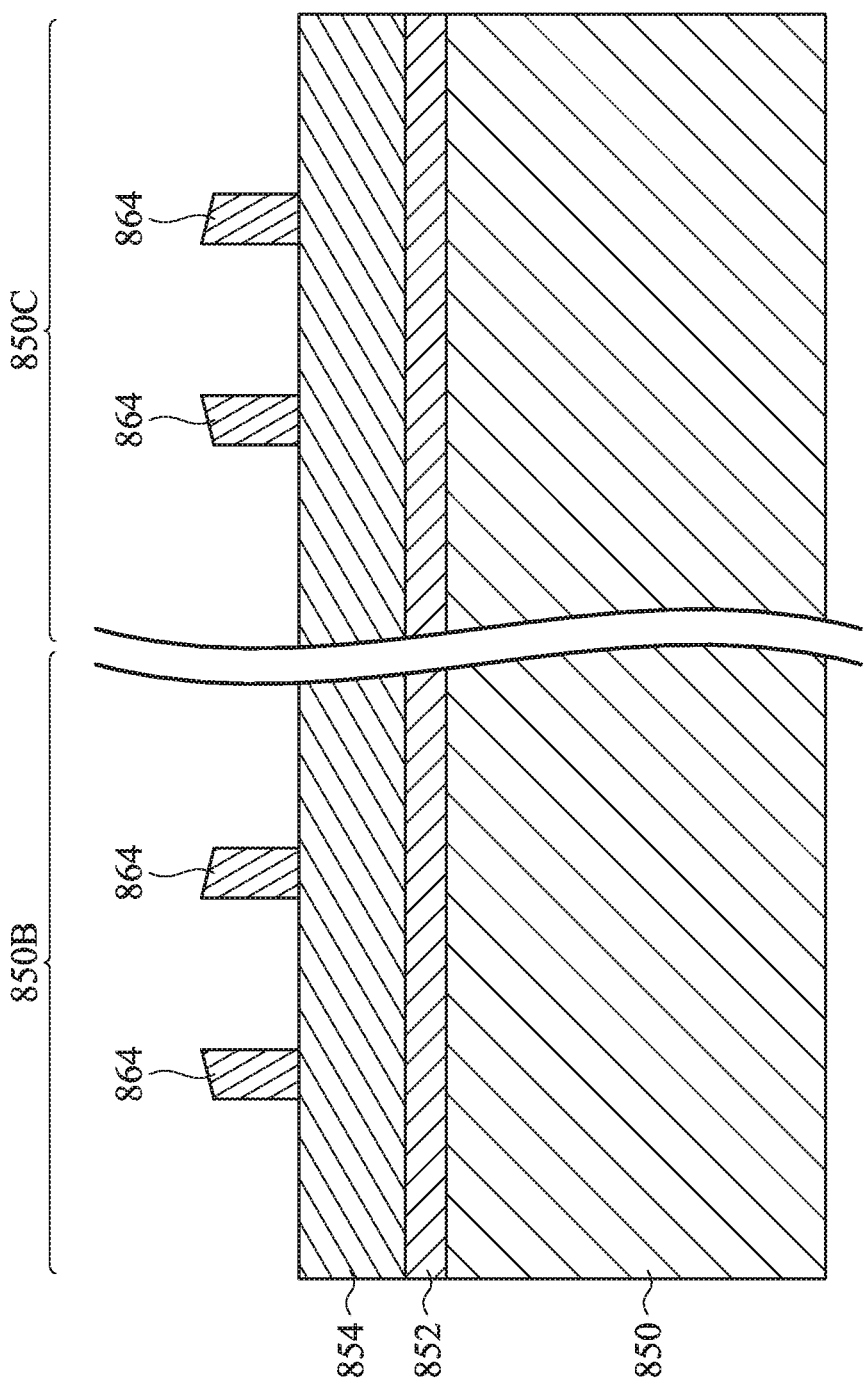

In FIG. 22, mandrels 858 are removed. Mandrels 858 may be removed by a suitable etching processes, such as an etching process including etchants such as $CF_4$, $CH_3F$, $H_2$, $N_2$, Ar, the like, or a combination thereof, an ashing process, or any other suitable etching process that can remove mandrels 858 without substantially damaging spacers 864. Further, a wet clean process may also be applied to substrate 850 to remove residual spacer and mandrel material. In some embodiments, the spacer etch and the mandrel removal processes are performed in a same process chamber.

Figure 23:
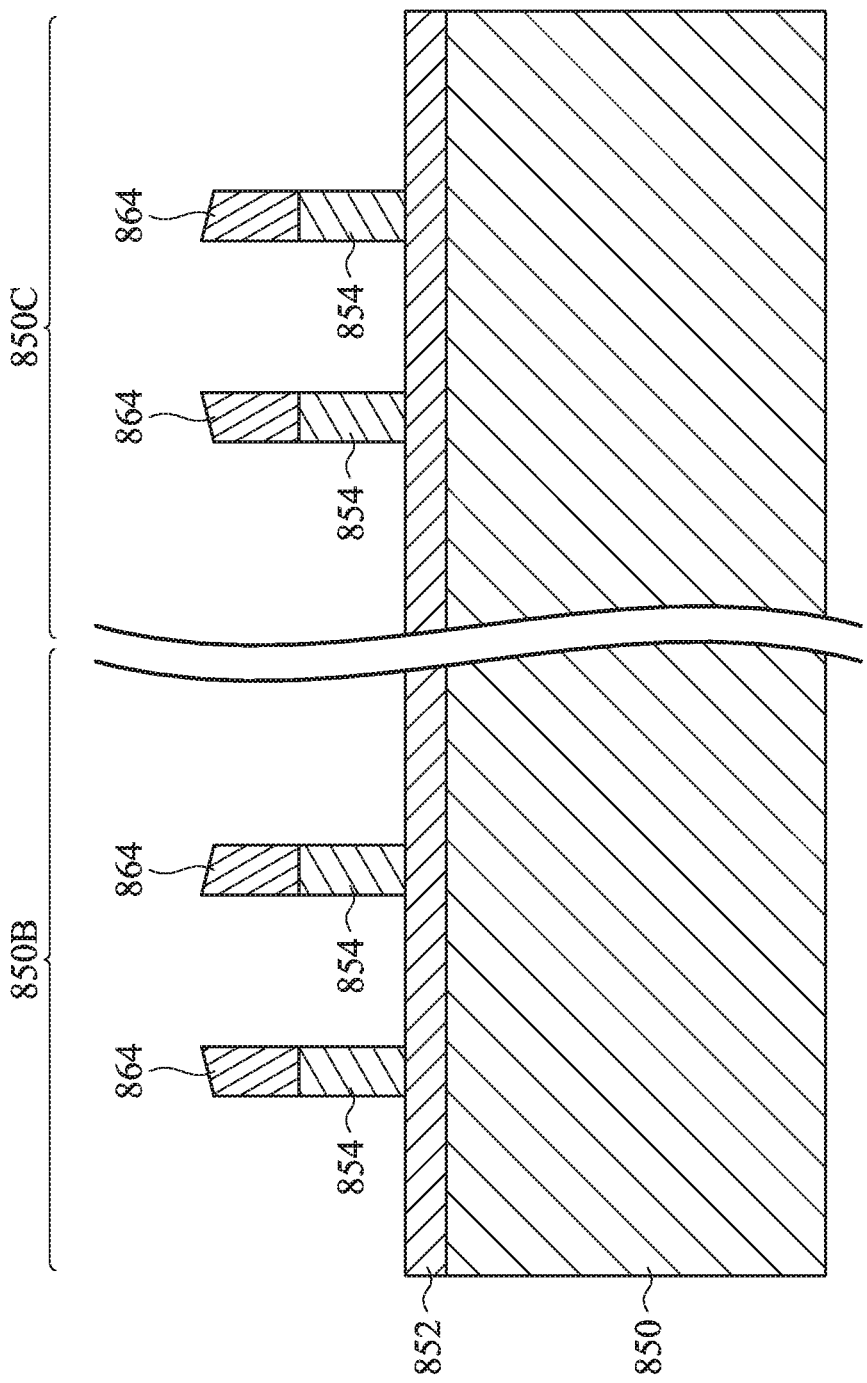

In FIG. 23, spacers 864 are used as an etching mask to pattern mask layer 854. A suitable etching process, such as an anisotropic etch, may be performed with any suitable chemical, such as $CF_4$, HBr, $Cl_2$, $O_2$, Ar, the like, or a combination thereof. The pattern of spacers 864 is therefore transferred to the mask layer 854 to form openings in mask layer 854.

Figure 24:
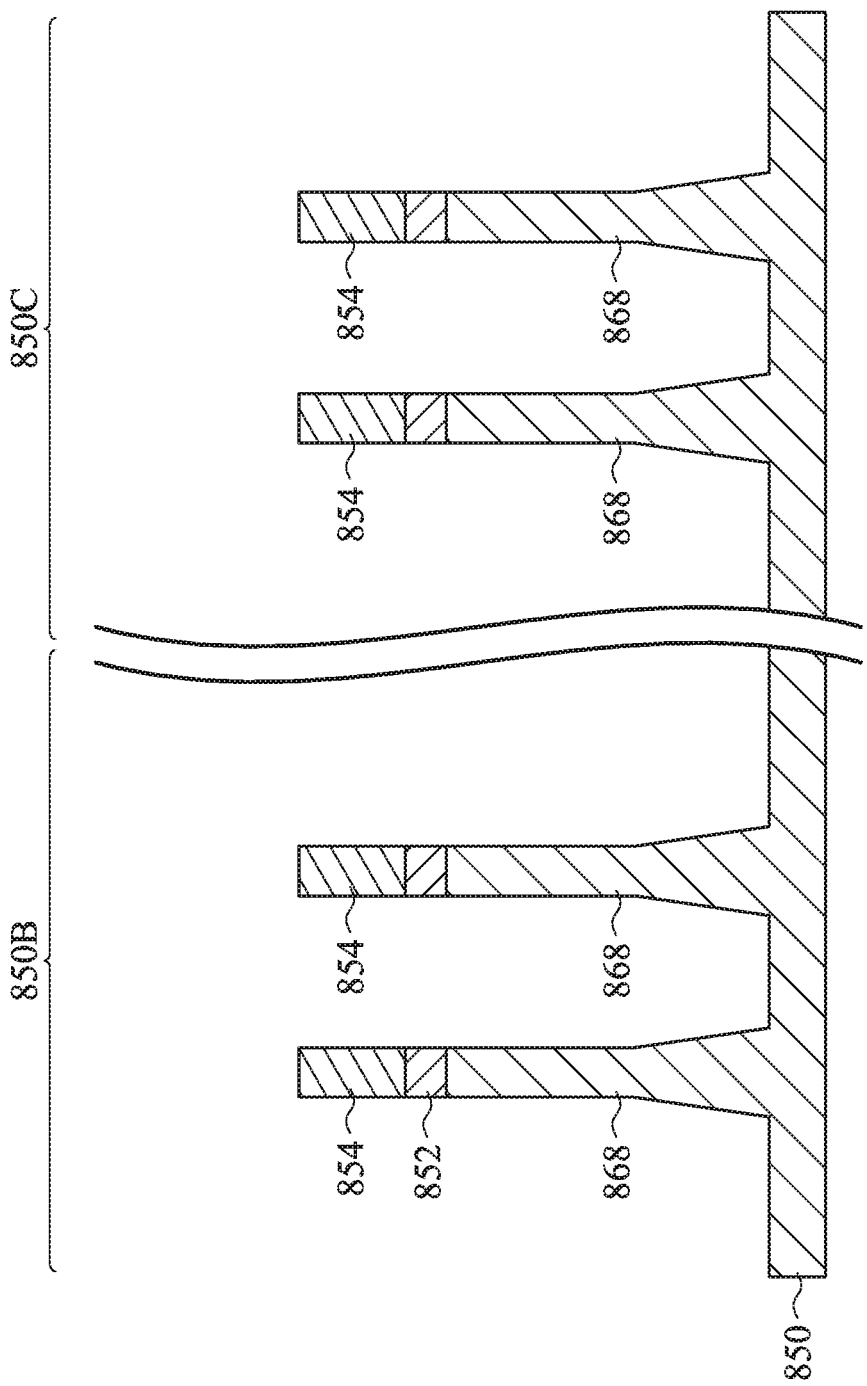

In FIG. 24, fins 868 are formed in the substrate 850. Fins 868 are formed by using the patterned mask layer 854 as an etching mask to etch ARC 852 and substrate 850, thereby forming trenches in substrate 850. The resulting semiconductor strips between the trenches form fins 868. The etching may be any acceptable etch process, and may use etchants such as $Cl_2$, $N_2$, $CH_4$, the like, or a combination thereof. The etch may be anisotropic. The spacers 864, patterned mask layer 854, and patterned ARC 852 may be consumed in this process. In some embodiments, a cleaning process may be performed to remove any residual material of spacers 864, patterned mask layer 854, or patterned ARC 852.

Figure 25:
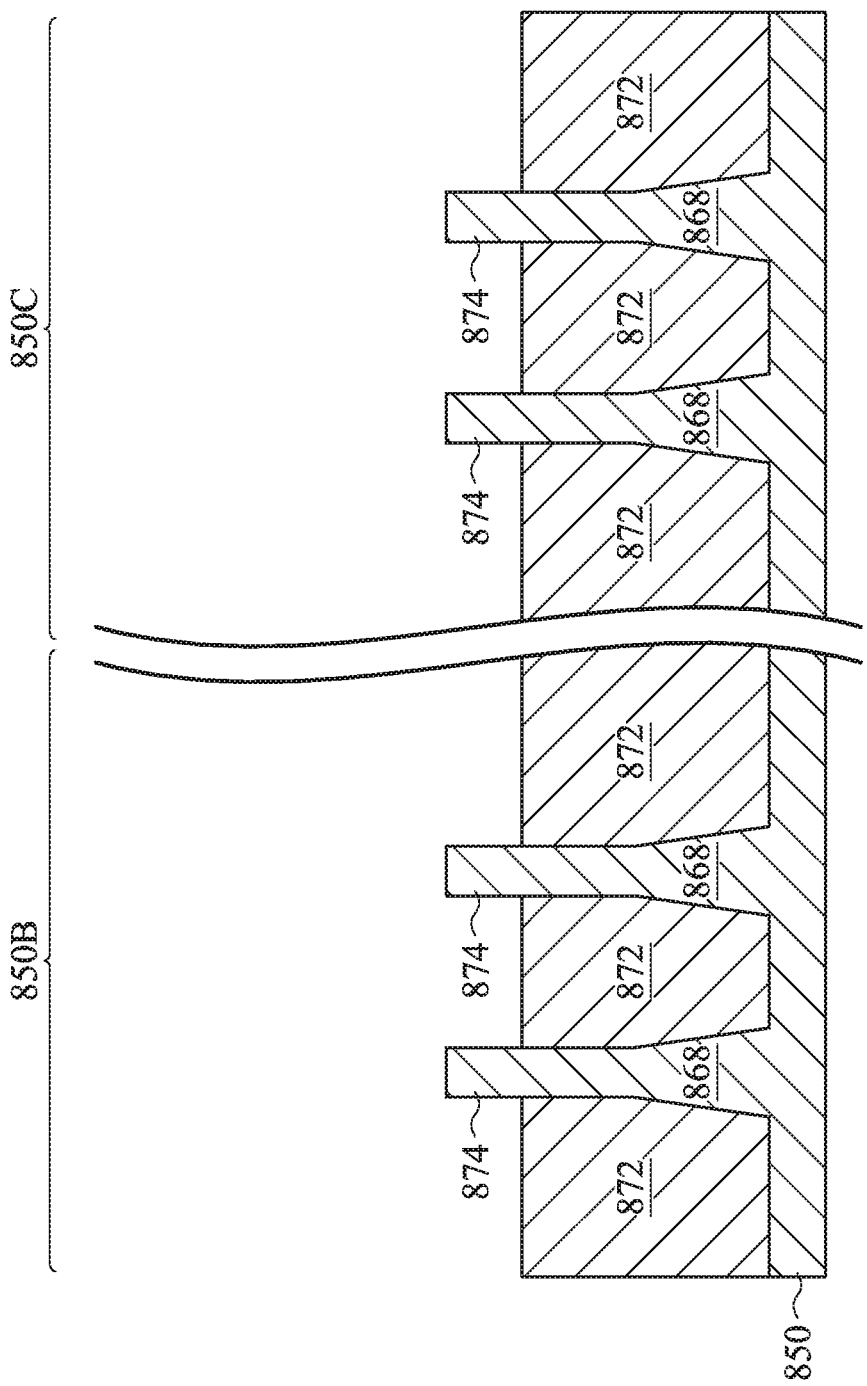

In FIG. 25, an insulation material is formed over substrate 850 and between neighboring fins 868. The insulation material may be an oxide, such as silicon oxide, a nitride, the like, or a combination thereof. The insulation material is then recessed to form Shallow Trench Isolation (STI) regions 872. The insulation material is recessed such that fins 874 in the first region 850B and in the second region 850C protrude from between neighboring STI regions 872. The insulation material may be recessed to form STI regions 872 using an acceptable etching process, such as one that is selective to the material of the insulation material. The fins 874 may be similar to fin 874 shown in FIG. 16, above. After forming fins 874, other processing steps may be performed to form FinFETs such as that shown in FIG. 16. For example, a gate dielectric layer 818 and a gate electrode 820 may be formed over each fin 874, and source/drain regions 802 may be formed on opposite sides of each fin 874. This is an illustrative example, and other embodiments of forming a FinFET, including those using additional or other processing steps, are within the scope of this disclosure.

Although the process illustrated in FIGS. 17 through 25 is used to form the fins 874, it should be appreciated that the fabrication steps shown in FIGS. 17 through 25 may be used in other processes. For example, spacers formed from an LTD layer could be formed over and used to pattern other semiconductor device elements such as polysilicon gates, metal gates, dummy gates, isolation regions, interconnect structures, gate spacers, a contact etch stop layer (CESL), and the like.

Various embodiments described above provide the use of a process for depositing a low-temperature dielectric (LTD) film. The LTD film described may be deposited over a photoresist or polymer layer with little or no damage to the photoresist or polymer layer. In some embodiments, the LTD film described may be used as an etching mask for photoresist, polymer, or other material. In some embodiments, the LTD film described can be used as a pad layer for as an adhesion improvement layer. For example, a layer (e.g., a photoresist, dielectric, or other type of layer) deposited on an LTD film may have better adhesion than if the layer is deposited on a different material. The use of an LTD film may improve width variation or edge roughness of some features, such as metal lines or other features. The LTD film described may be used as part of a FEOL process or as part of a BEOL process.

In an embodiment, a method of manufacturing a semiconductor device includes depositing a layer over a semiconductor substrate placing the substrate in a deposition chamber, and depositing an oxide layer over and contacting the layer. Depositing the oxide layer includes flowing first precursor materials into the deposition chamber, within the deposition chamber, forming a portion of the oxide layer from the first precursor materials, igniting second precursor materials into a plasma, the second precursor materials being free of allotropes of oxygen, and within the deposition chamber, forming a portion of the oxide layer from the plasma. In an embodiment, the method further includes patterning an opening in the layer. In an embodiment, depositing the oxide layer includes depositing the oxide layer within the opening in the layer. In an embodiment, the method further includes patterning the oxide layer to extend the opening into the oxide layer. In an embodiment, the oxide layer includes a process temperature of less than about 200° C. In an embodiment, the second precursor materials are free of gaseous oxygen. In an embodiment, the second precursor materials include $CO_2$. In an embodiment, the oxide layer includes SiOC.

In another embodiment, a method of manufacturing a semiconductor device includes a dielectric layer over a substrate, performing a first patterning to form a recess in the dielectric layer, and depositing an oxide film over and contacting the dielectric layer and within the recess in the dielectric layer, wherein the oxide film is formed from multiple precursors, wherein the precursors of the multiple precursors are free of $O_2$, and wherein depositing the oxide film includes forming a plasma of a first precursor of the multiple precursors. In an embodiment, the oxide film is deposited to fill the recess in the dielectric layer. In an embodiment, the recess has a first interior width, and depositing the oxide film within the recess forms a trench within the recess having a second interior width that is smaller than the first interior width. In an embodiment, the oxide film is deposited conformally within the recess. In an embodiment, the dielectric layer is a photoresist material or a polymer material. In an embodiment, the oxide film is SiOC. In an embodiment, the first precursor of the multiple precursors is $CO_2$.

In another embodiment, a method includes forming a dielectric layer over a semiconductor substrate, patterning a photoresist over the dielectric layer, placing the semiconductor substrate and the photoresist into a process chamber, transferring the pattern of the photoresist to the dielectric layer using an etching process, providing precursors of multiple precursors to the process chamber, wherein the precursors of the multiple precursors are free of allotropes of oxygen, and forming an oxide layer over and contacting the dielectric layer within the process chamber, including igniting at least one precursor of the multiple precursors into a plasma. In an embodiment, the method further includes etching the oxide layer using an etching process performed within the process chamber. In an embodiment, the multiple precursors include $CO_2$, $N_2O$, or ethanol. In an embodiment, the oxide layer includes SiON. In an embodiment, forming an oxide layer includes using a Plasma-Enhanced Atomic Layer Deposition (PEALD) process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:
    placing a substrate in a deposition chamber, wherein the substrate comprises an Inter-Layer Dielectric (ILD) layer;
    depositing a first layer over the ILD layer;
    patterning an opening in the first layer to expose the ILD layer;
    depositing an oxide layer over the first layer, wherein a first region of the oxide layer covers the ILD layer exposed by the opening, and wherein depositing the oxide layer comprises:
        flowing first precursor materials into the deposition chamber;
        within the deposition chamber, forming a portion of the oxide layer from the first precursor materials;
        igniting second precursor materials into a plasma, the second precursor materials being free of allotropes of oxygen; and
        within the deposition chamber, forming a portion of the oxide layer from the plasma;
    removing the first layer, wherein removing the first layer exposes the ILD layer, and wherein the first region of the oxide layer remains after removing the first layer; and
    after removing the first layer, performing a polishing process to planarize the oxide layer.

2. The method of claim 1, wherein depositing the oxide layer comprises a process temperature of less than about 200° C.

3. The method of claim 1, wherein the second precursor materials are free of gaseous oxygen.

4. The method of claim 1, wherein the second precursor materials comprise $CO_2$.

5. The method of claim 1, wherein the oxide layer comprises silicon, carbon, or a combination thereof.

6. The method of claim 1, wherein the first layer comprises a photoresist material or a polymer material.

7. The method of claim 1, further comprising etching the ILD layer using the first region of the oxide layer as an etching mask.

8. The method of claim 7, wherein etching the ILD layer forms a recess in the ILD layer, and further comprising depositing a conductive material in the recess.

9. A method of manufacturing a semiconductor device, the method comprising:
    depositing a dielectric layer over a substrate;
    performing a first patterning on the dielectric layer to form a first recess in the dielectric layer;
    depositing a masking layer covering the first recess in the dielectric layer;
    performing a second patterning on the masking layer to form a second recess that exposes a top surface of the dielectric layer and exposes the first recess;
    depositing an oxide film over the masking layer and within the second recess, the oxide film contacting the top surface of the dielectric layer exposed by the second recess and extending within the first recess exposed by the second recess, wherein the oxide film is formed from a plurality of precursors, wherein the precursors of the plurality of precursors are free of $O_2$, and wherein depositing the oxide film comprises forming a plasma of a first precursor of the plurality of precursors; and
    removing the masking layer, wherein the oxide film remains contacting the top surface of the dielectric layer and remains within the second recess remains after the masking layer is removed.

10. The method of claim 9, wherein the masking layer is a photoresist material or a polymer material.

11. The method of claim 9, wherein the oxide film comprises silicon, carbon, nitrogen, or a combination thereof.

12. The method of claim 9, wherein the first precursor of the plurality of precursors is $N_2O$.

13. The method of claim 9, further comprising performing a first planarization process on the oxide film before removing the masking layer.

14. The method of claim 13, further comprising performing a second planarization process on the oxide film after removing the masking layer.

15. A method comprising:
- forming a dielectric layer over a semiconductor substrate;
- patterning the dielectric layer;
- forming a mask layer over the patterned dielectric layer;
- patterning the mask layer, wherein an opening in the patterned mask layer exposes the patterned dielectric layer;
- placing the semiconductor substrate and the patterned mask layer into a process chamber;
- sequentially providing precursors of a plurality of precursors to the process chamber, wherein the precursors of the plurality of precursors are free of allotropes of oxygen;
- forming an oxide layer within the process chamber, wherein the oxide layer is formed over the patterned mask layer and extends over contacting the patterned dielectric layer exposed by within the opening, wherein forming the oxide layer comprises igniting at least one precursor of the plurality of precursors into a plasma; and
- removing the mask layer without removing portions of the oxide layer that extend over the patterned dielectric layer within the opening.

16. The method of claim 15, wherein the plurality of precursors comprise $CO_2$, $N_2O$, or ethanol.

17. The method of claim 15, wherein the oxide layer comprises silicon, carbon, nitrogen, or a combination thereof.

18. The method of claim 15, wherein forming the oxide layer comprises using a Plasma-Enhanced Atomic Layer Deposition (PEALD) process.

19. The method of claim 15, further comprising depositing a conductive material on the semiconductor substrate.

20. The method of claim 15, further comprising planarizing the mask layer and the oxide layer such that surfaces of the mask layer and the oxide layer are level.

* * * * *